(12) United States Patent
Mizutani et al.

(10) Patent No.: US 8,142,977 B2
(45) Date of Patent: Mar. 27, 2012

(54) POSITIVE RESIST COMPOSITION AND PATTERN FORMING METHOD USING THE SAME

(75) Inventors: Kazuyoshi Mizutani, Shizuoka (JP); Shinichi Sugiyama, Shizuoka (JP)

(73) Assignee: Fujifilm Corporation, Tokyo (JP)

( * ) Notice: Subject to any disclaimer, the term of this patent is extended or adjusted under 35 U.S.C. 154(b) by 872 days.

(21) Appl. No.: 12/057,441

(22) Filed: Mar. 28, 2008

(65) Prior Publication Data
US 2008/0241749 A1  Oct. 2, 2008

(30) Foreign Application Priority Data

Mar. 30, 2007 (JP) ................. 2007-094783

(51) Int. Cl.
*G03F 7/004* (2006.01)
*G03F 7/039* (2006.01)
*G03F 7/028* (2006.01)

(52) U.S. Cl. ..................... 430/270.1; 430/326

(58) Field of Classification Search ............... 430/270.1, 430/326
See application file for complete search history.

(56) References Cited

U.S. PATENT DOCUMENTS

| | | | |
|---|---|---|---|
| 6,258,507 B1 | 7/2001 | Ochiai et al. | |
| 6,656,660 B1 * | 12/2003 | Urano et al. | 430/270.1 |
| 2003/0148211 A1 * | 8/2003 | Kamabuchi et al. | 430/270.1 |
| 2004/0175654 A1 | 9/2004 | Yasunami et al. | |
| 2005/0277060 A1 | 12/2005 | Shirakawa et al. | |
| 2006/0216635 A1 * | 9/2006 | Hirano et al. | 430/270.1 |
| 2006/0292490 A1 | 12/2006 | Kodama et al. | |
| 2008/0241743 A1 * | 10/2008 | Mizutani et al. | 430/281.1 |
| 2011/0104610 A1 | 5/2011 | Kodama et al. | |

FOREIGN PATENT DOCUMENTS

| | | | |
|---|---|---|---|
| EP | 1835342 A2 | | 9/2007 |
| EP | 1837704 A2 | | 9/2007 |
| JP | 7-84364 A | | 3/1995 |
| JP | 7-316268 A | | 12/1995 |
| JP | 7-319155 A | | 12/1995 |
| JP | 10-186647 A | | 7/1998 |
| JP | 11-271977 A | | 10/1999 |
| JP | 2000-284482 A | | 10/2000 |
| JP | 2002-229193 A | | 8/2002 |
| JP | 2005-274878 A | | 10/2005 |
| JP | 2006-328241 A | | 12/2006 |
| JP | 2007-10748 A | | 1/2007 |
| JP | 2007-147878 | * | 6/2007 |

OTHER PUBLICATIONS

Machine translation of JP 2007-147878, published on Jun. 14, 2007.*
Extended European Search Report dated Feb. 17, 2009.
European Office Action dated Apr. 19, 2010 in Application No. 08006051.0.
"Provisional Recommendation on Nomenclature of Organic Chemistry," International Union of Pure and Applied Chemistry website, Oct. 27, 2004, http://old.iupac.org/reports/provisional/abstract04/BB-prs310305/CompleteDraft.pdf.
Japanese Office Action issued on Jul. 5, 2011 in the corresponding Japanese Patent Application No. 2007-094783.

* cited by examiner

*Primary Examiner* — Anca Eoff
(74) *Attorney, Agent, or Firm* — Sughrue Mion, PLLC

(57) ABSTRACT

A positive resist composition, includes: (B1) a resin capable of decomposing under an action of an acid to increase a solubility of the resin (B1) in an aqueous alkali solution, the resin (B1) containing a specific hydroxystyrene-based repeating unit and/or (meth)acrylic acid-based repeating unit as defined in the specification; (B2) a resin capable of decomposing under an action of an acid to increase a solubility of the resin (B2) in an aqueous alkali solution, the resin (B2) containing a specific hydroxystyrene-based repeating unit and/or (meth)acrylic acid-based repeating unit as defined in the specification and containing a specific aromatic ring structure-containing repeating unit as defined in the specification; and (A) a compound capable of generating an acid upon irradiation with actinic rays or radiation, and a pattern forming method uses the composition.

11 Claims, No Drawings

POSITIVE RESIST COMPOSITION AND PATTERN FORMING METHOD USING THE SAME

BACKGROUND OF THE INVENTION

1. Field of the Invention

The present invention relates to a positive resist composition suitable for use in the ultramicrolithography process such as production of VLSI or a high-capacity microchip or in other photofabrication processes, and a pattern forming method using the composition. More specifically, the present invention relates to a positive resist composition capable of forming a high-resolution pattern by using KrF excimer laser light, electron beam, EUV light or the like, and a pattern forming method using the composition. That is, the present invention relates to a resist composition suitably usable for fine processing of a semiconductor device, where KrF excimer laser light, electron beam or EUV light is used, and a pattern forming method using the composition.

2. Description of the Related Art

In the process of producing a semiconductor device such as IC and LSI, fine processing by lithography using a photoresist composition has been conventionally performed. Recently, the integration degree of an integrated circuit is becoming higher and formation of an ultrafine pattern in the sub-micron or quarter-micron region is required. To cope with this requirement, the exposure wavelength also tends to become shorter, for example, from g line to i line or further to KrF excimer laser light. At present, other than the excimer laser light, development of lithography using electron beam, X ray or EUV light is proceeding.

In the lithography employed for the ion injection step using KrF excimer laser light, it is an important issue to satisfy all performances in terms of high resolution, number of development defects and iso-dense bias in the ultrafine region, and this problem needs to be solved.

As regards the resist suitable for the lithography process used in such an ion injection step, a chemical amplification-type resist formulated to adjust the light transparency of the resist film is supposed to be effective from the standpoint of controlling the resist pattern profile on a high-reflection substrate and as disclosed in JP-A-7-84364 (the term "JP-A" as used herein means an "unexamined published Japanese patent application"), JP-A-7-316268, JP-A-7-319155, JP-A-10-186647, JP-A-2006-328241 and JP-A-2000-284482, in the case of a positive resist, a chemical amplification-type resist composition mainly comprising a phenolic polymer insoluble or sparingly soluble in an alkali developer but becoming soluble in an alkali developer under the action of an acid (hereinafter simply referred to as a "phenolic acid-decomposable resin"), an acid generator, and a coloring matter for adjusting the light transparency has been proposed.

There is also known a case where the coloring matter for adjusting the light transparency is connected to a phenolic acid-decomposable resin. As regards the coloring matter for adjusting the light transparency, an anthracene structure, a benzenecarboxylic acid structure, a naphthalenecarboxylic acid structure, a thiophene structure and the like are known.

However, by any combination of these techniques, it is impossible at present to satisfy the performances in terms of high resolution, number of development defects and iso-dense bias in the ultrafine region.

SUMMARY OF THE INVENTION

An object of the present invention is to solve the problems in the technology for enhancing the performance at fine processing of a semiconductor device, where actinic rays or radiation, particularly, KrF excimer laser light, electron beam or EUV light, is used, and provide a positive resist composition satisfying the performances in terms of high resolution, number of development defects, and iso-dense bias in an ultrafine region, particularly, in an ion injection step not using an antireflection film (BARC), and a pattern forming method using the composition.

The present invention is achieved by the following constructions.

(1) A positive resist composition, comprising:

(B1) a resin capable of decomposing under an action of an acid to increase a solubility of the resin (B1) in an aqueous alkali solution, the resin (B1) containing at least one of a repeating unit represented by formula (Ia) and a repeating unit represented by formula (IIa);

(B2) a resin capable of decomposing under an action of an acid to increase a solubility of the resin (B2) in an aqueous alkali solution, the resin (B2) containing: at least one of a repeating unit represented by formula (Ib) and a repeating unit represented by formula (IIb); and a repeating unit represented by formula (III) containing at least two aromatic ring structures; and (A) a compound capable of generating an acid upon irradiation with actinic rays or radiation:

(Ia)

wherein X represents a hydrogen atom, a methyl group or a halogen atom;

$A_1$ represents a hydrogen atom or a group capable of leaving under an action of an acid, and when a plurality of $A_1$'s are present, the plurality of $A_1$'s may be the same or different;

L represents a monovalent organic group, a halogen atom, a cyano group or a nitro group, and when a plurality of L's are present, the plurality of L's may be the same or different;

n represents an integer of 1 to 3; and m represents an integer of 0 to 2:

(IIa)

wherein Y represents a hydrogen atom, a methyl group, a halogen atom, a cyano group, a hydroxymethyl group, an alkoxymethyl group or an acyloxymethyl group; and $A_2$ represents a group capable of leaving under an action of an acid:

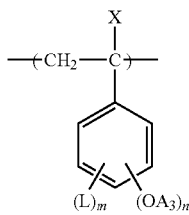
(Ib)

wherein X represents a hydrogen atom, a methyl group or a halogen atom;

$A_3$ represents a hydrogen atom or a group capable of leaving under an action of an acid, and when a plurality of $A_3$'s are present, the plurality of $A_3$'s may be the same or different;

L represents a monovalent organic group, a halogen atom, a cyano group or a nitro group, and when a plurality of L's are present, the plurality of L's may be the same or different;

n represents an integer of 1 to 3; and m represents an integer of 0 to 2:

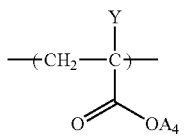
(IIb)

wherein Y represents a hydrogen atom, a methyl group, a halogen atom, a cyano group, a hydroxymethyl group, an alkoxymethyl group or an acyloxymethyl group; and $A_4$ represents a hydrogen atom or a group capable of leaving under an action of an acid:

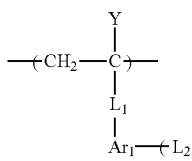
(III)

wherein Y represents a hydrogen atom, a methyl group, a halogen atom, a cyano group, a hydroxymethyl group, an alkoxymethyl group or an acyloxymethyl group;

$L_1$ represents a single bond, an arylene group, an aralkylene group, a carbonyl group, an ester group, an imino group or an ether group, or a divalent linking group including a combination of at least two kinds of groups thereof;

$AR_1$ represents a phenylene group or a naphthylene group;

$L_2$ represents a single bond, a carbonyl group, an ester group, an imino group, an ether group, an alkylene group or an aralkylene group, or a divalent linking group including a combination of at least two kinds of groups thereof, and when a plurality of $L_2$'s are present, the plurality of $L_2$'s may be the same or different;

$AR_2$ represents a phenyl group or a naphthyl group, and when a plurality of $AR_2$'s are present, the plurality of $AR_2$'s may be the same or different; and n represents an integer of 0 to 2.

(2) The positive resist composition as described in (1) above, wherein the resin (B1) has a molecular weight dispersity of from 1.0 to 1.3.

(3) The positive resist composition as described in (1) or (2) above, wherein the resin (B2) has a molecular weight dispersity of from 1.0 to 1.3.

(4) The positive resist composition as described in any of (1) to (3) above, wherein a weight average molecular weight of the resin (B1) is larger than a weight average molecular weight of the resin (B2).

(5) The positive resist composition as described in any of (1) to (4) above, wherein in formula (III), $L_2$ is a single bond.

(6) The positive resist composition as described in any of (1) to (5) above, wherein the resin (B2) has a weight average molecular weight of from 5,000 to 15,000.

(7) The positive resist composition as described in any of (1) to (6) above, wherein the compound (A) contains at least two kinds of compounds selected from the group consisting of a triarylsulfonium salt, an oxime sulfonate compound and a diazodisulfone compound.

(8) The positive resist composition as described in any of (1) to (6) above, wherein the compound (A) contains a sulfonium salt having a bis(alkylsulfonyl)amide anion or a tris(alkylsulfonyl)methide anion.

(9) A pattern forming method, comprising:

forming a resist film from the positive resist composition as described in any of (1) to (8) above; and exposing and developing the resist film.

DETAILED DESCRIPTION OF THE INVENTION

The present invention is described in detail below.

Incidentally, in the context of the present invention, when a group (atomic group) is denoted without specifying whether substituted or unsubstituted, the group includes both a group having no substituent and a group having a substituent. For example, an "alkyl group" includes not only an alkyl group having no substituent (unsubstituted alkyl group) but also an alkyl group having a substituent (substituted alkyl group).

(B1) Resin capable of decomposing under the action of an acid to increase the solubility in an aqueous alkali solution, the resin having a repeating unit represented by formula (Ia) and/or a repeating unit represented by formula (IIa)

The positive resist composition of the present invention comprises (B1) a resin capable of decomposing under the action of an acid to increase the solubility in an aqueous alkali solution, the resin having a repeating unit represented by the following formula (Ia) and/or a repeating unit represented by formula (IIa).

(Ia)

In formula (Ia), X represents a hydrogen atom, a methyl group or a halogen atom.

$A_1$ represents a hydrogen atom or a group capable of leaving under the action of an acid.

L represents a monovalent organic group, a halogen atom, a cyano group or a nitro group.

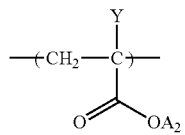 (IIa)

In formula (IIa), Y represents a hydrogen atom, a methyl group, a halogen atom, a cyano group, a hydroxymethyl group, an alkoxymethyl group or an acyloxymethyl group.

$A_2$ represents a group capable of leaving under the action of an acid.

In formula (Ia), the group capable of leaving under the action of an acid of $A_1$ includes, specifically, a tertiary alkyl group such as tert-butyl group and tert-amyl group, a tert-butoxycarbonyl group, a tert-butoxycarbonylmethyl group, and an acetal group represented by $-(C(L_{1a})(L_{2a}))_n-O-Z$.

In the formula, $L_{1a}$ and $L_{2a}$, which may be the same or different, each represents a hydrogen atom, an alkyl group, a cycloalkyl group or an aralkyl group. Z represents an alkyl group, a cycloalkyl group, an aralkyl group, or a monovalent organic group formed by combining at least two members thereof. Z and $L_{1a}$ may combine with each other to form a 5- or 6-membered ring. n represents an integer of 0 to 4.

The alkyl group or cycloalkyl group of $L_{1a}$, $L_{2a}$ and Z is preferably a linear or branched alkyl group or cycloalkyl group having a carbon number of 1 to 20, such as methyl group, ethyl group, propyl group, isopropyl group, n-butyl group, isobutyl group, tert-butyl group, pentyl group, cyclopentyl group, hexyl group, cyclohexyl group, octyl group and dodecyl group.

The aralkyl group in $L_{1a}$, $L_{2a}$ and Z includes an aralkyl group having a carbon number of 7 to 15, such as benzyl group and phenethyl group.

These groups each may further have a substituent, and examples of the substituent which these groups each may have include a hydroxyl group, a halogen atom, and a nitro group.

Examples of the 5- or 6-membered ring formed by combining Z and $L_{1a}$ with each other include a tetrahydropyran ring and a tetrahydrofuran ring.

In the present invention, Z is preferably a linear or branched alkyl group. By virtue of this construction, the effect of the present invention is brought out more prominently.

Examples of the monovalent organic group of L include an alkyl group, a cycloalkyl group, an alkoxy group, an acyl group, an acyloxy group, an aryl group, an aryloxy group, an aralkyl group, an aralkyloxy group, a hydroxy group, a halogen atom, a cyano group, a nitro group, a sulfonylamino group, an alkylthio group, an arylthio group and an aralkylthio group.

In the monovalent organic group of L, the alkyl group and the alkyl group in the alkoxy group, acyl group, acyloxy group and alkylthio group are preferably a linear or branched alkyl group having a carbon number of 1 to 20, such as methyl group, ethyl group, propyl group, isopropyl group, n-butyl group, isobutyl group, tert-butyl group, pentyl group, hexyl group, octyl group and dodecyl group.

In the monovalent organic group of L, the cycloalkyl group is preferably a cycloalkyl group having a carbon number of 3 to 20, such as cyclopropyl group, cyclobutyl group, cyclopentyl group and cyclohexyl group.

In the monovalent organic group of L, the aryl group and the aryl group in the aryloxy group and arylthio group generally include an aryl group having a carbon number of 6 to 14, such as phenyl group, xylyl group, toluoyl group, cumenyl group, naphthyl group and anthracenyl group.

In the monovalent organic group of L, the aralkyl group and the aralkyl group in the aralkyloxy group and aralkylthio group include an aralkyl group having a carbon number of 7 to 15, such as benzyl group and phenethyl group.

These groups each may further have a substituent, and preferred examples of the substituent which these groups each may further have include an alkyl group, an alkoxy group, a hydroxyl group, a halogen atom, a nitro group, an acyl group, an acyloxy group, an acylamino group, a sulfonylamino group, an alkylthio group, an arylthio group, an aralkylthio group, a thiophenecarbonyloxy group, a thiophenemethylcarbonyloxy group and a heterocyclic residue such as pyrrolidone residue.

In formula (IIa), the group capable of leaving under the action of an acid of $A_2$ is preferably a hydrocarbon group (preferably having a carbon number of 20 or less, more preferably from 4 to 12), more preferably a tertiary alkyl group such as tert-butyl group and tert-amyl group, or an alicyclic or aromatic ring-containing hydrocarbon group (for example, an alicyclic group itself, or a group with the alkyl group being substituted by an alicyclic group).

The alicyclic structure may be monocyclic or polycyclic. Specific examples thereof include a monocyclo, bicyclo, tricyclo or tetracyclo structure having a carbon number of 5 or more. The carbon number of the alicyclic structure is preferably from 6 to 30, more preferably from 7 to 25.

The preferred alicyclic structure includes, as denoted in terms of the monovalent alicyclic group, an adamantyl group, a noradamantyl group, a decalin residue, a tricyclodecanyl group, a tetracyclododecanyl group, a norbornyl group, a cedrol group, a cyclohexyl group, a cycloheptyl group, a cyclooctyl group, a cyclodecanyl group and a cyclododecanyl group. Among these, an adamantyl group, a decalin residue, a norbornyl group, a cedrol group, a cyclohexyl group, a cycloheptyl group, a cyclooctyl group, a cyclodecanyl group and a cyclododecanyl group are more preferred.

The hydrocarbon group having such an alicyclic structure may have a substituent. The substituent which the alicyclic ring in these groups may have includes an alkyl group, a halogen atom, a hydroxyl group, an alkoxy group, a carboxyl group, and an alkoxycarbonyl group. The alkyl group is preferably a lower alkyl group such as methyl group, ethyl group, propyl group, isopropyl group and butyl group, more preferably a methyl group, an ethyl group, a propyl group or an isopropyl group. The alkoxy group includes an alkoxy group having a carbon number of 1 to 4, such as methoxy group, ethoxy group, propoxy group and butoxy group. The alkyl group and alkoxy group each may further have a substituent. The substituent which the alkyl group and alkoxy group each may further have includes a hydroxyl group, a halogen atom and an alkoxy group.

The alicylcic structure-containing group capable of leaving under the action of an acid is preferably a group represented by any one of the following formulae (pI) to (pV):

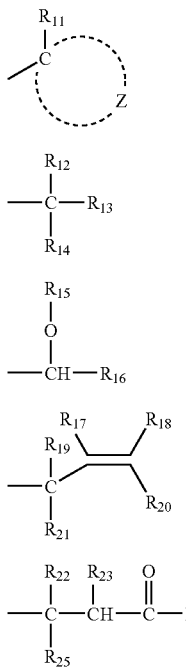

(pI)

(pII)

(pIII)

(pIV)

(pV)

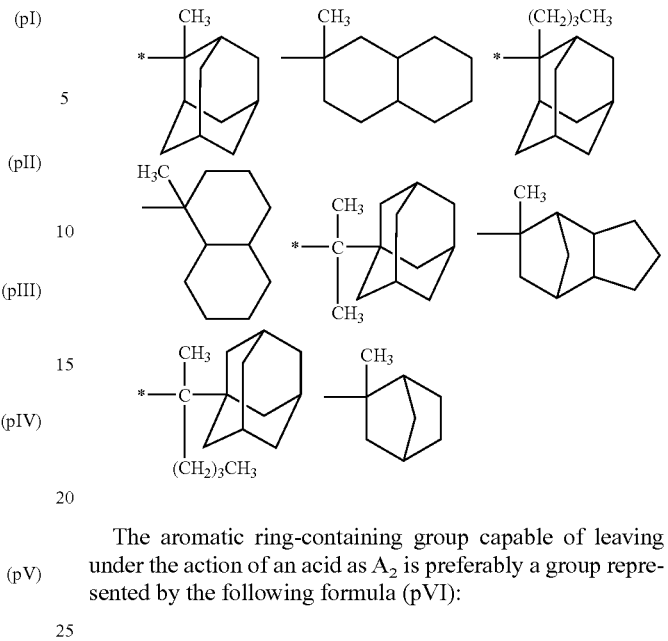

The aromatic ring-containing group capable of leaving under the action of an acid as $A_2$ is preferably a group represented by the following formula (pVI):

(pVI)

In formulae (pI) to (pV), $R_{11}$, represents a methyl group, an ethyl group, an n-propyl group, an isopropyl group, an n-butyl group, an isobutyl group or a sec-butyl group.

Z represents an atomic group necessary for forming an alicyclic hydrocarbon group together with the carbon atom.

$R_{12}$ to $R_{16}$ each independently represents a linear or branched alkyl group having a carbon number of 1 to 4, or an alicyclic hydrocarbon group, provided that at least one of $R_{12}$ to $R_{14}$, or either $R_{15}$ or $R_{16}$, represents an alicyclic hydrocarbon group.

$R_{17}$ to $R_{21}$, each independently represents a hydrogen atom, a linear or branched alkyl group having a carbon number of 1 to 4, or an alicyclic hydrocarbon group, provided that at least one of $R_{17}$ to $R_2$, represents an alicylcic hydrocarbon group. Also, at least either $R_{19}$ or $R_{21}$, represents a linear or branched alkyl group having a carbon number of 1 to 4, or an alicyclic hydrocarbon group.

$R_{22}$ to $R_{25}$ each independently represents a hydrogen atom, a linear or branched alkyl group having a carbon number of 1 to 4, or an alicyclic hydrocarbon group, provided that at least one of $R_{22}$ to $R_{25}$ represents an alicyclic hydrocarbon group. $R_{23}$ and $R_{24}$ may combine with each other to form a ring.

In formulae (pI) to (pV), examples of the linear or branched alkyl group having a carbon number of 1 to 4 of $R_{12}$ to $R_{25}$ include a methyl group, an ethyl group, an n-propyl group, an isopropyl group, an n-butyl group, an isobutyl group, a sec-butyl group and a tert-butyl group.

The alkyl group may have a substituent. Examples of the substituent which the alkyl group may further have include an alkoxy group having a carbon number of 1 to 4, a halogen atom (fluorine, chlorine, bromine, iodine), an acyl group, an acyloxy group, a cyano group, a hydroxyl group, a carboxy group, an alkoxycarbonyl group and a nitro group.

The alicyclic hydrocarbon group in $R_{11}$ to $R_{25}$ and the alicyclic hydrocarbon group formed by Z and the carbon atom include those described above as the alicyclic structure.

Specific examples of the alicyclic structure-containing group capable of leaving under the action of an acid as $A_2$ are set forth below, but the present invention is not limited thereto.

In formula (pVI), $R_{26}$ represents an alkyl group.

$R_{27}$ represents an aryl group.

The alkyl group of $R_{26}$ in formula (pVI) is the same as the alkyl group in $R_{12}$ to $R_{25}$.

The aryl group of $R_{27}$ is preferably an aryl group having a carbon number of 6 to 14 and may have a substituent such as alkyl group, aralkyl group, halogen atom, nitro group, cyano group, hydroxy group, alkoxy group, acyl group and acyloxy group. The aryl group is preferably an aryl group having a benzene ring or a naphthalene ring.

The resin (B1) has a group capable of decomposing under the action of an acid to increase the solubility in an aqueous alkali solution (hereinafter sometimes referred to as an "acid-decomposable group").

Examples of the acid-decomposable group include a group where a hydrogen atom of an alkali-soluble group such as carboxyl group, phenolic hydroxyl group, sulfonic acid group and thiol group is protected by a group capable of leaving under the action of an acid.

Examples of the group capable of leaving under the action of an acid include —C($R_{36}$)($R_{37}$)($R_{38}$), —C($R_{36}$)($R_{37}$)(O$R_{39}$), —C(=O)—O—C($R_{36}$)($R_{37}$)($R_{38}$), —C($R_{01}$)($R_{02}$)(O$R_{39}$), and —C($R_{01}$)($R_{02}$)—C(=O)—O—C($R_{36}$)($R_{37}$)($R_{38}$).

In the formulae, $R_{36}$ to $R_{39}$ each independently represents an alkyl group, a cycloalkyl group, an aryl group, an aralkyl group or an alkenyl group. $R_{36}$ and $R_{37}$ may combine with each other to form a ring.

$R_{01}$ and $R_{02}$ each independently represents a hydrogen atom, an alkyl group, a cycloalkyl group, an aryl group, an aralkyl group or an alkenyl group.

The acid-decomposable group in the resin (B1) may be an —O$A_1$ group in formula (Ia) or a —C(=O)-$A_2$ group in formula (IIa), where $A_1$ or $A_2$ leaves under the action of an acid and as a result, a hydroxyl group or a carboxyl group is produced in the repeating unit represented by formula (Ia) or (IIa), or may be another group which decomposes under the action of an acid to produce an alkali-soluble group such as hydroxyl group and carboxyl group in the residue bonded to the repeating unit.

The monomer corresponding to the repeating unit represented by formula (Ia) may be synthesized by acetalizing a hydroxy-substituted styrene monomer and a vinyl ether compound in a solvent such as THF and methylene chloride in the presence of an acidic catalyst such as p-toluenesulfonic acid and pyridine p-toluenesulfonate, or by effecting tert-Boc protection using tert-butyl dicarboxylate in the presence of a basic catalyst such as triethylamine, pyridine and DBU. A commercially available product may also be used.

The monomer corresponding to the repeating unit represented by formula (IIa) may be synthesized by esterifying a (meth)acrylic acid chloride and an alcohol compound in a solvent such as THF, acetone and methylene chloride in the presence of a basic catalyst such as triethylamine, pyridine and DBU. A commercially available product may also be used.

Specific examples of the repeating unit represented by formula (Ia) are set forth below, but the present invention is not limited thereto.

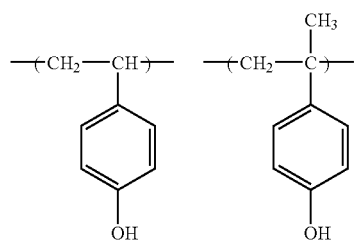

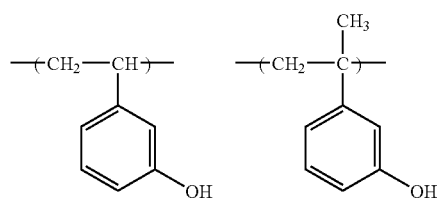

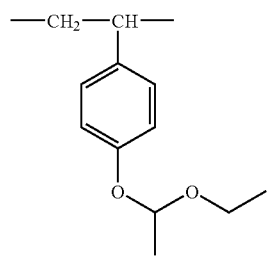

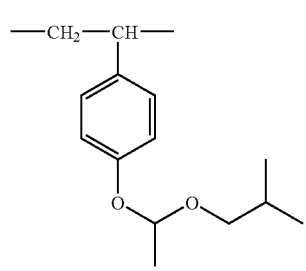

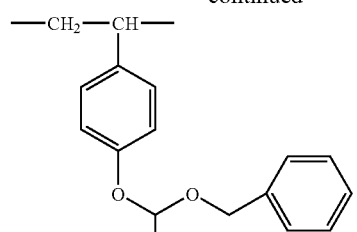

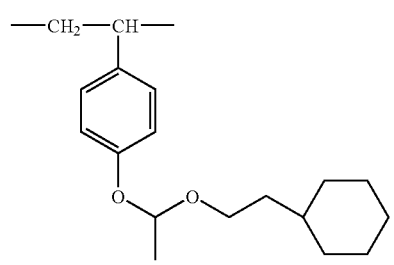

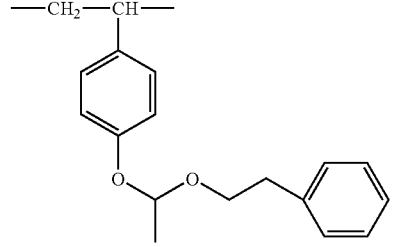

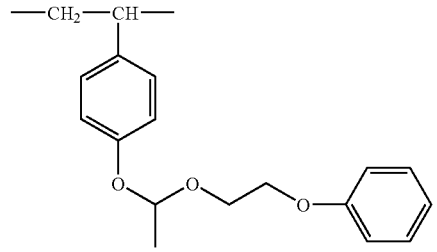

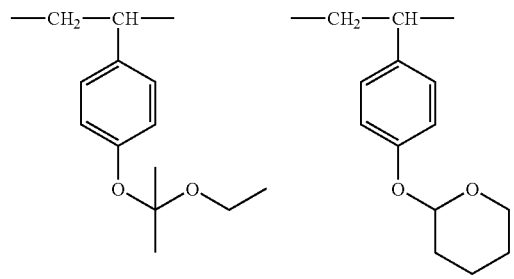

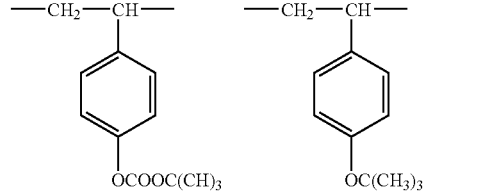

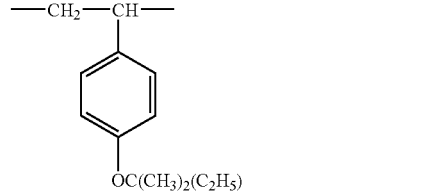

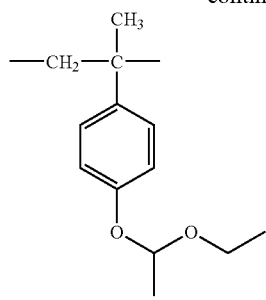
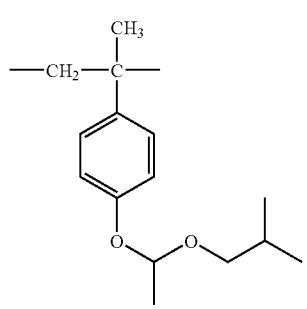
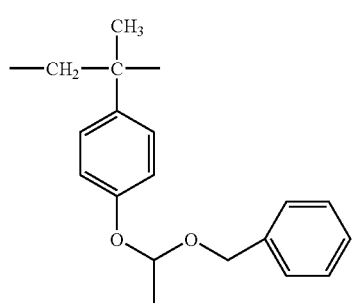
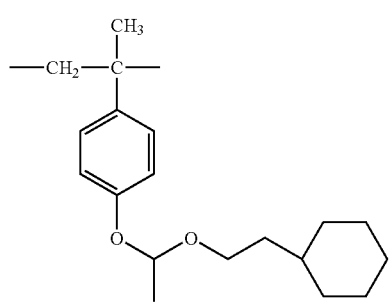
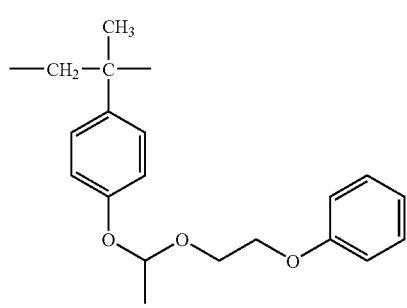
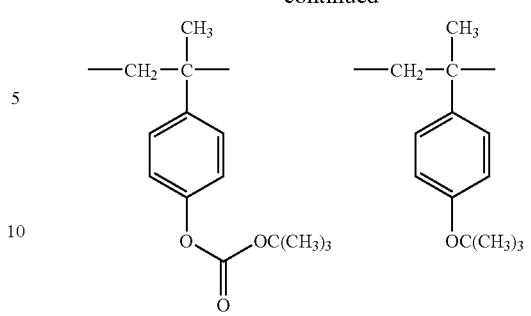
Specific examples of the polymerizable monomer corresponding to the repeating unit represented by formula (IIa) or specific examples of the repeating unit represented by formula (IIa) are set forth below, but the present invention is not limited thereto.
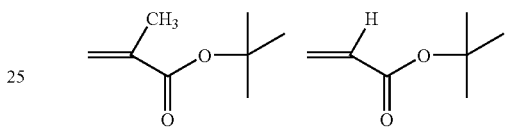
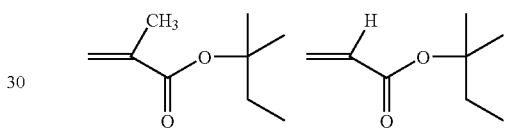
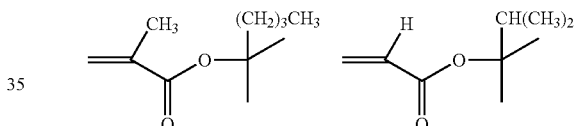
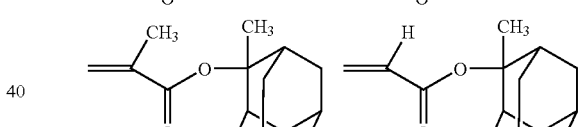
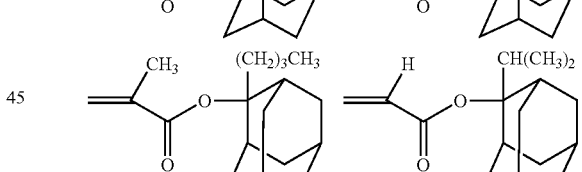
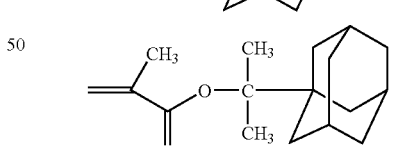
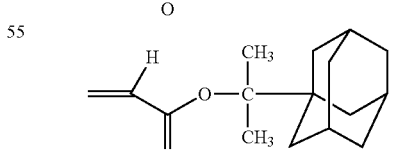
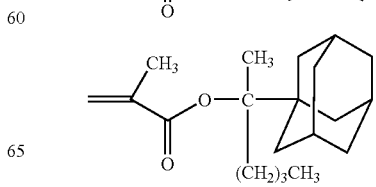

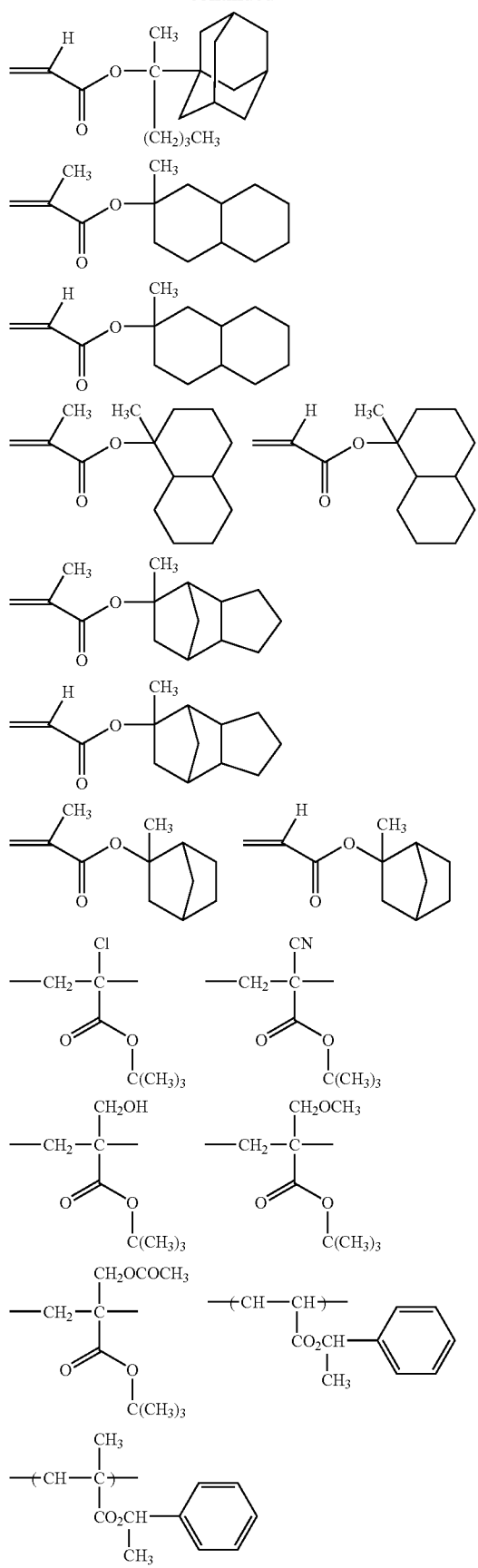
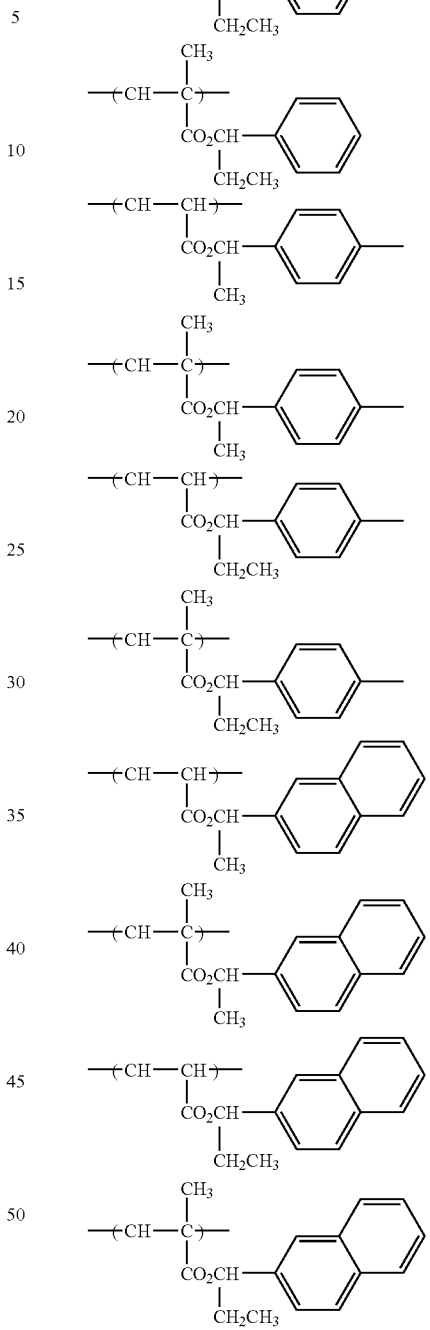

(B2) Resin capable of decomposing under the action of an acid to increase the solubility in an aqueous alkali solution, the resin having a repeating unit represented by formula (Ib) and/or a repeating unit represented by formula (IIb) and having a repeating unit represented by formula (III) containing at least two aromatic ring structures The positive resist composition of the present invention comprises (B2) a resin capable of decomposing under the action of an acid to increase the solubility in an aqueous alkali solution, the resin having a repeating unit represented by the following formula (Ib) and/or a repeating unit represented by formula (IIb) and having a repeating unit represented by formula (III) containing at least two aromatic ring structures.

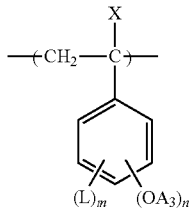
(Ib)

In formula (Ib), X represents a hydrogen atom, a methyl group, or a halogen atom.

$A_3$ represents a hydrogen atom or a group capable of leaving under the action of an acid, and when a plurality of $A_3$'s are present, the plurality of $A_3$'s may be the same or different.

L represents a monovalent organic group, a halogen atom, a cyano group or a nitro group, and when a plurality of L's are present, the plurality of L's may be the same or different.

n represents an integer of 1 to 3.

m represents an integer of 0 to 2.

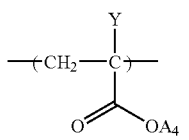
(IIb)

In formula (IIb), Y represents a hydrogen atom, a methyl group, a halogen atom, a cyano group, a hydroxymethyl group, an alkoxymethyl group or an acyloxymethyl group.

$A_4$ represents a hydrogen atom or a group capable of leaving under the action of an acid.

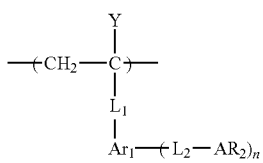
(III)

In formula (III), Y represents a hydrogen atom, a methyl group, a halogen atom, a cyano group, a hydroxymethyl group, an alkoxymethyl group or an acyloxymethyl group.

$L_1$ represents a single bond, an arylene group, an aralkylene group, a carbonyl group, an ester group, an imino group, an ether group, or a divalent linking group comprising a combination of at least two kinds of groups thereof.

$AR_1$ represents a phenylene group or a naphthylene group.

$L_2$ represents a single bond, a carbonyl group, an ester group, an imino group, an ether group, an alkylene group, an aralkylene group, or a divalent linking group comprising a combination of at least two kinds of groups thereof, and when a plurality of $L_2$'s are present, the plurality of $L_2$'s may be the same or different.

$AR_2$ represents a phenyl group or a naphthyl group, and when a plurality of $AR_2$'s are present, the plurality of $AR_2$'s may be the same or different.

n represents an integer of 0 to 2.

X, L, n and m in formula (Ib) have the same meanings as those in formula (Ia).

The group capable of leaving under the action of an acid in $A_3$ has the same meaning as the group capable of leaving under the action of an acid in $A_1$ of formula (Ia).

Specific examples of the repeating unit represented by formula (Ib) are the same as those specific examples of the repeating unit represented by formula (Ia).

Y in formula (IIb) has the same meaning as that in formula (IIa).

The group capable of leaving under the action of an acid in $A_4$ has the same meaning as the group capable of leaving under the action of an acid in $A_2$ of formula (IIa).

Specific examples of the repeating unit represented by formula (IIb) are the same as those specific examples of the repeating unit represented by formula (IIa).

Y in formula (III) has the same meaning as that in formula (IIa).

The arylene group of $L_1$ is preferably an arylene group having a carbon number of 6 to 14, specifically, a phenylene or a naphthylene.

The alkylene group of $L_2$ is preferably a linear or branched alkylene group having a carbon number of 1 to 8, and examples thereof include a methylene group, an ethylene group, a propylene group, a butylene group, a hexylene group, and an octylene group.

Examples of the aralkylene group of $L_1$ and $L_2$ include a tolylene group and a xylylene group.

The repeating unit represented by formula (III) contains at least two aromatic ring structures. The number of aromatic ring structures is preferably 2 or 3, more preferably 2.

The aromatic ring structure may be preset in any of $L_1$, $AR_1$, and $AR_2$.

The monomer corresponding to the repeating unit represented by formula (III) may be synthesized, for example, by a method of causing a (meth)acrylic acid chloride and a base to act on a compound represented by the following formula (1):

$$HO\text{-}AR_1\text{-}(L_2\text{-}AR_2)_n \quad (1)$$

(wherein $AR_1$, $L_2$, $AR_2$ and n have the same meanings as those in formula (III)), thereby effecting esterification.

The resin (B2) has a group capable of decomposing under the action of an acid to increase the solubility in an aqueous alkali solution (hereinafter sometimes referred to as an "acid-decomposable group").

Examples of the acid-decomposable group include a group where a hydrogen atom of an alkali-soluble group such as carboxyl group, phenolic hydroxyl group, sulfonic acid group and thiol group is protected by a group capable of leaving under the action of an acid.

Examples of the group capable of leaving under the action of an acid include —$C(R_{36})(R_{37})(R_{38})$, —$C(R_{36})(R_{37})(OR_{39})$, —$C(=O)$—O—$C(R_{36})(R_{37})(R_{38})$, —$C(R_{01})(R_{02})(OR_{39})$, and —$C(R_O1)(R_{02})$—$C(=O)$—O—$C(R_{36})(R_{37})(R_{38})$.

In the formulae, $R_{36}$ to $R_{39}$ each independently represents an alkyl group, a cycloalkyl group, an aryl group, an aralkyl group or an alkenyl group. $R_{36}$ and $R_{37}$ may combine with each other to form a ring.

$R_{01}$ and $R_{02}$ each independently represents a hydrogen atom, an alkyl group, a cycloalkyl group, an aryl group, an aralkyl group or an alkenyl group.

The acid-decomposable group in the resin (B2) may be an —$OA_3$ group in formula (Ib) or a —$C(=O)$—O-$A_4$ group in formula (IIb), where $A_3$ or $A_4$ leaves under the action of an acid and as a result, a hydroxyl group or a carboxyl group is produced in the repeating unit represented by formula (Ib) or (IIb), or may be another group which decomposes under the action of an acid to produce an alkali-soluble group such as hydroxyl group and carboxyl group in the residue bonded to the repeating unit.

Specific examples of the repeating unit represented by formula (III) are set forth below, but the present invention is not limited thereto.

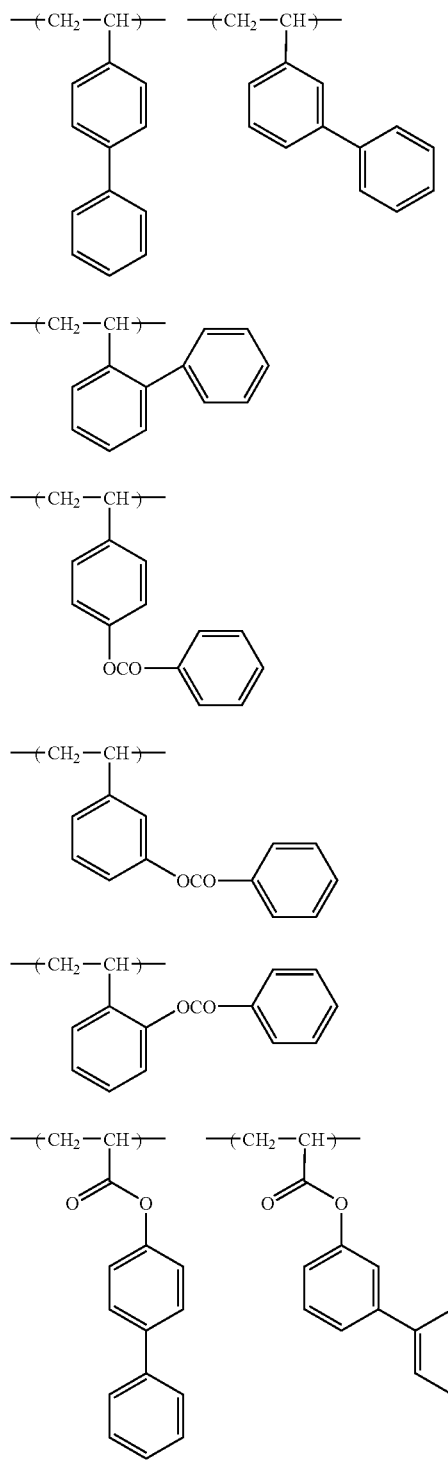

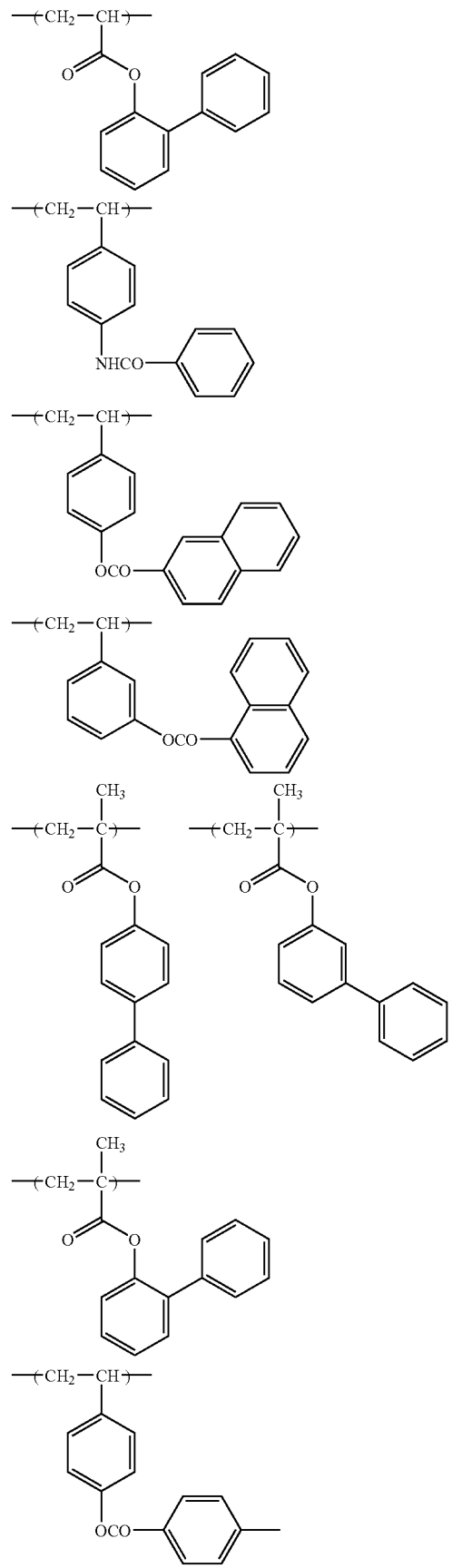

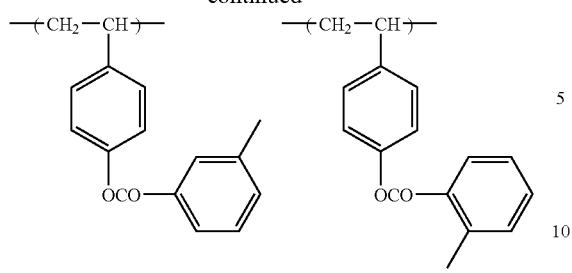
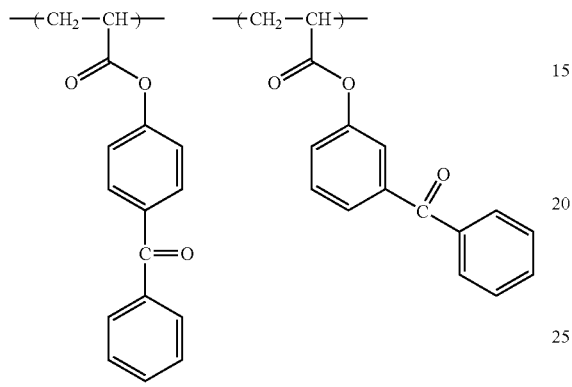
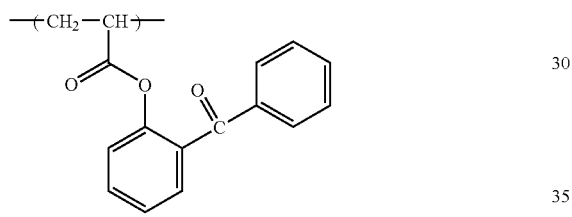
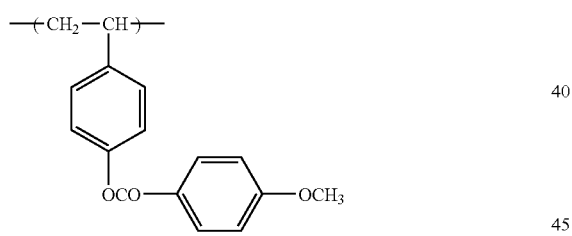
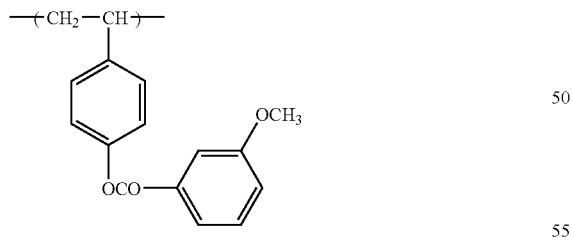
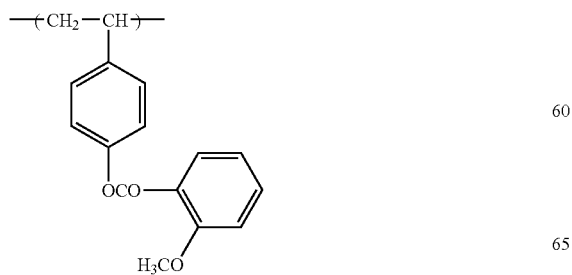
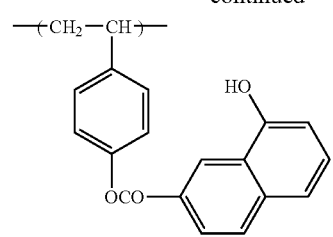
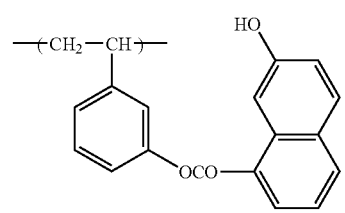
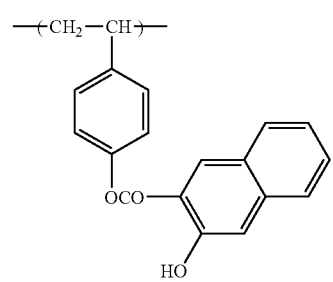
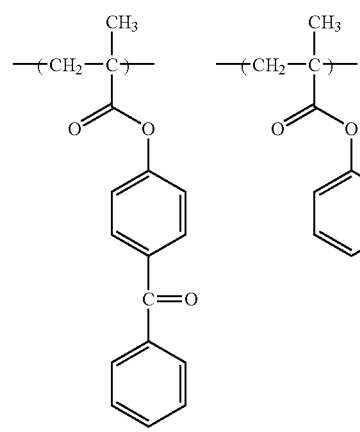
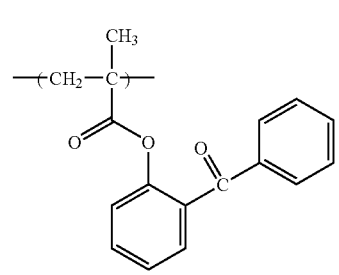

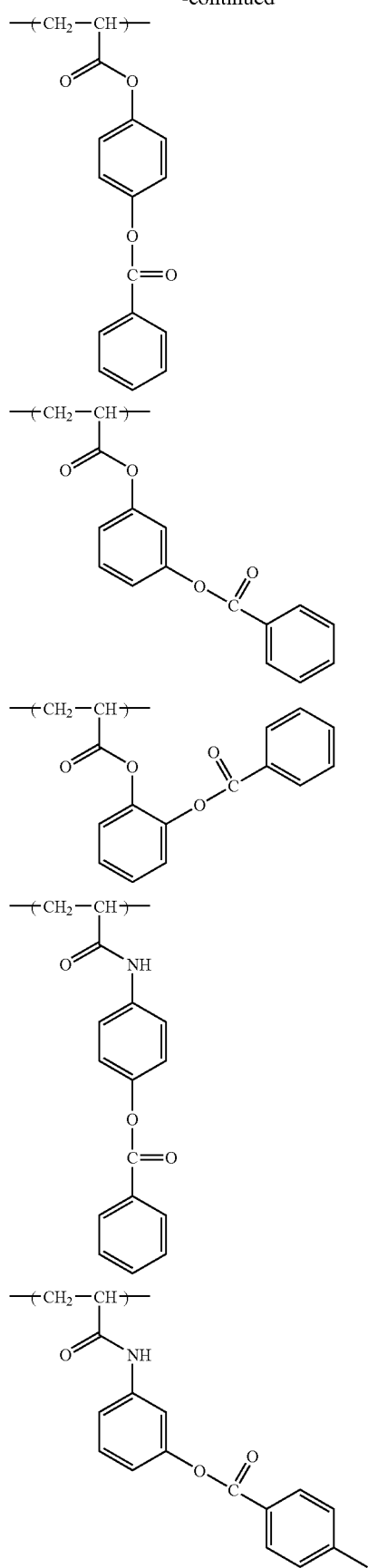
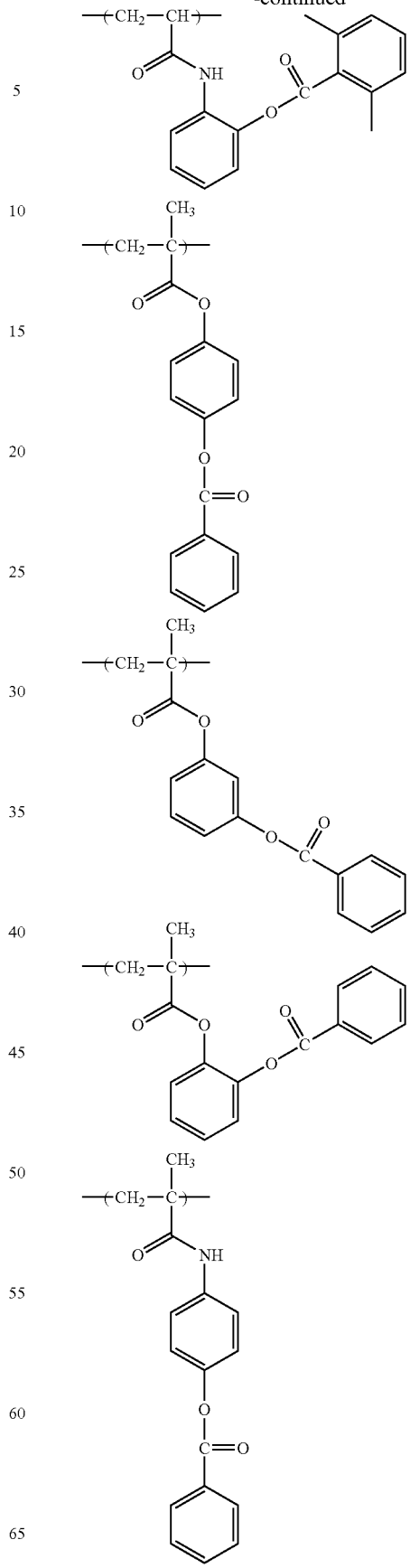

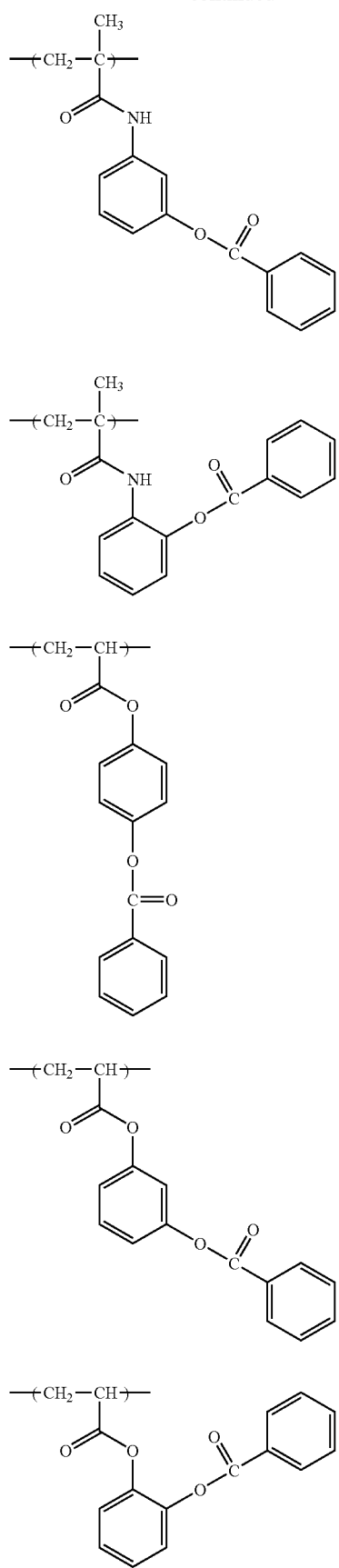
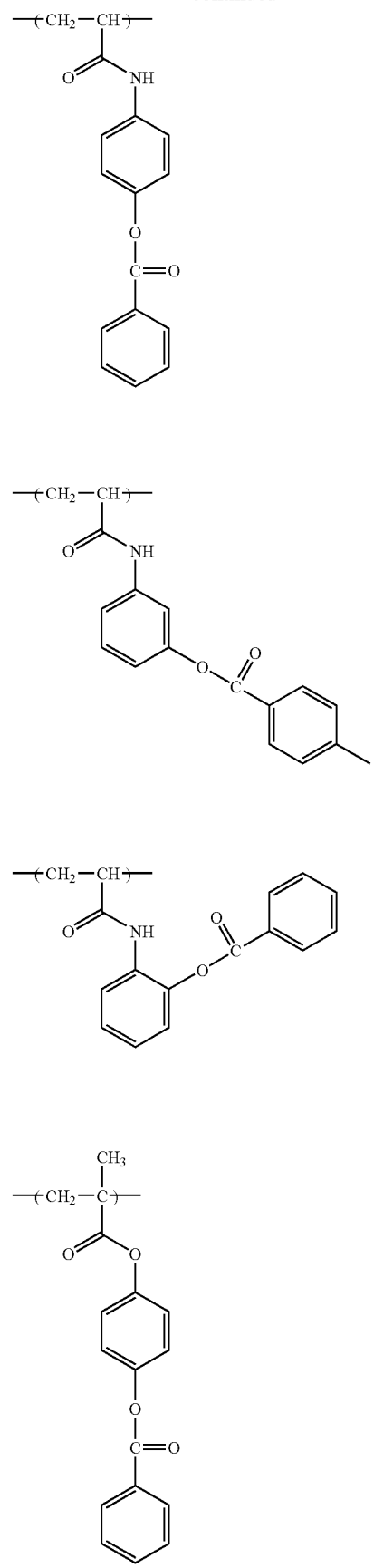

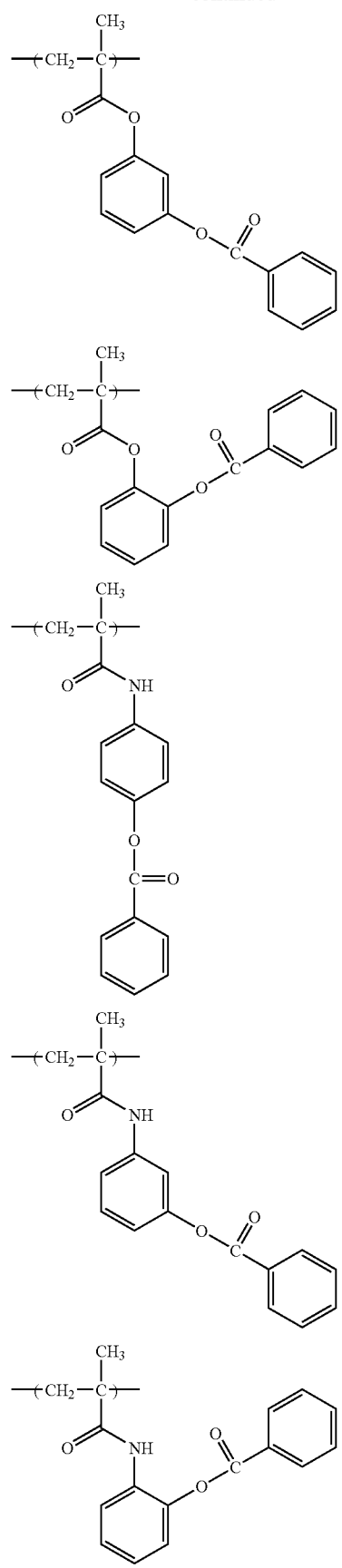
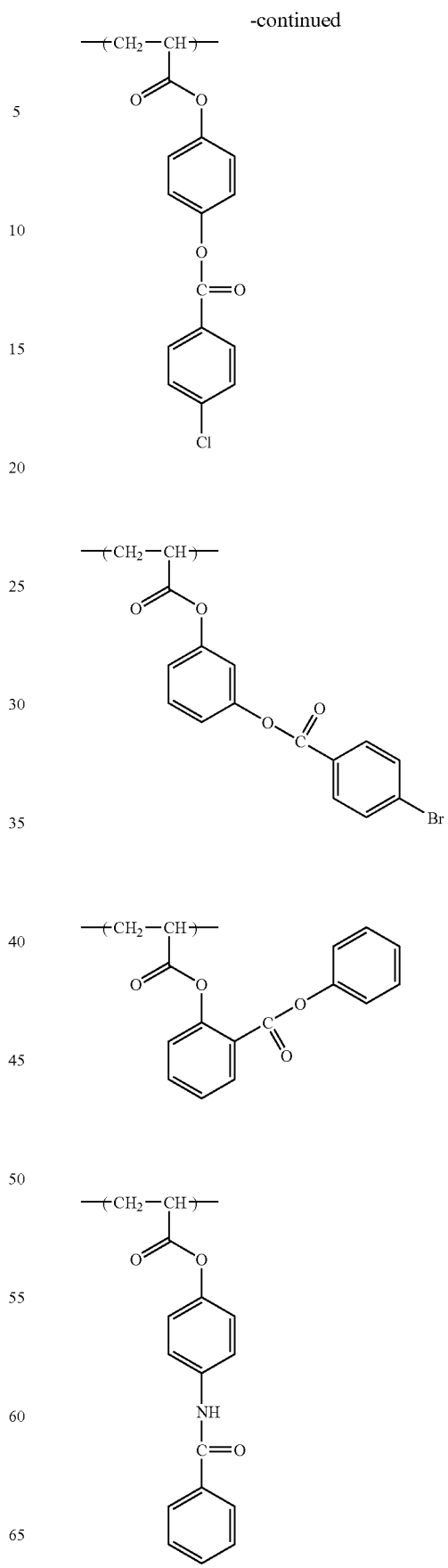

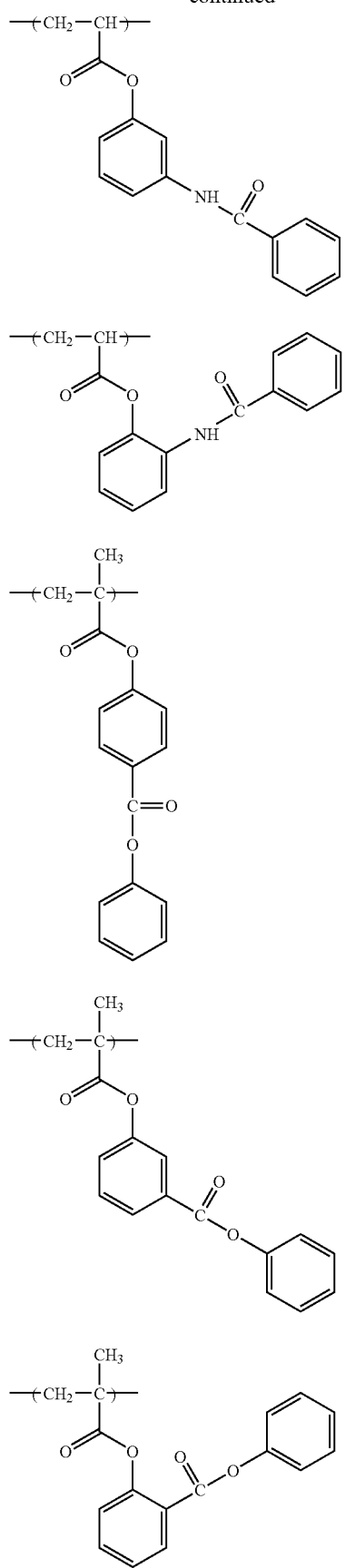

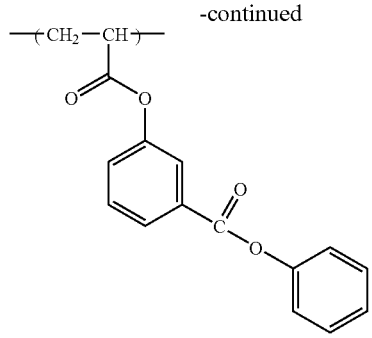
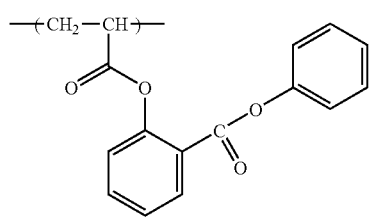
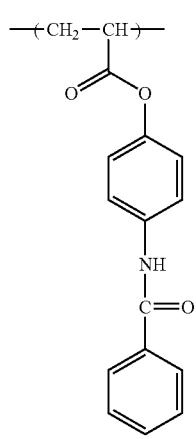
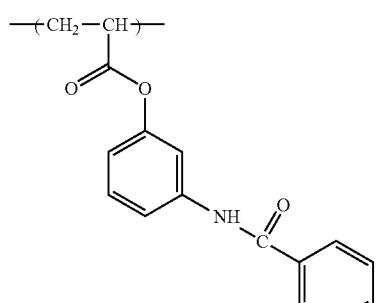
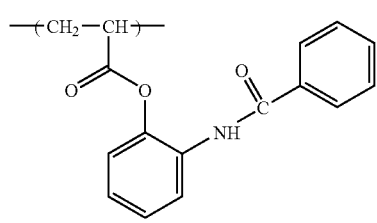
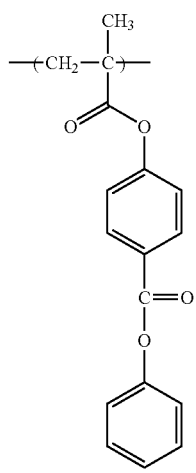
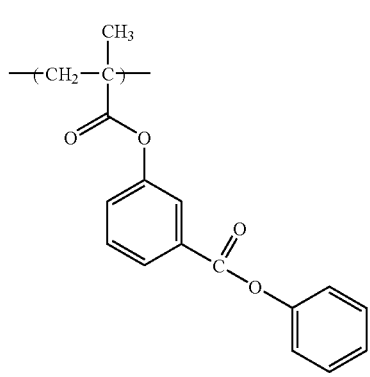
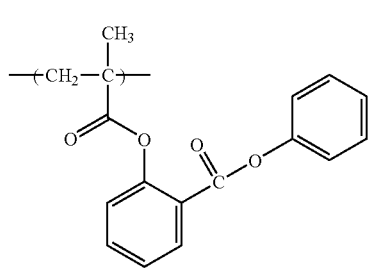
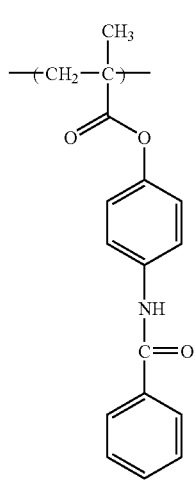

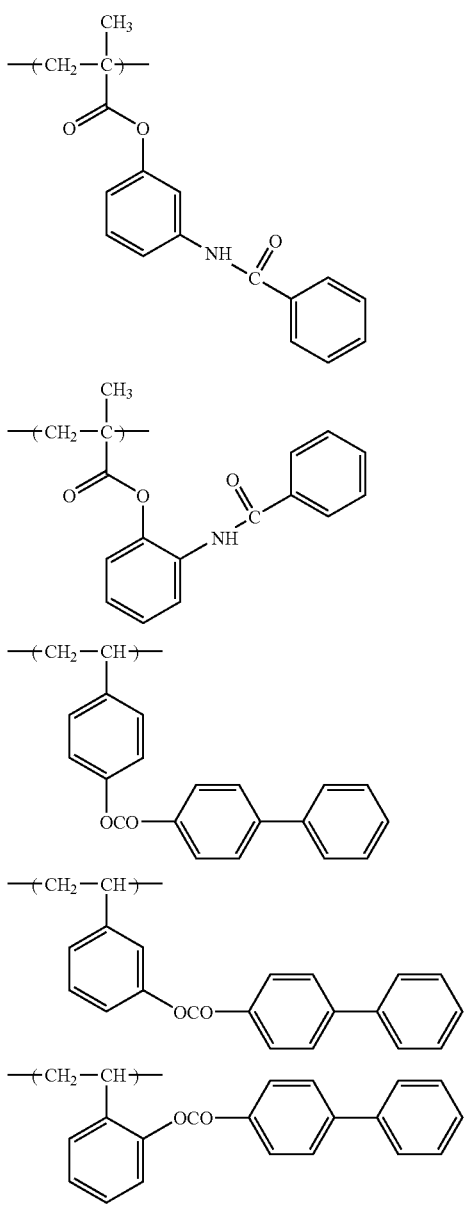

It is also preferred that the resins (B1) and (B2) each further has a repeating unit represented by the following formula (IV):

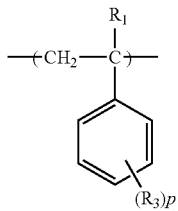

In formula (IV), $R_1$ represents a hydrogen atom, a methyl group, a cyano group, a halogen atom, or a perfluoroalkyl group having a carbon number of 1 to 4.

$R_3$ represents a monovalent organic group incapable of decomposing under the action of an acid, or represents a halogen atom, a cyano group or a nitro group.

p represents an integer of 0 to 5 and when p is an integer of 2 or more, the plurality of $R_3$'s may be the same or different.

In formula (IV), specific examples of the group incapable of decomposing under the action of an acid (sometimes referred to as an acid-stable group) of $R_3$ include an alkyl group, a cycloalkyl group, an aryl group, an alkenyl group, an alkyloxy group, a cycloalkyloxy group, an aryloxy group, an alkenyloxy group, an alkylcarbonyloxy group, a cycloalkylcarbonyloxy group, an arylcarbonyloxy group, an alkylamidomethyloxy group, an alkylamide group, an arylamidomethyl group and an arylamide group. The acid-stable group is preferably an alkyl group, a cycloalkyl group, an aryl group, an alkyloxy group, a cycloalkyloxy group, an aryloxy group, an alkylcarbonyloxy group, a cycloalkylcarbonyloxy group, an arylcarbonyloxy group, an alkylamideoxy group or an alkylamide group, more preferably an alkyl group, a cycloalkyl group, an aryl group, an alkyloxy group, a cycloalkyloxy group, an aryloxy group, an alkylcarbonyloxy group, a cycloalkylcarbonyloxy group or an arylcarbonyloxy group. In the acid-stable group, the alkyl group and the alkyl group in the alkyloxy group, alkylcarbonyloxy group, alkylamidomethyloxy group and alkylamide group are preferably an alkyl group having a carbon number of 1 to 10, and examples thereof include a methyl group, an ethyl group, an n-propyl group, an isopropyl group, an n-butyl group, an isobutyl group, a sec-butyl group, a pentyl group, an isopentyl group, a neopentyl group and a tert-pentyl group. The cycloalkyl group and the cycloalkyl group in the cycloalkyloxy group and cycloalkylcarbonyloxy group are preferably a cycloalkyl group having a carbon number of 3 to 10, such as cyclopropyl group, cyclobutyl group, cyclohexyl group and adamantyl group. The alkenyl group and the alkenyl group in the alkenyloxy group are preferably an alkenyl group having a carbon number of 2 to 4, such as vinyl group, propenyl group, allyl group and butenyl group.

Specific examples of the repeating unit represented by formula (IV) are set forth below, but the present invention is not limited thereto.

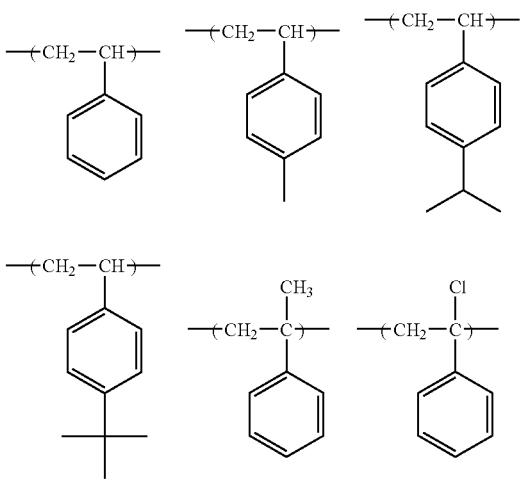

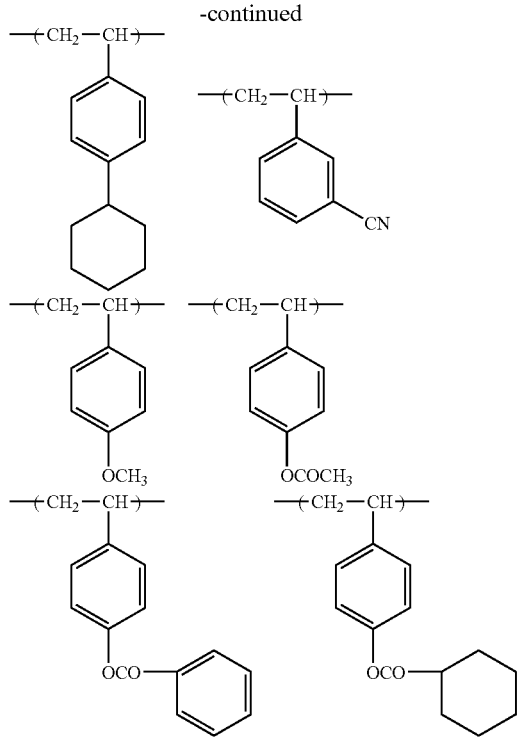

-continued

The resin (B1) may have a repeating unit represented by formula (Ia) and a repeating unit represented by formula (IIa) each in combination of two or more kinds thereof.

The content of the repeating unit represented by formula (Ia) in the resin (B1) is preferably from 40 to 100 mol %, more preferably from 50 to 95 mol %, still more preferably from 60 to 90 mol %, based on all repeating units.

The content of the repeating unit represented by formula (IIa) in the resin (B1) is preferably from 0 to 60 mol %, more preferably from 10 to 50 mol %, still more preferably from 20 to 40 mol %, based on all repeating units.

The content of the repeating unit having an acid-decomposable group represented in the resin (B1) is preferably from 5 to 40 mol %, more preferably from 10 to 35 mol %, still more preferably from 10 to 25 mol %, based on all repeating units.

The resin (B2) may have a repeating unit represented by formula (Ib), a repeating unit represented by formula (IIb) and a repeating unit represented by formula (III) each in combination of two or more kinds thereof.

The content of the repeating unit represented by formula (Ib) in the resin (B2) is preferably from 40 to 90 mol %, more preferably from 50 to 85 mol %, still more preferably from 60 to 80 mol %, based on all repeating units.

The content of the repeating unit represented by formula (IIb) in the resin (B2) is preferably from 0 to 50 mol %, more preferably from 10 to 40 mol %, still more preferably from 15 to 30 mol %, based on all repeating units.

The content of the repeating unit represented by formula (III) in the resin (B2) is preferably from 3 to 40 mol %, more preferably from 5 to 30 mol %, still more preferably from 7 to 20 mol %, based on all repeating units.

The content of the repeating unit having an acid-decomposable group in the resin (B2) is preferably from 5 to 40 mol %, more preferably from 10 to 35 mol %, still more preferably from 15 to 30 mol %, based on all repeating units.

The resins (B1) and (B2) each may further have a repeating unit represented by formula (IV), and this is preferred from the standpoint of enhancing the film quality, reducing the film loss in the unexposed area, or the like. The content of the repeating unit represented by formula (IV) is preferably from 0 to 40 mol %, more preferably from 0 to 30 mol %, still more preferably from 0 to 20 mol %, based on all repeating units in each resin.

In the resins (B1) and (B2), for maintaining good developability with an alkali developer, another appropriate polymerizable monomer may be copolymerized so that an alkali-soluble group such as phenolic hydroxyl group or carboxyl group can be introduced, or for enhancing the film quality, another hydrophobic polymerizable monomer such as alkyl acrylate and alkyl methacrylate may be copolymerized.

The weight average molecular weight (Mw) of the resin (B1) is preferably from 5,000 to 20,000, more preferably from 8,000 to 16,000, and the dispersity (Mw/Mn) is preferably from 1.0 to 1.5, more preferably from 1.0 to 1.3, still more preferably from 1.0 to 1.2.

The weight average molecular weight (Mw) of the resin (B2) is preferably from 3,000 to 15,000, more preferably from 5,000 to 15,000, and the dispersity (Mw/Mn) is preferably from 1.0 to 1.5, more preferably from 1.0 to 1.3, still more preferably from 1.0 to 1.2.

The weight average molecular weight as used herein is defined as a polystyrene-reduced value determined by gel permeation chromatography.

The resins (B1) and (B2) for use in the present invention may be polymerized by using any method of radical polymerization, anionic polymerization or cationic polymerization, but from the standpoint of controlling the copolymerization reaction, a radical polymerization method is preferred. Furthermore, from the standpoint of controlling the weight average molecular weight and molecular weight distribution, a living radical polymerization method is more preferred. Specific examples thereof include a method of using a compound selected from a nitroxide compound, an atom-transfer polymerization system and a RAFT agent, and a radical polymerization initiator (azo-based or peroxide-based) in combination. The acid-decomposable protective group may be introduced by either a method of copolymerizing a monomer having an acid-decomposable protective group, or a method of introducing a protective group into a resin having an alkali-soluble hydroxyl group such as phenolic hydroxyl group or a carboxyl group, but in the case of having a repeating unit represented by formula (IIa) or a repeating unit represented by formula (IIb), a method of copolymerizing a monomer having an acid-decomposable protective group is preferred.

The resins (B1) and (B2) each may be used in combination of two or more kinds thereof.

The amount of the resins (B1) and (B2) added is, as the total amount, usually from 10 to 96 mass %, preferably from 15 to 96 mass %, more preferably from 20 to 95 mass %, based on the entire solid content of the positive resist composition. (In this specification, mass ratio is equal to weight ratio.)

The resin (B1)/resin (B2) ratio (by mass) varies depending on the 248 nm absorbance of the repeating unit represented by formula (III) in the resin (B2), but generally, the ratio is preferably from 95/5 to 60/40.

Specific examples of the resin (B1) are set forth below, but the present invention is not limited thereto.

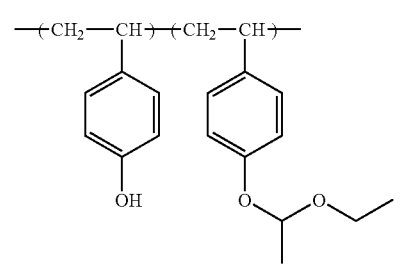
(A-1)
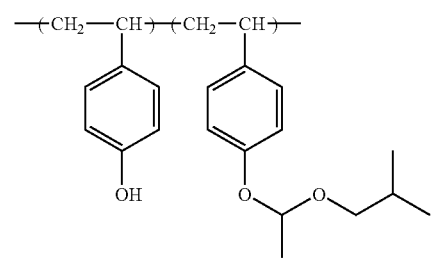
(A-2)
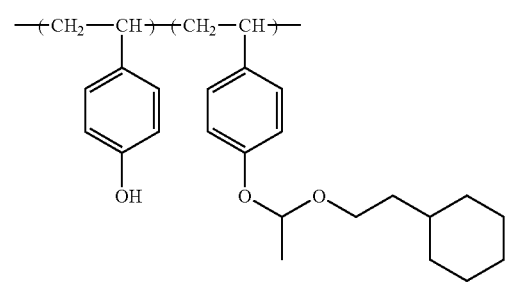
(A-3)
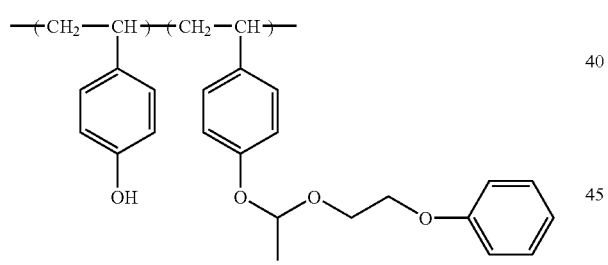
(A-4)
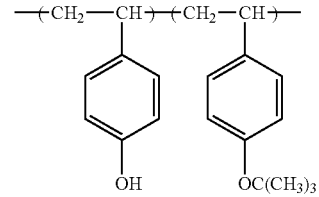
(A-5)
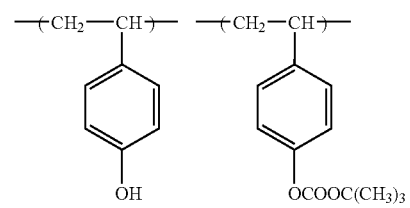
(A-6)
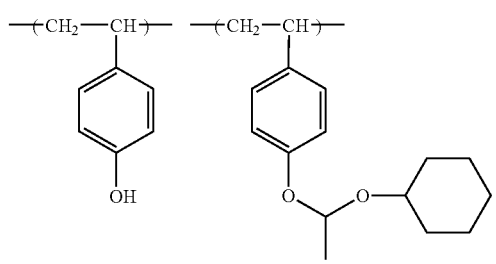
(A-7)
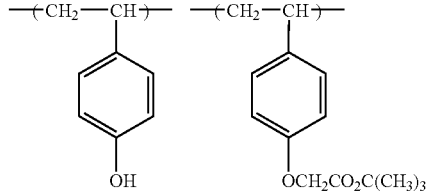
(A-8)
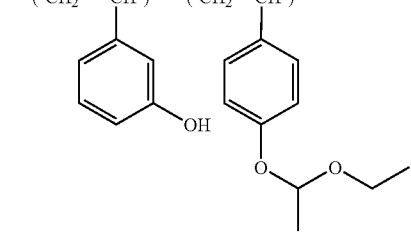
(A-9)
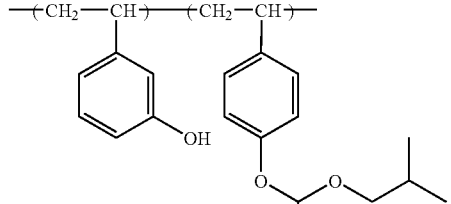
(A-10)
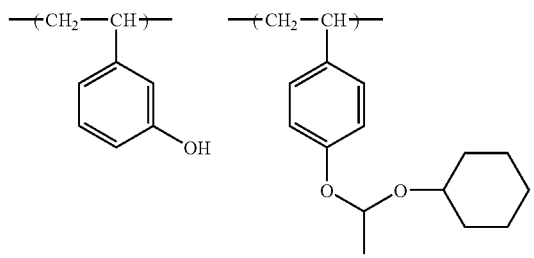
(A-11)
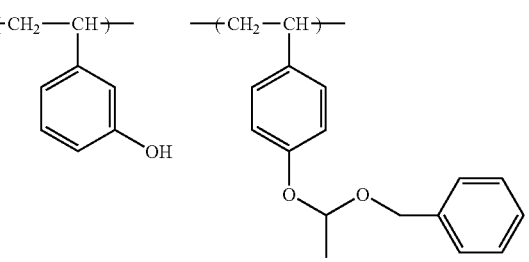
(A-12)

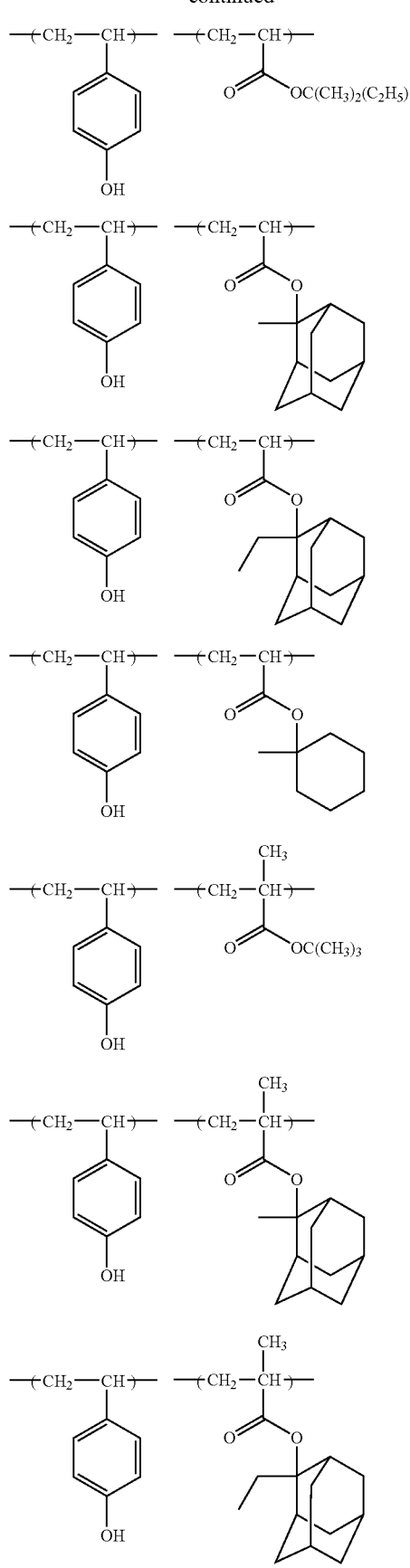
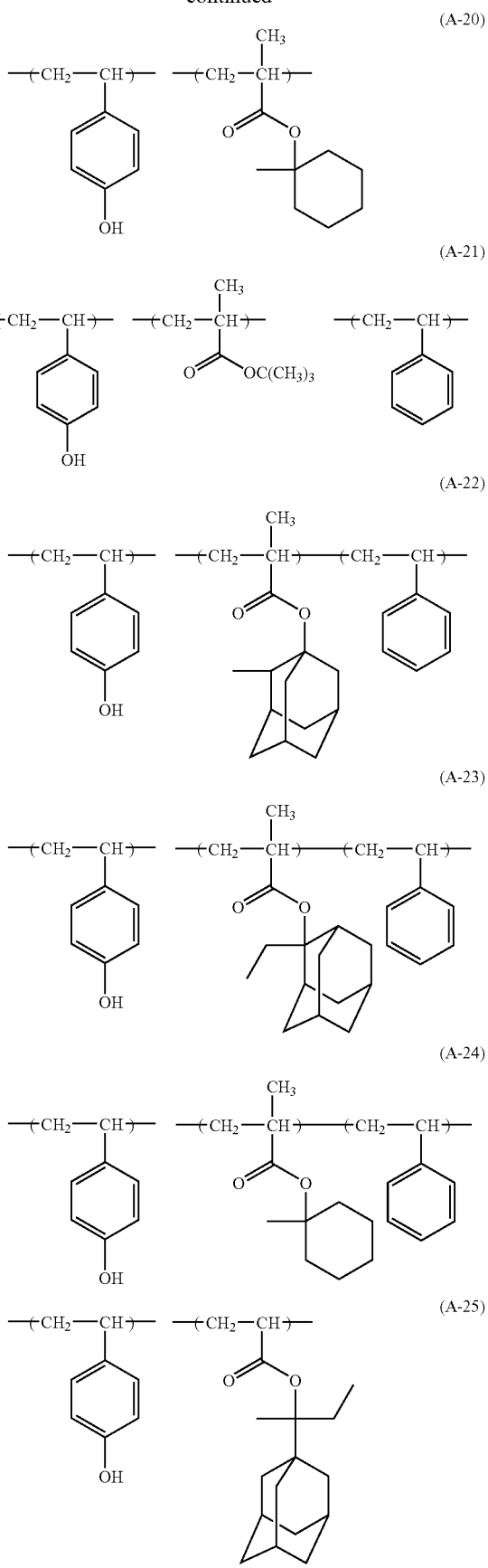

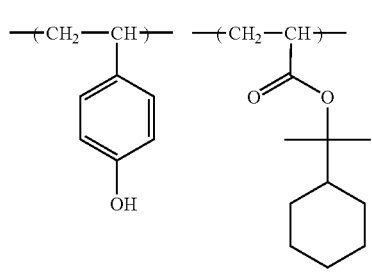 (A-26)
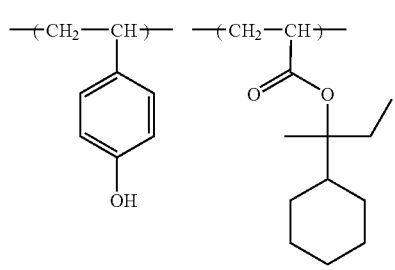 (A-27)
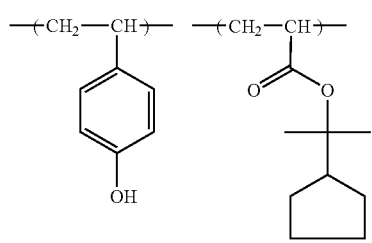 (A-28)
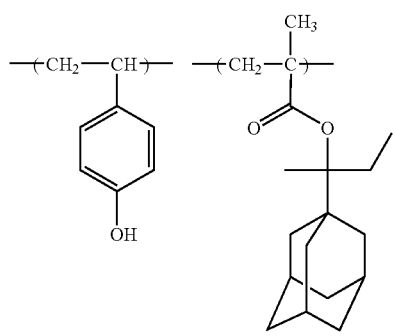 (A-29)
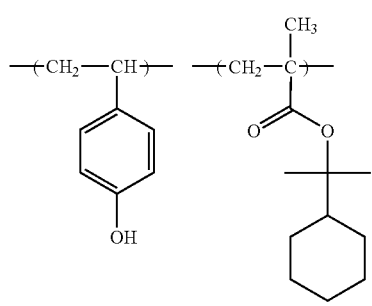 (A-30)
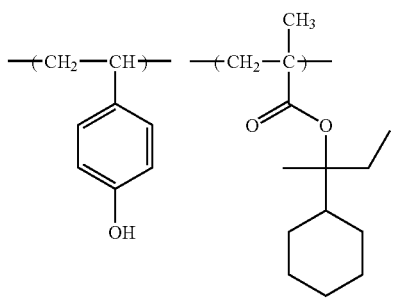 (A-31)
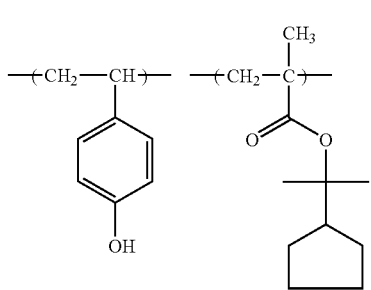 (A-32)
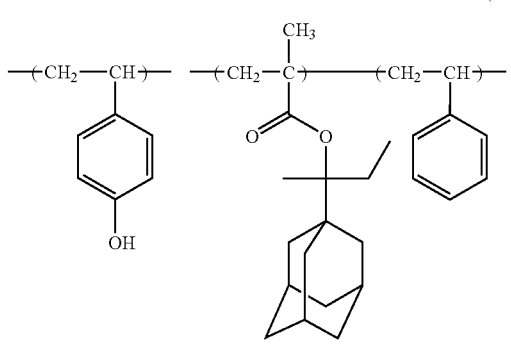 (A-33)
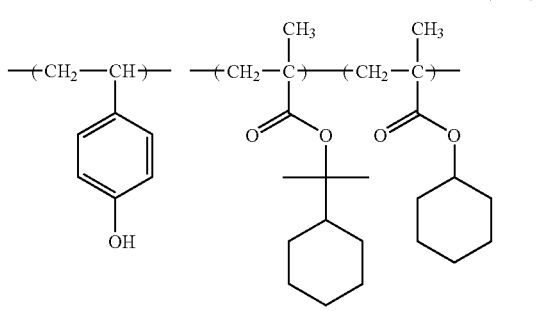 (A-34)
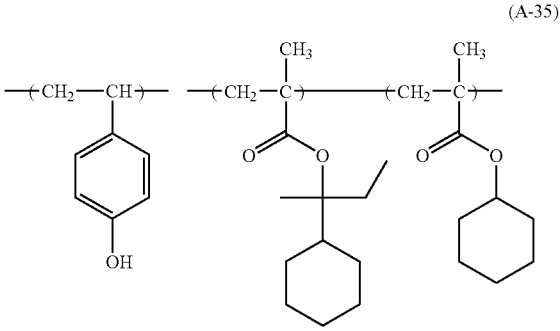 (A-35)

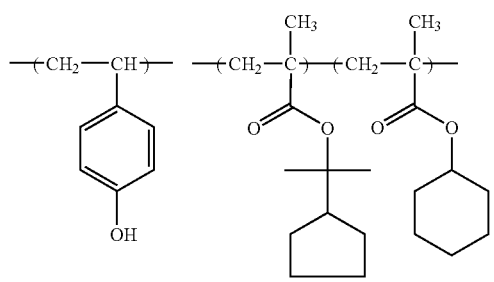
(A-36)
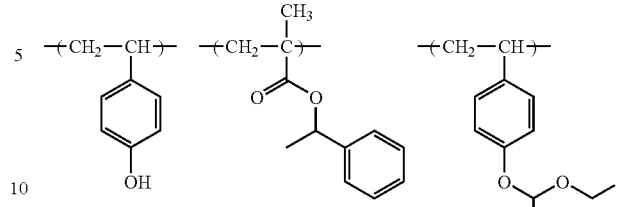
(A-38)
(A-39)
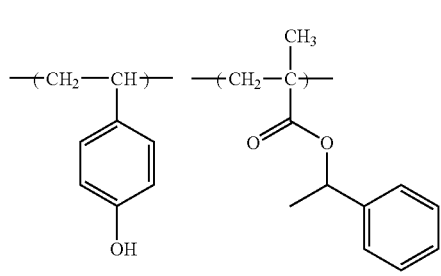
(A-37)
Specific examples of the resin (B2) are set forth below, but the present invention is not limited thereto.
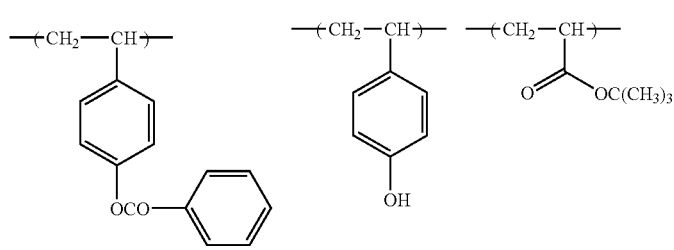
(B-1)
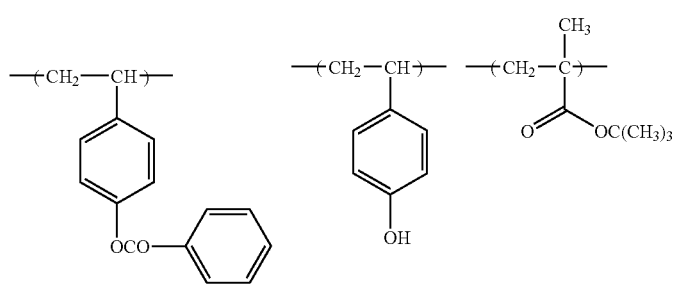
(B-2)
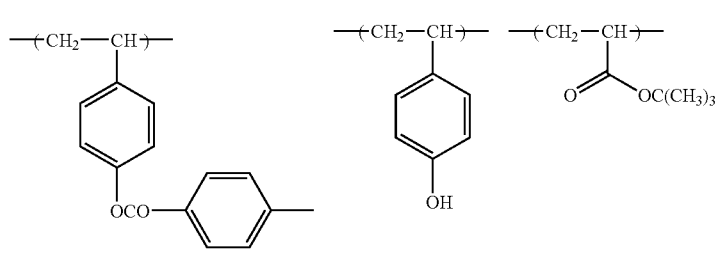
(B-3)

-continued
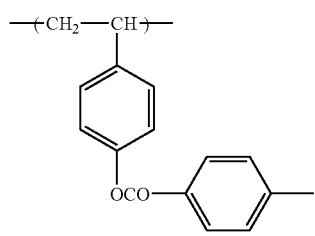 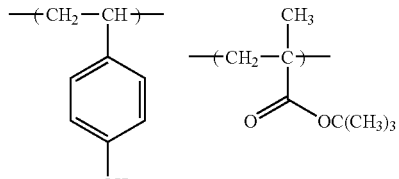 (B-4)
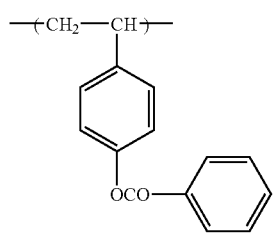 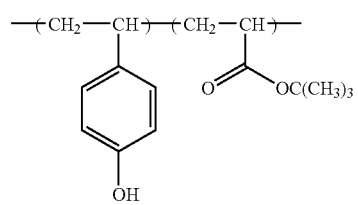 (B-5)
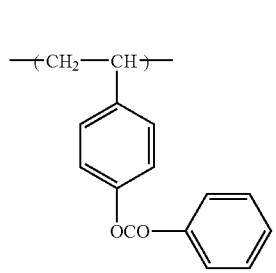 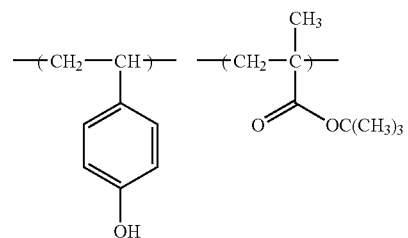 (B-6)
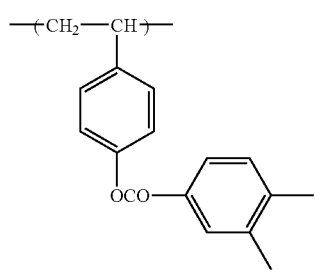 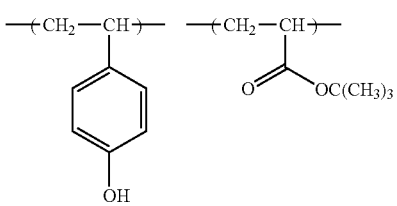 (B-7)
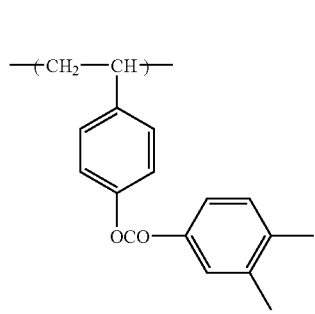 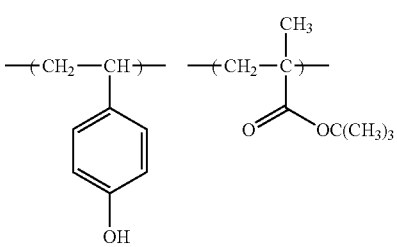 (B-8)
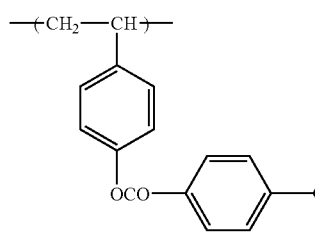 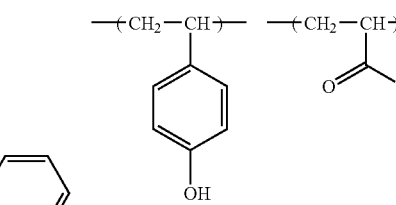 (B-9)

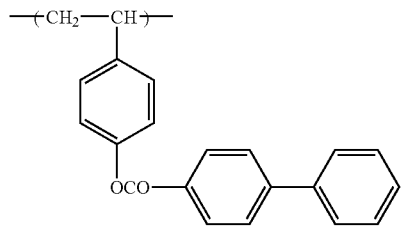 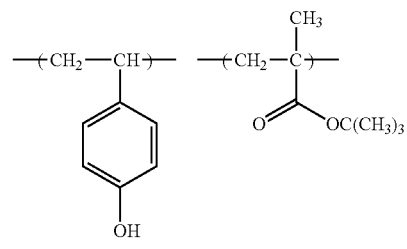
(B-10)
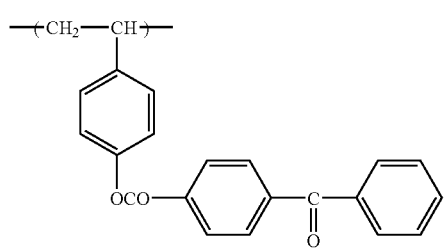 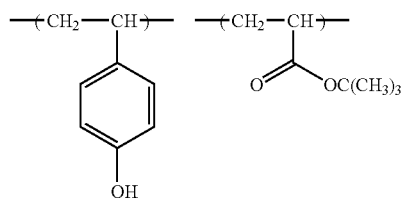
(B-11)
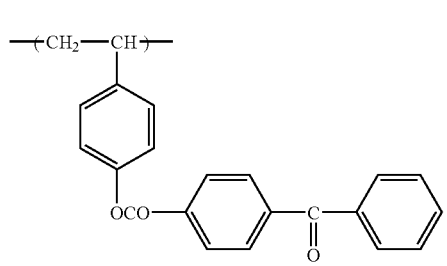
(B-12)
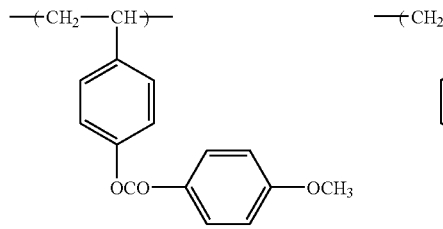
(B-13)
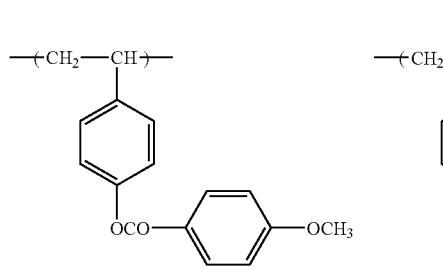
(B-14)
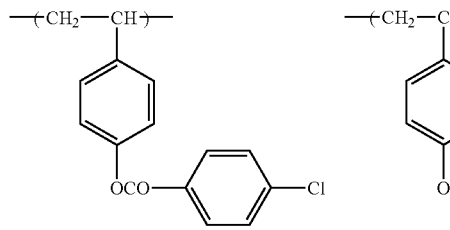
(B-15)

-continued
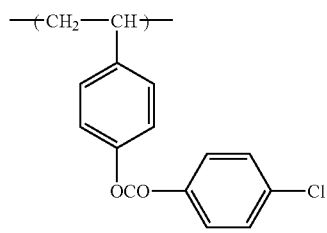 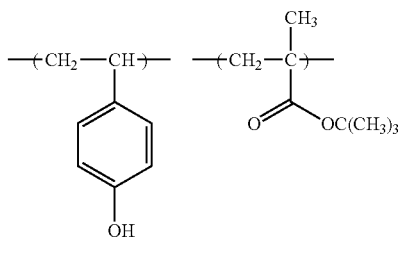
(B-16)
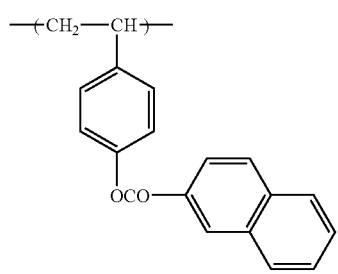 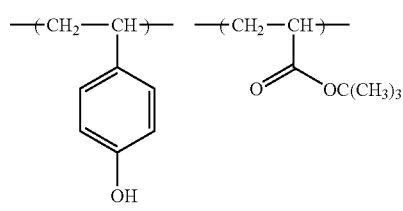
(B-17)
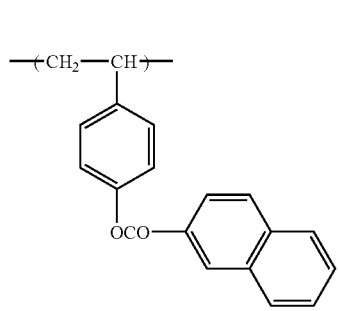 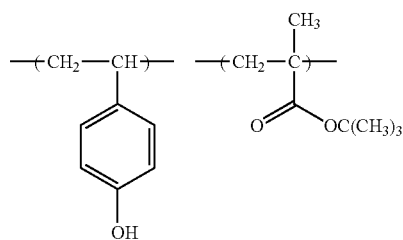
(B-18)
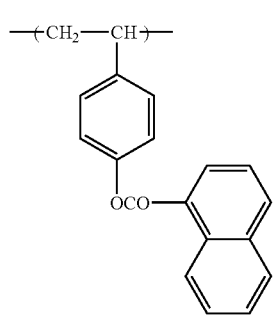 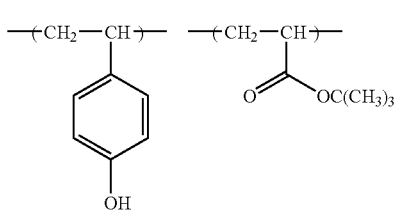
(B-19)
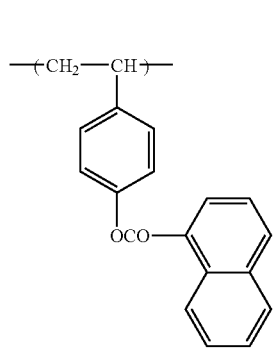 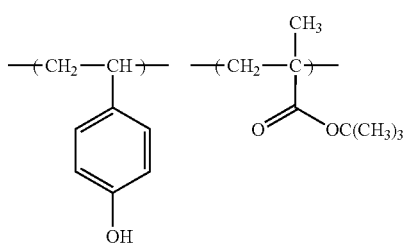
(B-20)

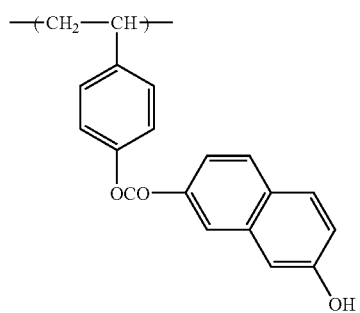 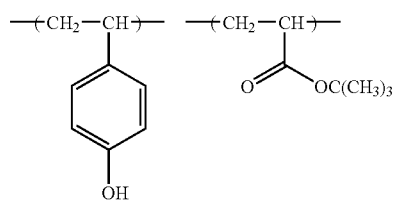
(B-21)
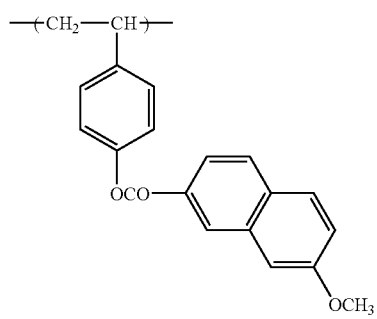 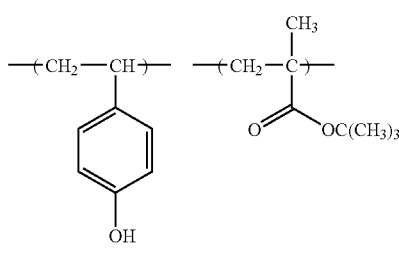
(B-22)
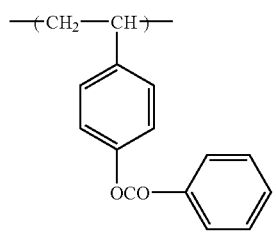 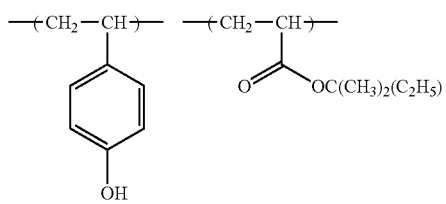
(B-23)
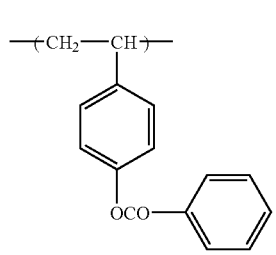 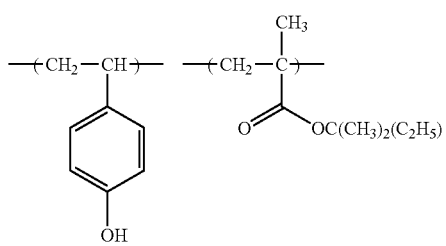
(B-24)
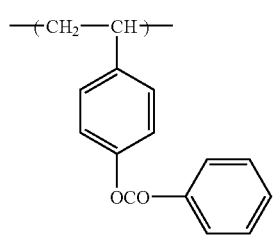 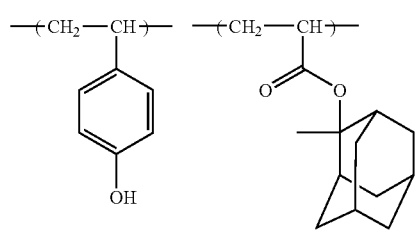 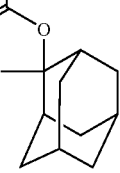
(B-25)

-continued
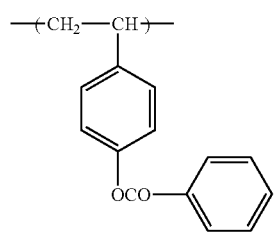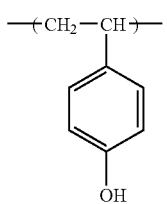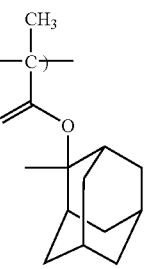 (B-26)
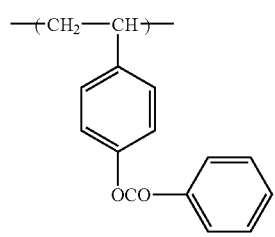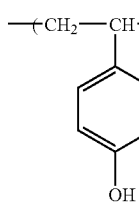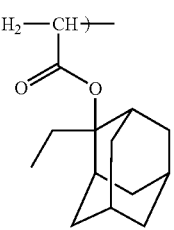 (B-27)
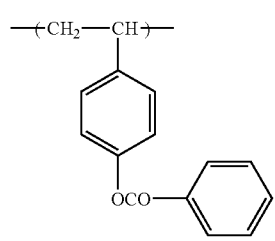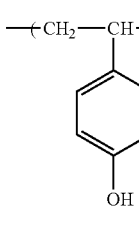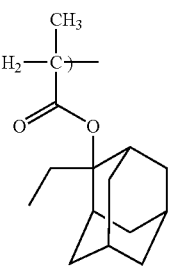 (B-28)
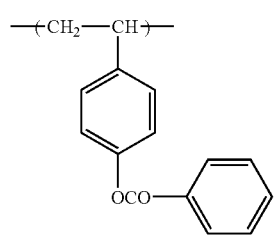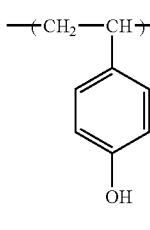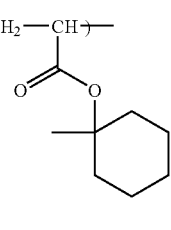 (B-29)
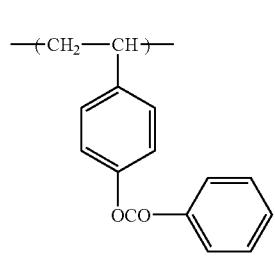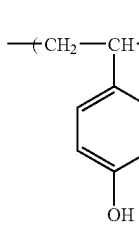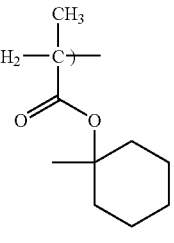 (B-30)
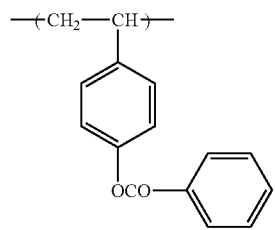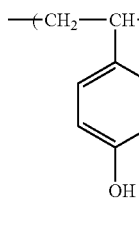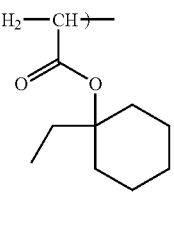 (B-31)

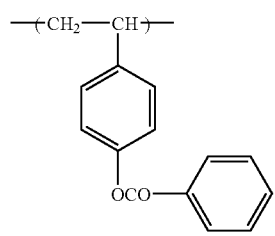 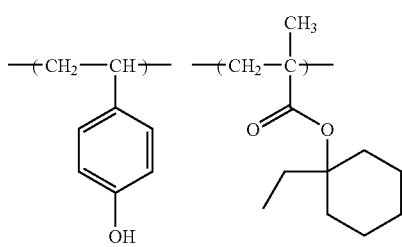 (B-32)
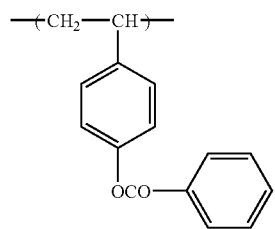 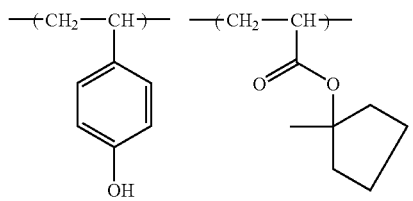 (B-33)
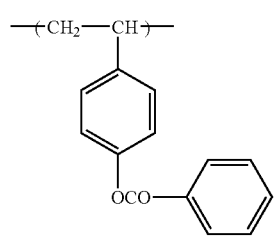 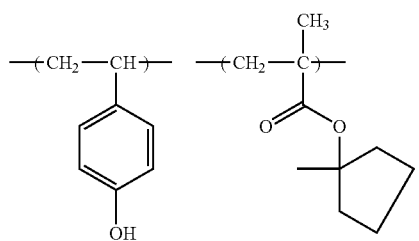 (B-34)
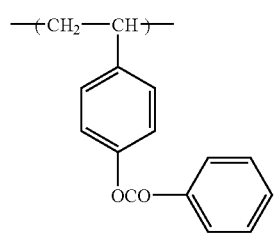 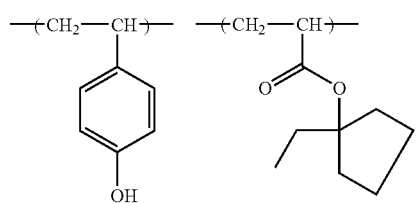 (B-35)
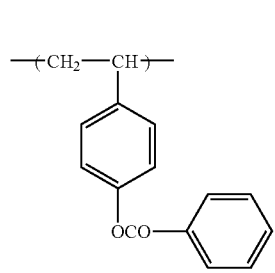 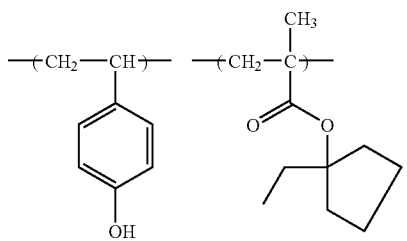 (B-36)
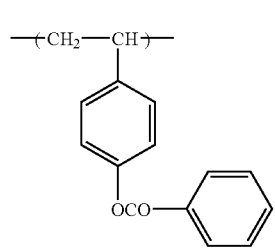 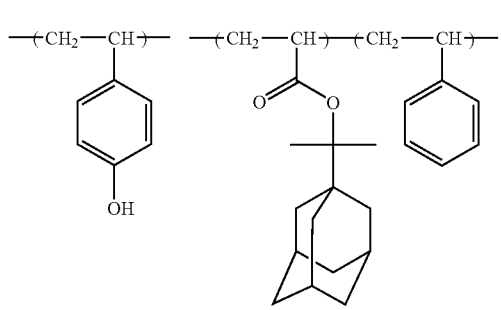 (B-37)

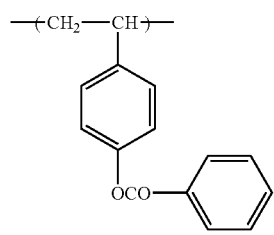 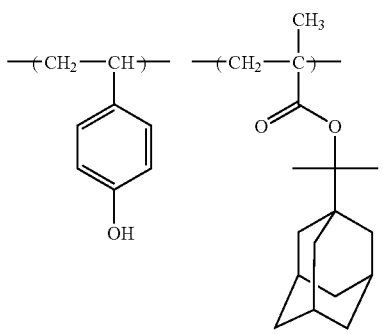 (B-38)
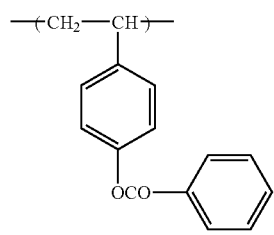 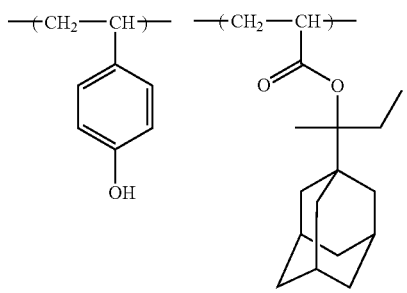 (B-39)
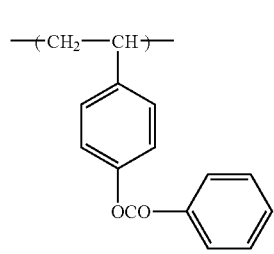 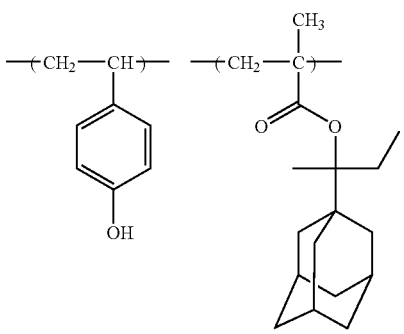 (B-40)
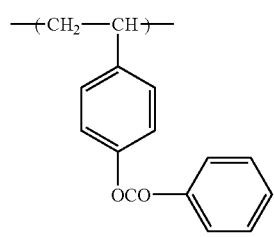 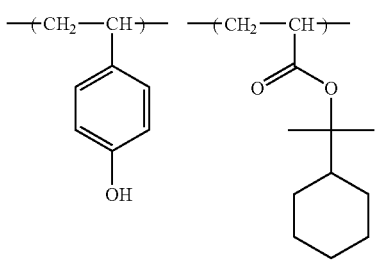 (B-41)
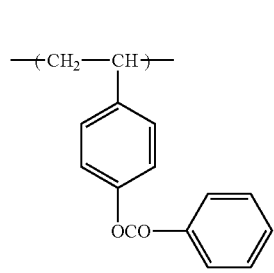 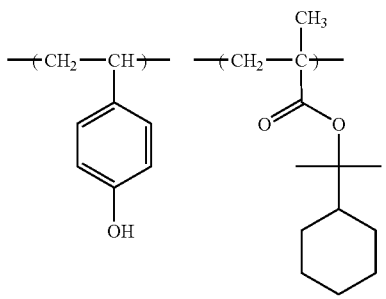 (B-42)

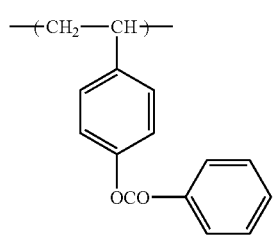 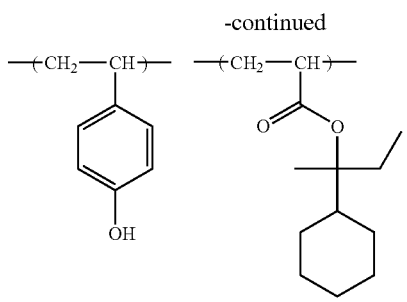 (B-43)
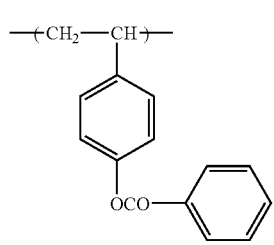 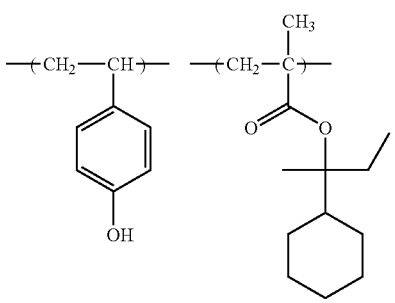 (B-44)
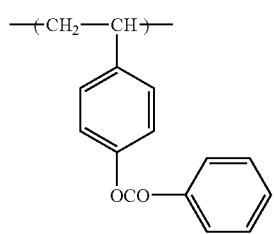 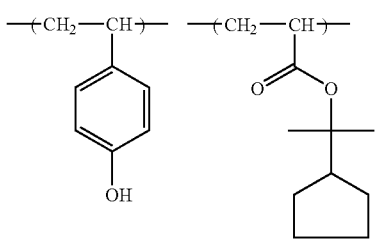 (B-45)
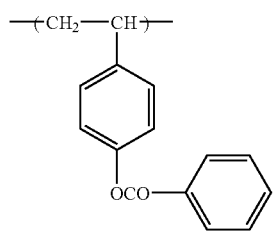 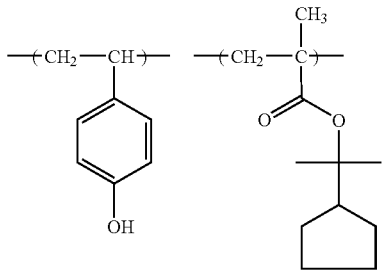 (B-46)
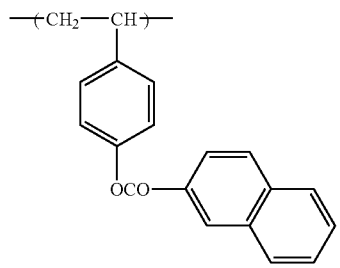 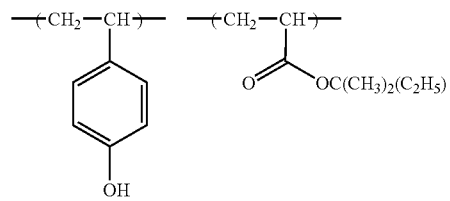 (B-47)
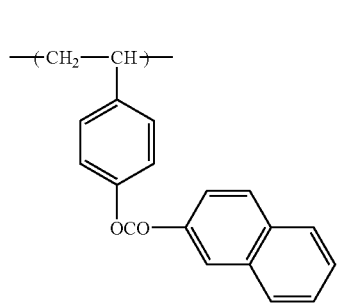 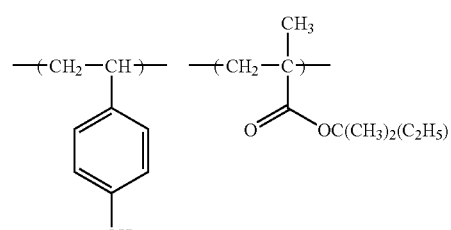 (B-48)

-continued
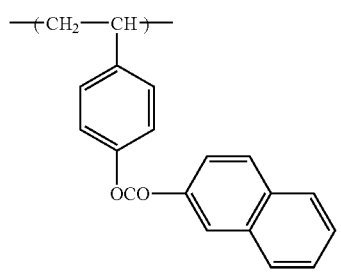 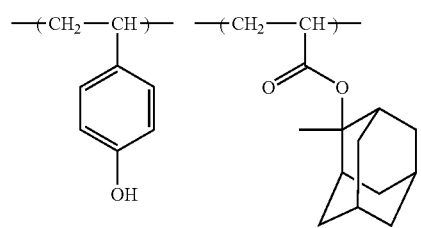
(B-49)
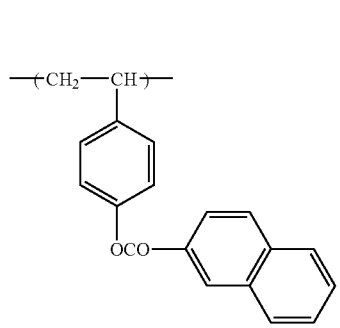 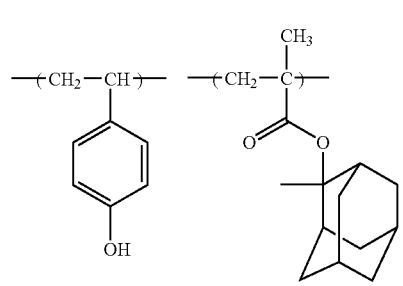
(B-50)
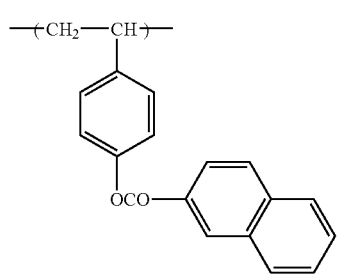 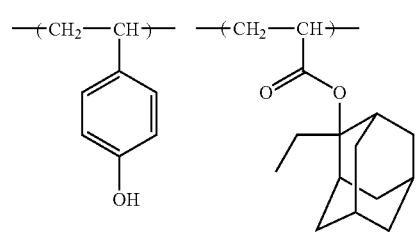
(B-51)
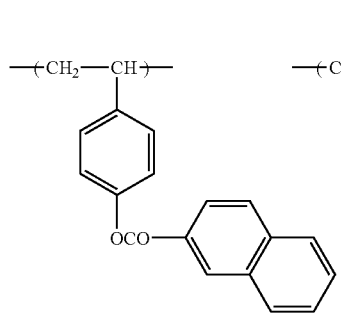 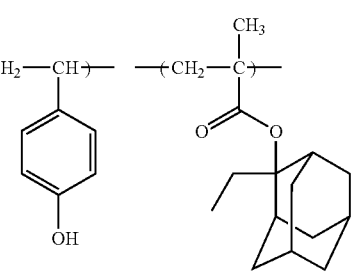
(B-52)
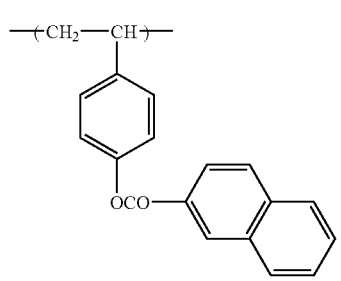 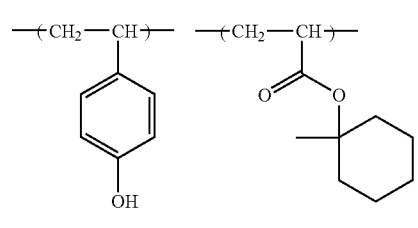
(B-53)

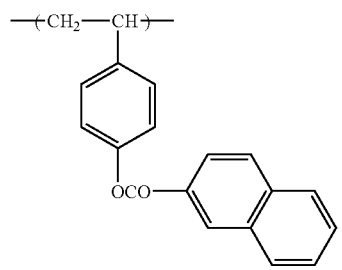 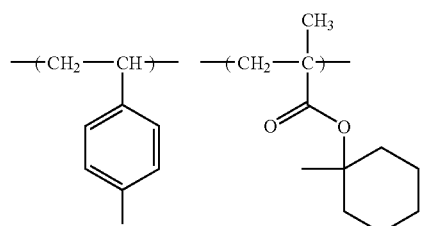 (B-54)
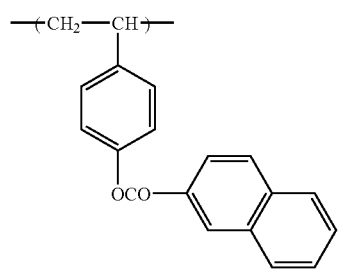 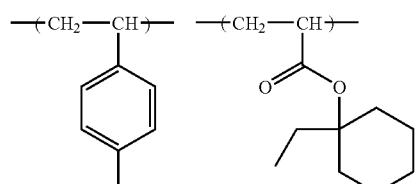 (B-55)
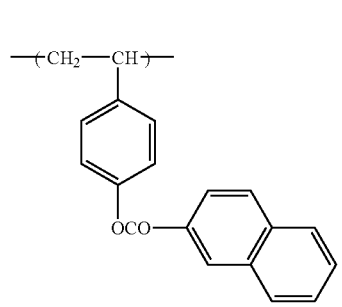 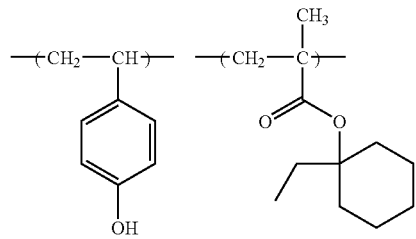 (B-56)
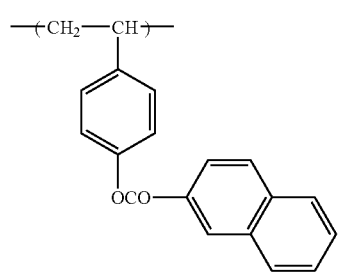 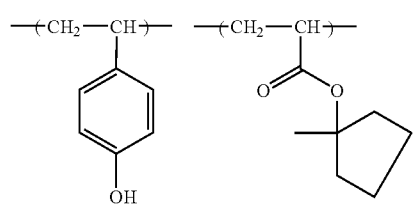 (B-57)
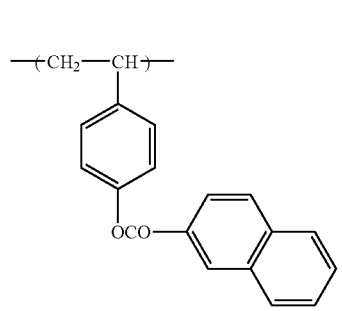 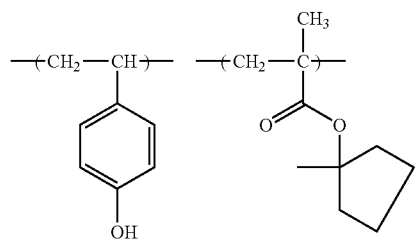 (B-58)

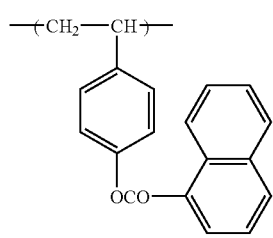 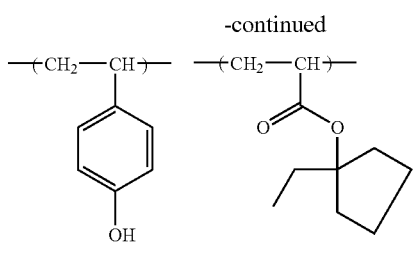 (B-59)
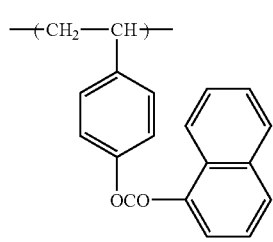 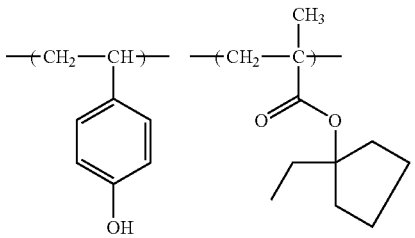 (B-60)
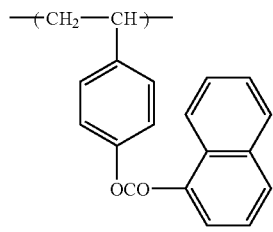 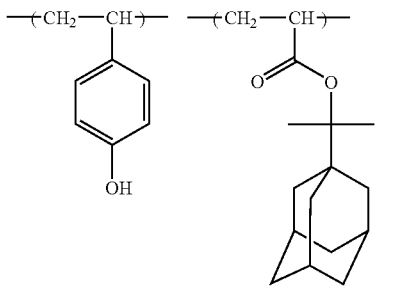 (B-61)
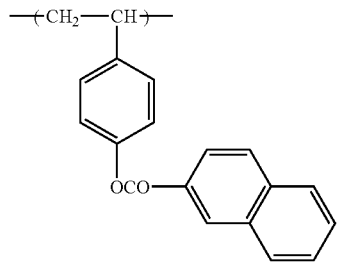 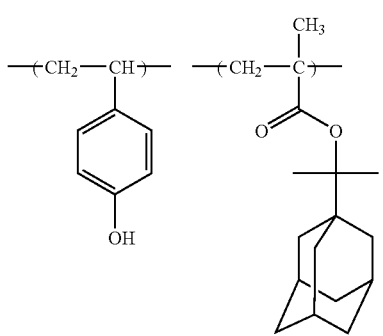 (B-62)
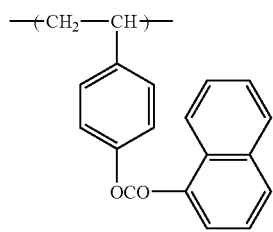 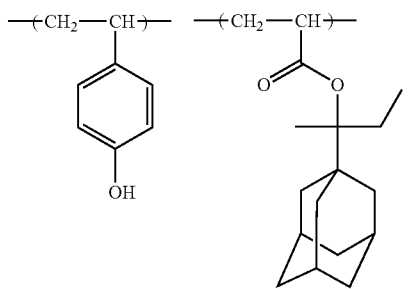 (B-63)

-continued
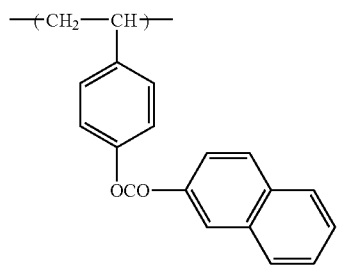 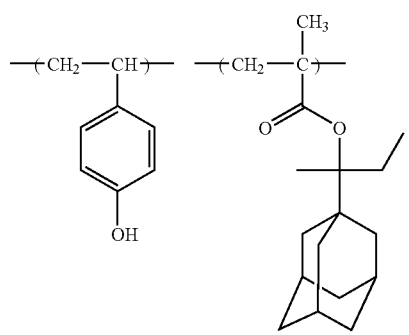
(B-64)
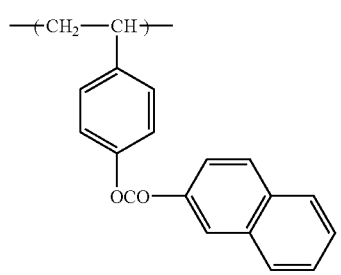 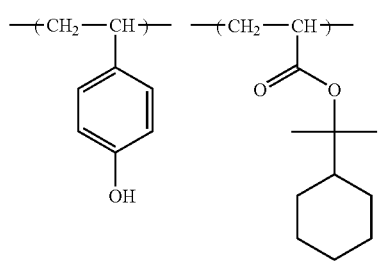
(B-65)
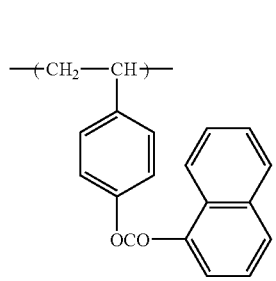 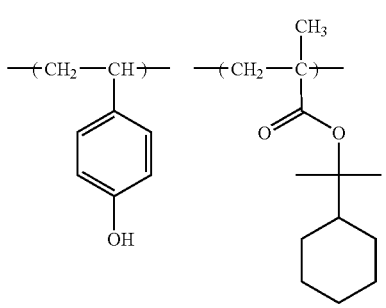
(B-66)
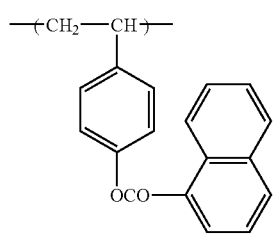 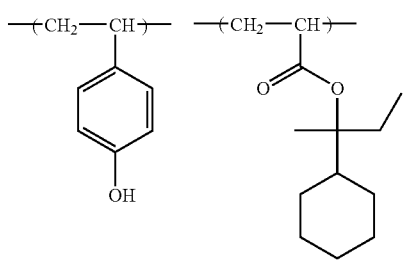
(B-67)
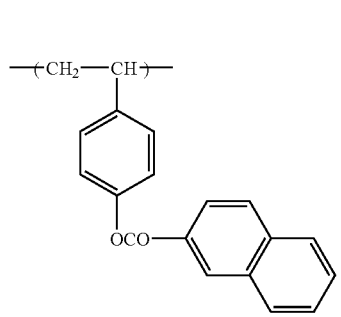 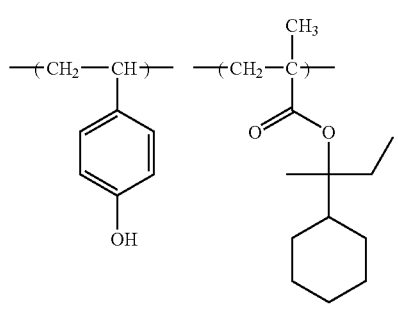
(B-68)

-continued
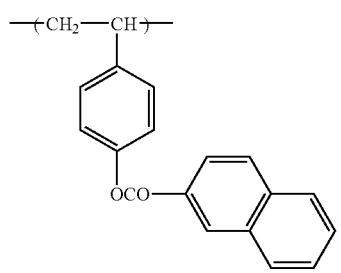 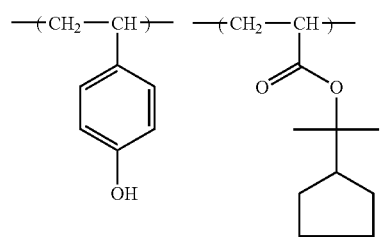 (B-69)
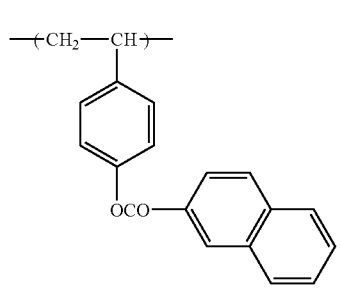 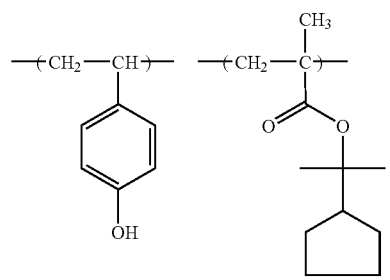 (B-70)
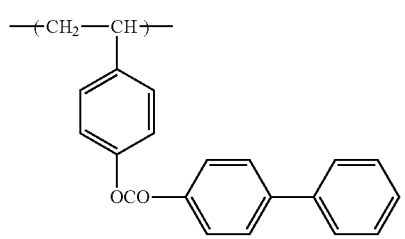 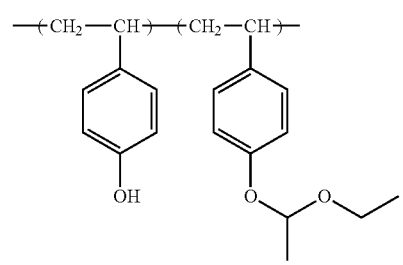 (B-71)
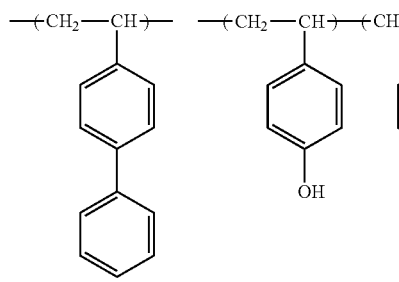  (B-72)
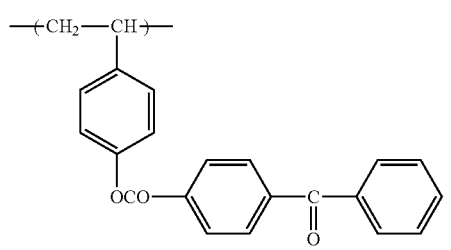 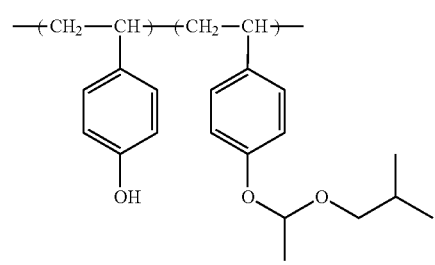 (B-73)
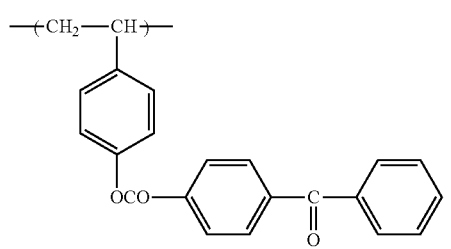 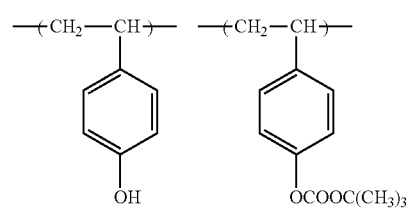 (B-74)

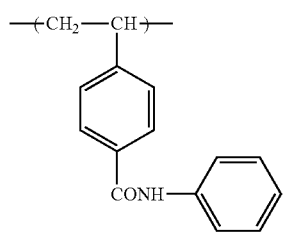 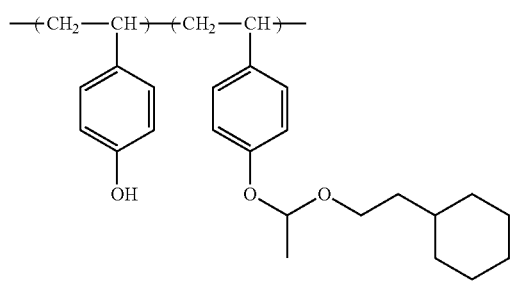 (B-75)
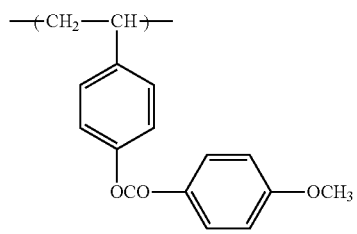 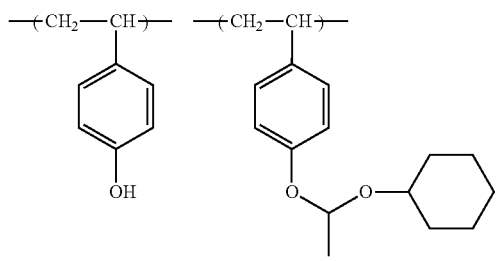 (B-76)
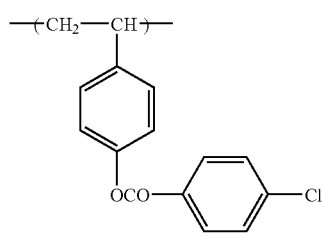 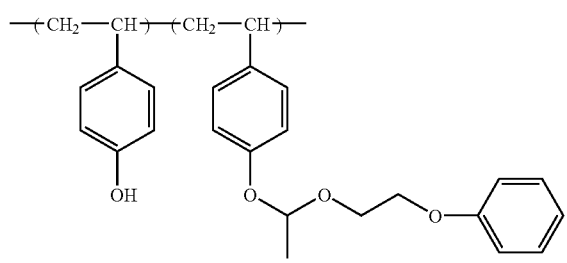 (B-77)
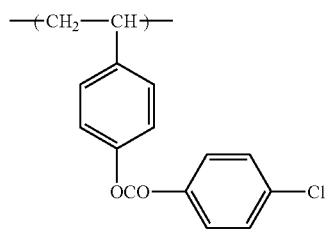 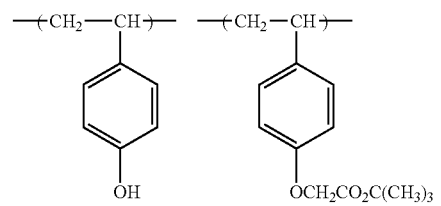 (B-78)
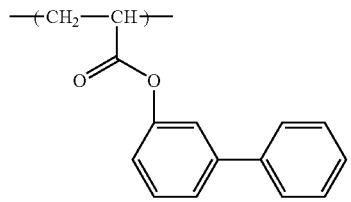 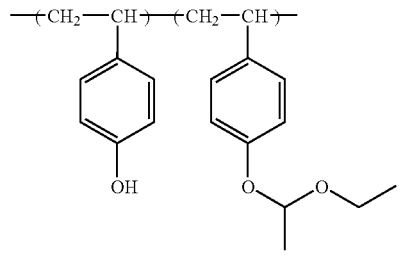 (B-79)
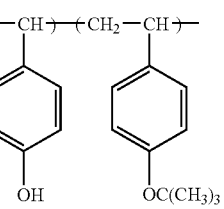
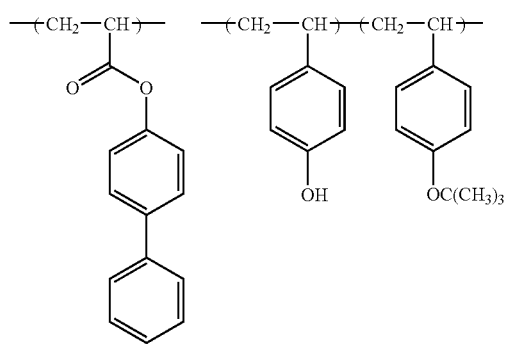 (B-80)

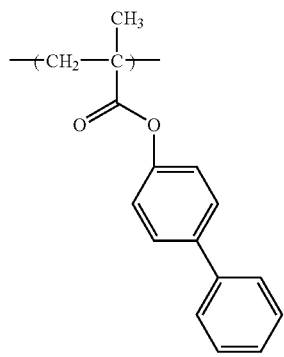
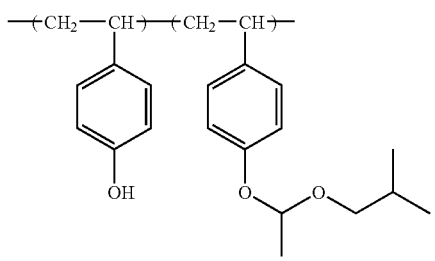
(B-81)
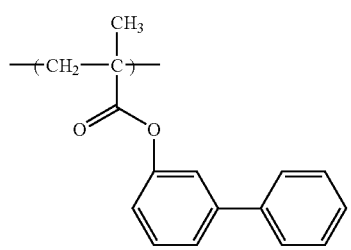
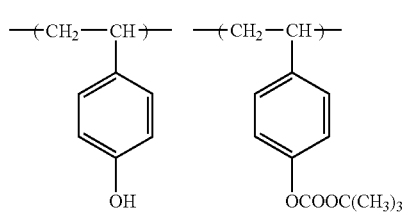
(B-82)
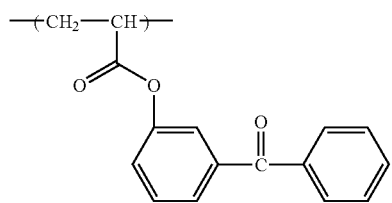
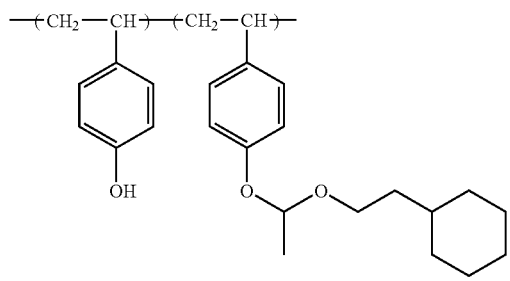
(B-83)
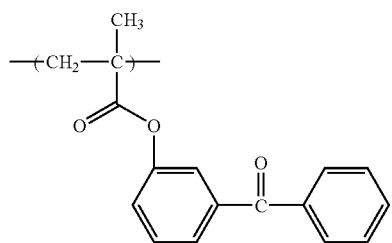
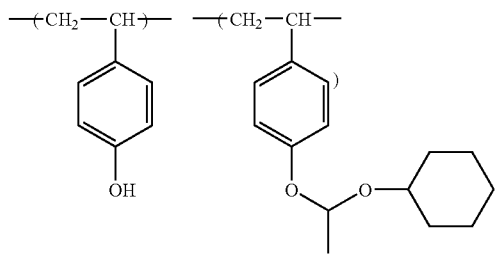
(B-84)
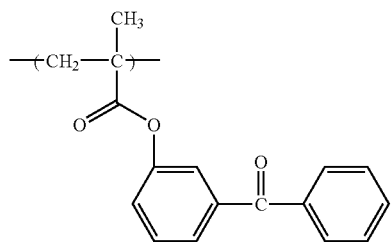
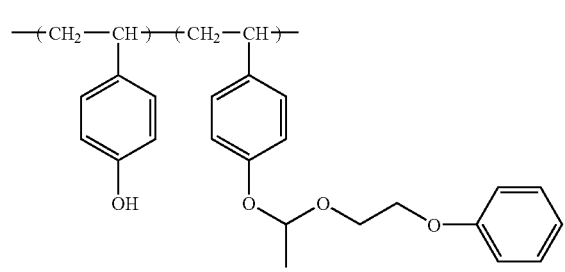
(B-85)

-continued

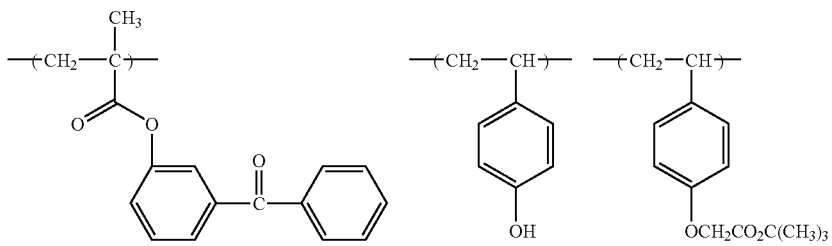
(B-86)

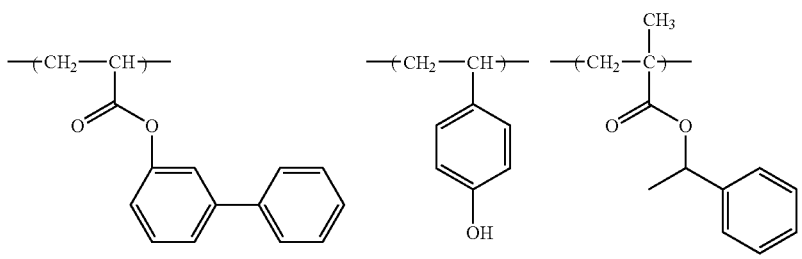
(B-87)

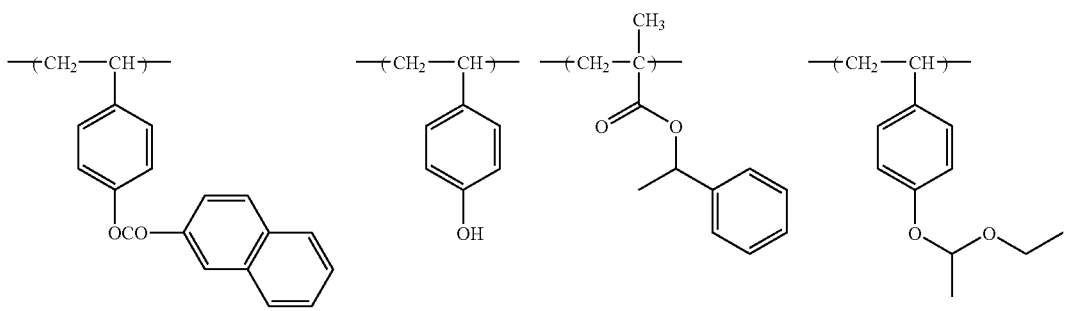
(B-88)

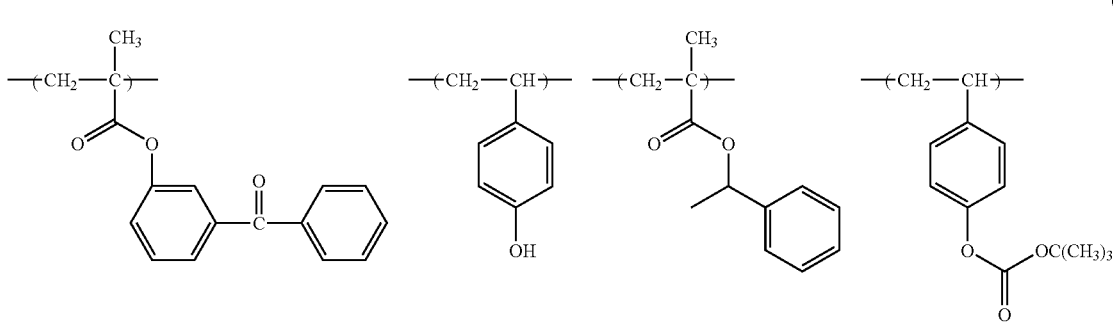
(B-89)

(A) Compound Capable of Generating an Acid Upon Irradiation with Actinic Rays or Radiation The positive resist composition of the present invention comprises a compound capable of generating an acid upon irradiation with actinic rays or radiation (hereinafter sometimes referred to as an "acid generator").

The acid generator which can be used may be appropriately selected from a photoinitiator for photocationic polymerization, a photoinitiator for photoradical polymerization, a photo-decoloring agent for coloring matters, a photo-discoloring agent, a compound known to generate an acid upon irradiation with actinic rays or radiation and used for microresist or the like, and a mixture thereof.

Examples thereof include a diazonium salt, a phosphonium salt, a sulfonium salt, an iodonium salt, an imidosulfonate, an oxime sulfonate, a diazodisulfone, a disulfone and an o-nitrobenzyl sulfonate.

Also, a compound where such a group or compound capable of generating an acid upon irradiation with actinic rays or radiation is introduced into the main or side chain of the polymer, for example, compounds described in U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029, may be used.

Furthermore, compounds capable of generating an acid by the effect of light described, for example, in U.S. Pat. No. 3,779,778 and European Patent 126,712 may also be used.

Out of the compounds capable of generating an acid upon irradiation with actinic rays or radiation, the compounds represented by the following formulae (ZI), (ZII) and (ZIII) are preferred.

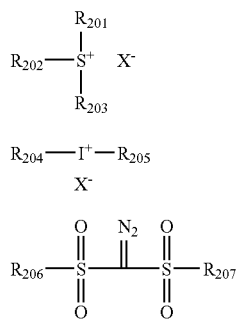

In formula (ZI), $R_{201}$, $R_{202}$ and $R_{203}$ each independently represents an organic group.

$X^-$ represents a non-nucleophilic anion, and preferred examples thereof include sulfonate anion, carboxylate anion, bis(alkylsulfonyl)amide anion, tris(alkylsulfonyl)methide anion, $BF_4^-$, $PF_6^-$ and $SbF_6^-$. The anion is preferably an organic anion containing a carbon atom.

The preferred organic anion includes organic anions represented by the following formulae (AN1) to (AN4):

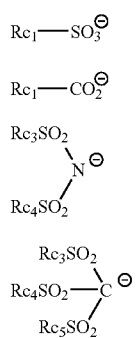

In formulae (AN1) and (AN2), $Rc_1$ represents an organic group.

The organic group in $Rc_1$ includes an organic group having a carbon number of 1 to 30 and is preferably an alkyl, cycloalkyl or aryl group which may be substituted, or a group where a plurality of such groups are connected through a single bond or a linking group such as —O—, —$CO_2$—, —S—, —$SO_3$— and —$SO_2N(Rd_1)$—. $Rd_1$ represents a hydrogen atom or an alkyl group and may form a ring structure together with the alkyl, cycloalkyl or aryl group to which $Rd_1$ is bonded.

The organic group of $Rc_1$ is more preferably an alkyl group substituted by a fluorine atom or a fluoroalkyl group at the 1-position, or a phenyl group substituted by a fluorine atom or a fluoroalkyl group. By virtue of having a fluorine atom or a fluoroalkyl group, the acidity of the acid generated upon irradiation with light increases and the sensitivity is enhanced. When $Rc_1$ has 5 or more carbon atoms, at least one carbon atom is preferably such that a hydrogen atom remains without replacing all hydrogen atoms by a fluorine atom, and more preferably such that the number of hydrogen atoms is larger than the number of fluorine atoms. The absence of a perfluoroalkyl group having a carbon number of 5 or more enables reduction in the toxicity to ecology.

The still more preferred embodiment of $Rc_1$ is a group represented by the following formula.

$Rc_7\text{-}Ax\text{-}Rc_6\text{-}$

In the formula, $Rc_6$ represents a perfluoroalkylene group having a carbon number of 4 or less, preferably from 2 to 4, more preferably 2 or 3, or a phenylene group substituted by from 1 to 4 fluorine atoms and/or from 1 to 3 fluoroalkyl groups.

Ax represents a single bond or a divalent linking group (preferably —O—, —$CO_2$—, —S—, —$SO_3$— or —$SO_2N(Rd_1)$-). $Rd_1$ represents a hydrogen atom or an alkyl group and may combine with $Rc_7$ to form a ring structure.

$Rc_7$ represents a hydrogen atom, a fluorine atom, a linear or branched alkyl group which may be substituted, a monocyclic or polycyclic cycloalkyl group which may be substituted, or an aryl group which may be substituted. The alkyl group, cycloalkyl group and aryl group, which each may be substituted, preferably contain no fluorine atom as the substituent.

In formulae (AN3) and (AN4), $Rc_3$, $Rc_4$ and $Rc_5$ each independently represents an organic group.

The preferred organic groups for $Rc_3$, $Rc_4$ and $Rc_5$ are the same as the preferred organic groups in $Rc_1$.

$Rc_3$ and $Rc_4$ may combine to form a ring.

The group formed by combining $Rc_3$ and $Rc_4$ includes an alkylene group and an arylene group and is preferably a perfluoroalkylene group having a carbon number of 2 to 4. When $Rc_3$ and $Rc_4$ combine to form a ring, the acidity of the acid generated upon irradiation with light increases and this is preferred because the sensitivity is enhanced.

The carbon number of the organic group as $R_{201}$, $R_{202}$ and $R_{203}$ is generally from 1 to 30, preferably from 1 to 20.

Two members out of $R_{201}$ to $R_{203}$ may combine to form a ring structure, and the ring may contain an oxygen atom, a sulfur atom, an ester bond, an amide bond or a carbonyl group.

Examples of the group formed by combining two members out of $R_{201}$ to $R_{203}$ include an alkylene group (e.g., butylene, pentylene).

Specific examples of the organic group as $R_{201}$, $R_{202}$ and $R_{203}$ include corresponding groups in the compounds (ZI-1), (ZI-2) and (ZI-3) which are described later.

The compound may be a compound having a plurality of structures represented by formula (ZI). For example, the compound may be a compound having a structure that at least one of $R_{201}$ to $R_{203}$ in the compound represented by formula (ZI) is bonded to at least one of $R_{201}$ to $R_{203}$ in another compound represented by formula (ZI).

The component (ZI) is more preferably a compound (ZI-1), (ZI-2) or (ZI-3) described below.

The compound (ZI-1) is an arylsulfonium compound where at least one of $R_{201}$ to $R_{203}$ in formula (ZI) is an aryl group, that is, a compound having an arylsulfonium as the cation.

In the arylsulfonium compound, $R_{201}$ to $R_{203}$ all may be an aryl group or a part of $R_{201}$ to $R_{203}$ may be an aryl group with the remaining being an alkyl group or a cycloalkyl group.

Examples of the arylsulfonium compound include a triarylsulfonium compound, a diarylalkylsulfonium compound, an aryldialkylsulfonium compound, a diarylcycloalkylsulfonium compound, and an aryldicycloalkylsulfonium compound.

The aryl group in the arylsulfonium compound is preferably an aryl group such as phenyl group and naphthyl group, or a heteroaryl group such as indole residue and pyrrole residue, more preferably a phenyl group or an indole residue. In the case where the arylsulfonium compound has two or more aryl groups, these two or more aryl groups may be the same or different.

The alkyl group which is present, if desired, in the arylsulfonium compound is preferably a linear or branched alkyl group having a carbon number of 1 to 15, and examples thereof include a methyl group, an ethyl group, a propyl group, an n-butyl group, a sec-butyl group and a tert-butyl group.

The cycloalkyl group which is present, if desired, in the arylsulfonium compound is preferably a cycloalkyl group having a carbon number of 3 to 15, and examples thereof include a cyclopropyl group, a cyclobutyl group and a cyclohexyl group.

The aryl group, alkyl group and cycloalkyl group of $R_{201}$ to $R_{203}$ each may have, as the substituent, an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 14), an alkoxy group (for example, an alkoxy group having a carbon number of 1 to 15), a halogen atom, a hydroxyl group or a phenylthio group. The substituent is preferably a linear or branched alkyl group having a carbon number of 1 to 12, a cycloalkyl group having a carbon number of 3 to 12, or a linear, branched or cyclic alkoxy group having a carbon number of 1 to 12, more preferably an alkyl group having a carbon number of 1 to 4 or an alkoxy group having a carbon number of 1 to 4. The substituent may be substituted to any one of three members $R_{201}$ to $R_{203}$ or may be substituted to all of these three members. In the case where $R_{201}$ to $R_{203}$ are an aryl group, the substituent is preferably substituted at the p-position of the aryl group.

The compound (ZI-2) is described below.

The compound (ZI-2) is a compound where $R_{201}$ to $R_{203}$ in formula (ZI) each independently represents an aromatic ring-free organic group. The aromatic ring as used herein includes an aromatic ring containing a heteroatom.

The aromatic ring-free organic group as $R_{201}$ to $R_{203}$ generally has a carbon number of 1 to 30, preferably from 1 to 20.

$R_{201}$ to $R_{203}$ each is independently preferably an alkyl group, a cycloalkyl group, an allyl group or a vinyl group, more preferably a linear, branched or cyclic 2-oxoalkyl group or an alkoxycarbonylmethyl group, still more preferably a linear or branched 2-oxoalkyl group.

The alkyl group as $R_{201}$ to $R_{203}$ may be either linear or branched and includes a linear or branched alkyl group preferably having a carbon number of 1 to 10 (e.g., methyl, ethyl, propyl, butyl, pentyl). The alkyl group as $R_{201}$ to $R_{203}$ is preferably a linear or branched 2-oxoalkyl group or an alkoxycarbonylmethyl group.

The cycloalkyl group as $R_{201}$ to $R_{203}$ includes a cycloalkyl group preferably having a carbon number of 3 to 10 (e.g., cyclopentyl, cyclohexyl, norbornyl). The cycloalkyl group as $R_{201}$ to $R_{203}$ is preferably a cyclic 2-oxoalkyl group.

The 2-oxoalkyl group as $R_{201}$ to $R_{203}$ may be linear, branched or cyclic and is preferably a group having >C=O at the 2-position of the above-described alkyl or cycloalkyl group.

The alkoxy group in the alkoxycarbonylmethyl group as $R_{201}$ to $R_{203}$ includes an alkoxy group preferably having a carbon number of 1 to 5 (e.g., methoxy, ethoxy, propoxy, butoxy, pentoxy).

$R_{201}$ to $R_{203}$ each may be further substituted by a halogen atom, an alkoxy group (for example, an alkoxy group having a carbon number of 1 to 5), a hydroxyl group, a cyano group or a nitro group.

The compound (ZI-3) is a compound represented by the following formula (ZI-3), and this is a compound having a phenacylsulfonium salt structure.

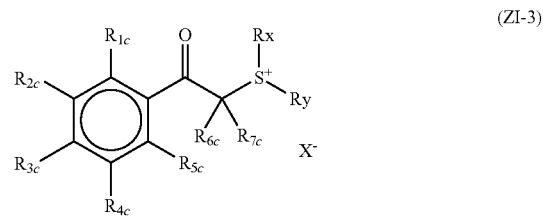

(ZI-3)

In formula (ZI-3), $R_{1c}$ to $R_{5c}$ each independently represents a hydrogen atom, an alkyl group, a cycloalkyl group, an alkoxy group or a halogen atom.

$R_{6c}$ and $R_{7c}$ each independently represents a hydrogen atom, an alkyl group or a cycloalkyl group.

$R_x$ and $R_y$ each independently represents an alkyl group, a cycloalkyl group, an allyl group or a vinyl group.

Any two or more members out of $R_{1c}$ to $R_{7c}$ or a pair of $R_x$ and $R_y$ may combine with each other to form a ring structure, and the ring structure may contain an oxygen atom, a sulfur atom, an ester bond or an amide bond. Examples of the group formed by combining any two or more members out of $R_{1c}$ to $R_{7c}$ or a pair of $R_x$ and $R_y$ include a butylene group and a pentylene group.

$X^-$ represents a non-nucleophilic anion, and examples thereof are the same as those of the non-nucleophilic anion of $X^-$ in formula (ZI).

The alkyl group as $R_{1c}$ to $R_7$ may be linear or branched and is, for example, a linear or branched alkyl group having a carbon number of 1 to 20, preferably a linear or branched alkyl group having a carbon number of 1 to 12 (for example, a methyl group, an ethyl group, a linear or branched propyl group, a linear or branched butyl group, and a linear or branched pentyl group).

The cycloalkyl group as $R_{1c}$ to $R_{7c}$ is a cycloalkyl group having a carbon number of 3 to 20, preferably a cycloalkyl group preferably having a carbon number of 3 to 8 (e.g., cyclopentyl, cyclohexyl).

The alkoxy group as $R_{1c}$ to $R_{5c}$ may be linear, branched or cyclic and is, for example, an alkoxy group having a carbon number of 1 to 10, preferably a linear or branched alkoxy group having a carbon number of 1 to 5 (for example, a methoxy group, an ethoxy group, a linear or branched propoxy group, a linear or branched butoxy group, and a linear or branched pentoxy group), or a cyclic alkoxy group having a carbon number of 3 to 8 (e.g., cyclopentyloxy, cyclohexyloxy).

A compound where any one of $R_{1c}$ to $R_{5c}$ is a linear or branched alkyl group, a cycloalkyl group or a linear, branched or cyclic alkoxy group is preferred, and a compound where the sum of carbon numbers of $R_{1c}$ to $R_{5c}$ is from 2 to 15 is more preferred. By virtue of this construction, the solvent solubility is more enhanced and generation of particles during storage is suppressed.

The alkyl group as $R_x$ and $R_y$ is the same as the alkyl group of $R_{1c}$ to $R_{7c}$. The alkyl group as $R_x$ and $R_y$ is preferably a linear or branched 2-oxoalkyl group or an alkoxycarbonylmethyl group.

The cycloalkyl group as $R_x$ and $R_y$ is the same as the cycloalkyl group of $R_{1c}$ to $R_{7c}$. The cycloalkyl group as $R_x$ to $R_y$ is preferably a cyclic 2-oxoalkyl group.

The linear, branched or cyclic 2-oxoalkyl group includes a group having >C=O at the 2-position of the alkyl group or cycloalkyl group as $R_{1c}$ to $R_{7c}$.

The alkoxy group in the alkoxycarbonylmethyl group is the same as the alkoxy group of $R_{1c}$ to $R_{5c}$.

$R_x$ and $R_y$ each is preferably an alkyl group having a carbon number of 4 or more, more preferably 6 or more, still more preferably 8 or more.

In formulae (ZII) and (ZIII), $R_{204}$ to $R_{207}$ each independently represents an aryl group which may have a substituent, an alkyl group which may have a substituent, or a cycloalkyl group which may have a substituent.

The aryl group of $R_{204}$ to $R_{207}$ is preferably a phenyl group or a naphthyl group, more preferably a phenyl group.

The alkyl group of $R_{204}$ to $R_{207}$ may be linear or branched and is preferably a linear or branched alkyl group having a carbon number of 1 to 10 (e.g., methyl, ethyl, propyl, butyl, pentyl).

The cycloalkyl group of $R_{204}$ to $R_{207}$ is preferably a cycloalkyl group having a carbon number of 3 to 10 (e.g., cyclopentyl, cyclohexyl, norbornyl).

Examples of the substituent which $R_{204}$ to $R_{207}$ each may have include an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 15), an alkoxy group (for example, an alkoxy group having a carbon number of 1 to 15), a halogen atom, a hydroxyl group and a phenylthio group.

$X^-$ represents a non-nucleophilic anion and is the same as the non-nucleophilic anion of $X^-$ in formula (ZI).

Out of the compounds capable of generating an acid upon irradiation with actinic rays or radiation, preferred compounds further include the compounds represented by the following formulae (ZIV), (ZV) and (ZVI):

In formulae (ZIV) to (ZVI), $Ar_3$ and $Ar_4$ each independently represents a substituted or unsubstituted aryl group.

$R_{206}$ represents a substituted or unsubstituted alkyl group, a substituted or unsubstituted cycloalkyl group, or a substituted or unsubstituted aryl group.

$R_{207}$ and $R_{208}$ each independently represents a substituted or unsubstituted alkyl group, a substituted or unsubstituted cycloalkyl group, a substituted or unsubstituted aryl group, or an electron-withdrawing group. $R_{207}$ is preferably a substituted or unsubstituted aryl group, and $R_{208}$ is preferably an electron-withdrawing group, more preferably a cyano group or a fluoroalkyl group.

A represents a substituted or unsubstituted alkylene group, a substituted or unsubstituted cycloalkylene group, a substituted or unsubstituted alkenylene group, or a substituted or unsubstituted arylene group.

Among the compounds capable of generating an acid upon irradiation with actinic rays or radiation, the compounds represented by formulae (ZI) to (ZIII) are preferred, the compound represented by formula (ZI) is more preferred, and the compounds represented by formulae (ZI-1) to (ZI-3) are still more preferred.

Furthermore, a compound capable of generating an acid represented by any one of the following formulae (AC1) to (AC3) upon irradiation with actinic rays or radiation is preferred.

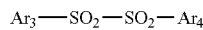

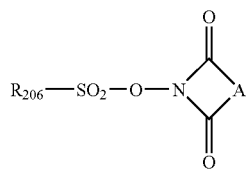

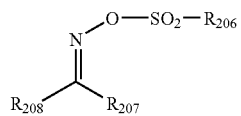

That is, a preferred embodiment of the component (A) is a compound where in the structure of formula (ZI), $X^-$ is an anion selected from formulae (AN1), (AN3) and (AN4).

As for the acid generator, at least two kinds of acid generators selected from the group consisting of a triarylsulfonium salt, an oxime sulfonate compound and a diazodisulfone compound are preferably used.

As for the acid generator, a sulfonium salt having a bis(alkylsulfonium)amide anion or a tris(alkylsulfonyl)methide anion is preferably used.

Out of the compounds capable of generating an acid upon irradiation with actinic rays or radiation, particularly preferred examples are set forth below, but the present invention is not limited thereto.

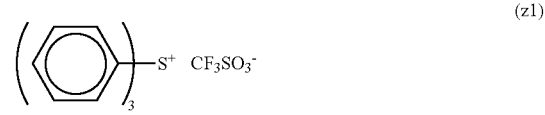

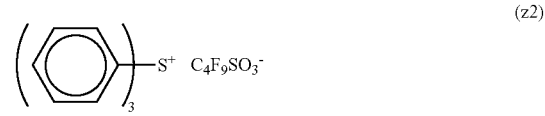

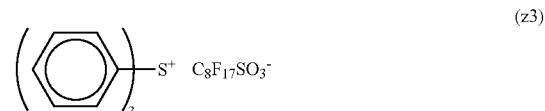

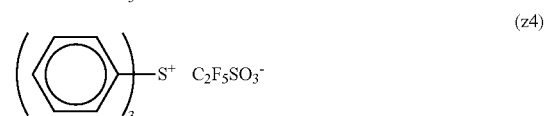

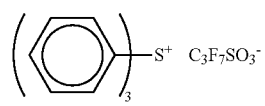 (z5)
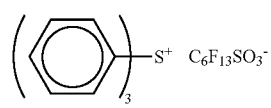 (z6)
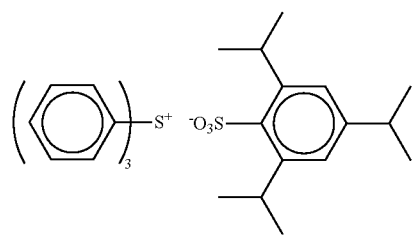 (z7)
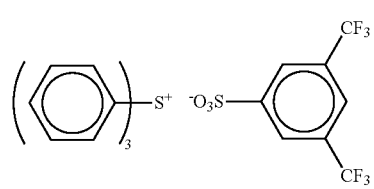 (z8)
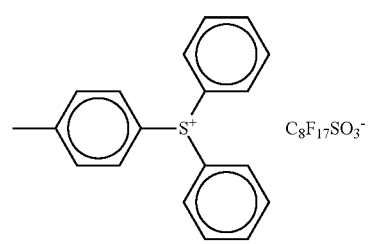 (z9)
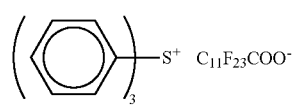 (z10)
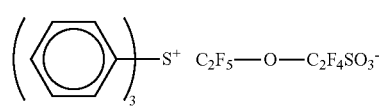 (z11)
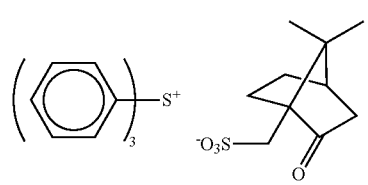 (z12)
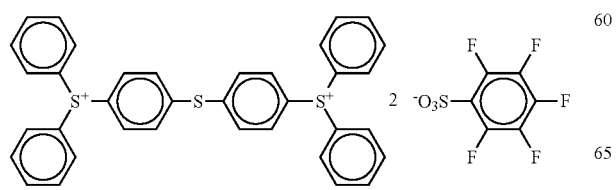 (z13)
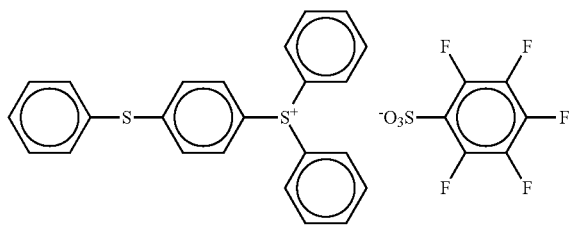 (z14)
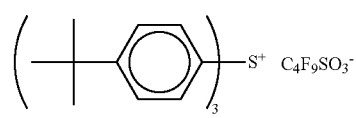 (z15)
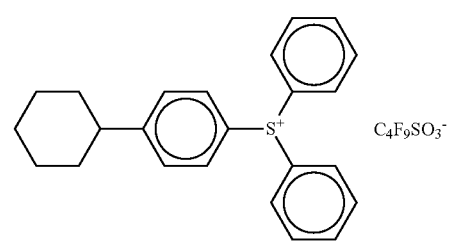 (z16)
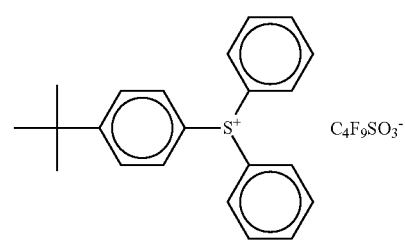 (z17)
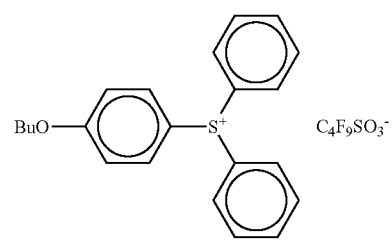 (z18)
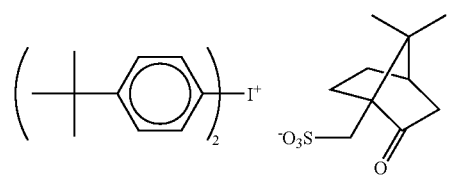 (z19)
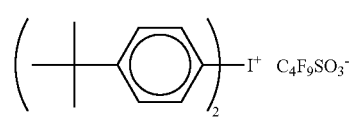 (z20)
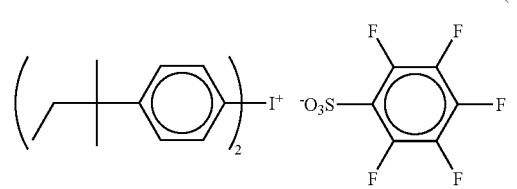 (z21)

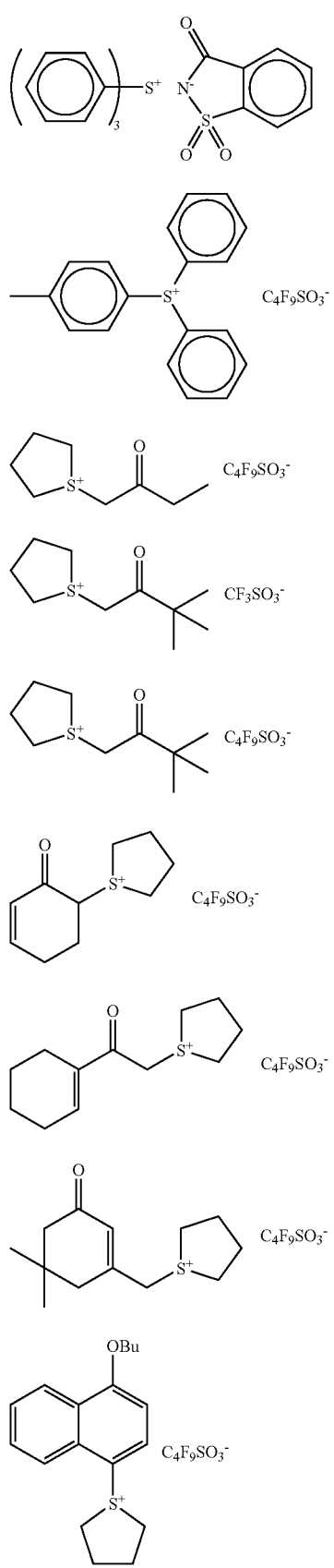
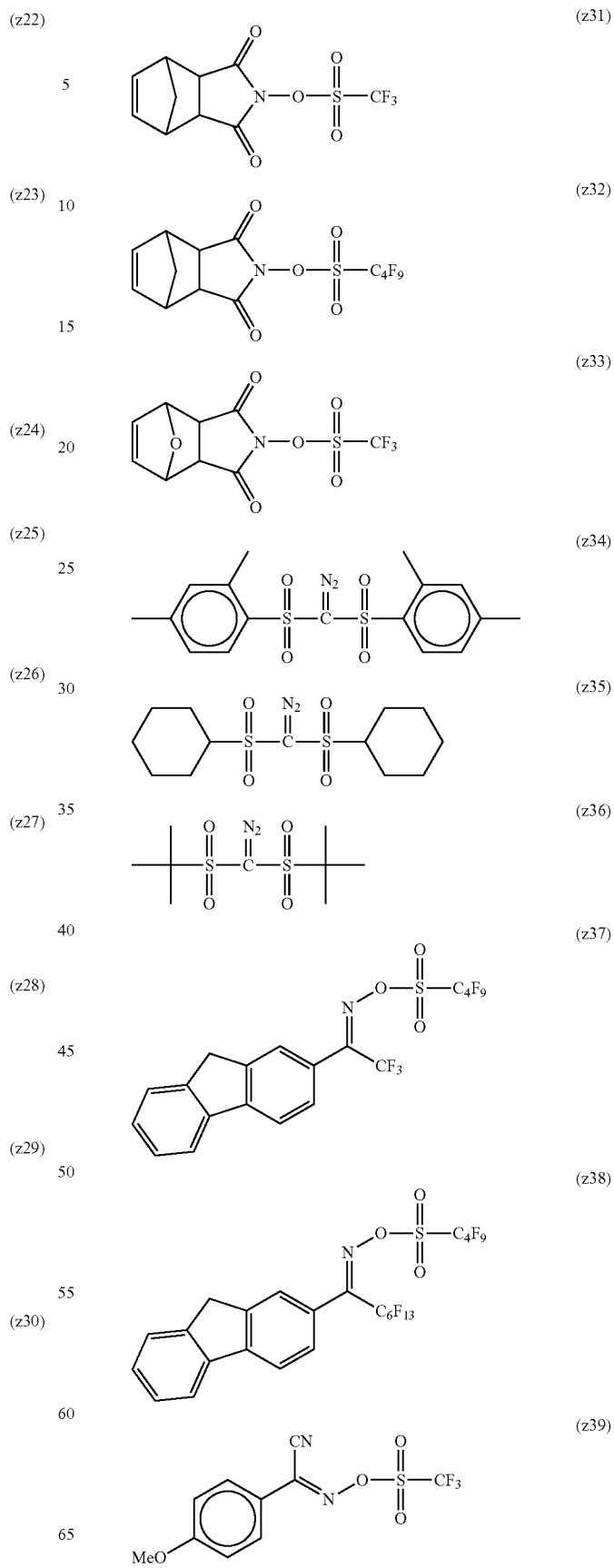

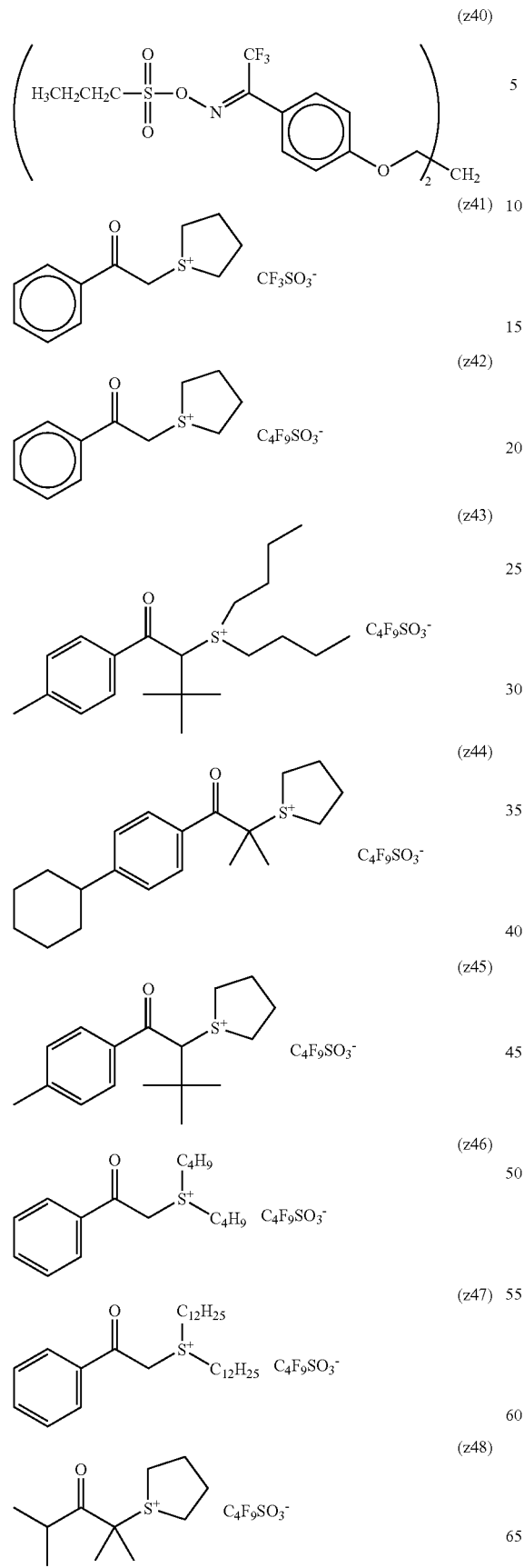

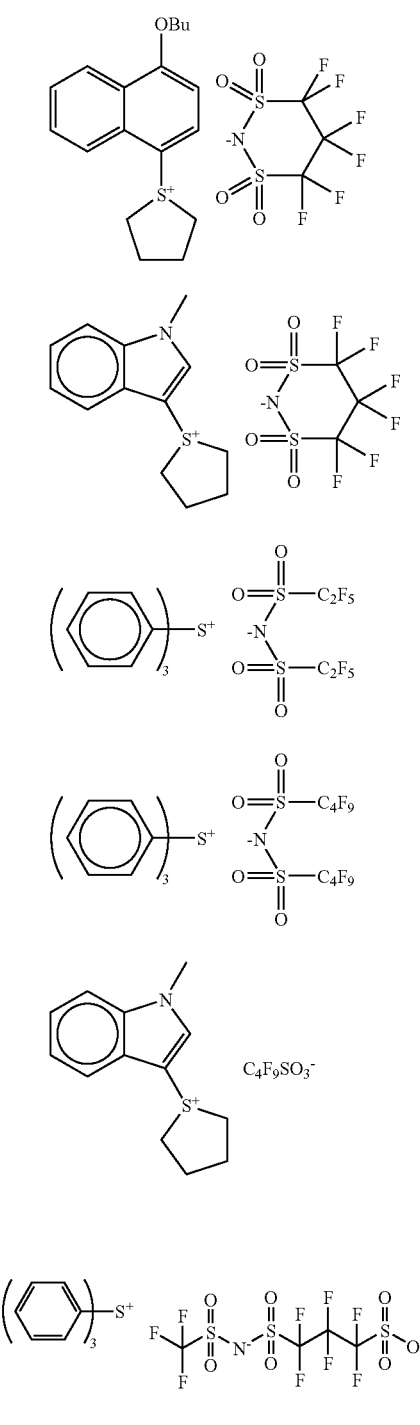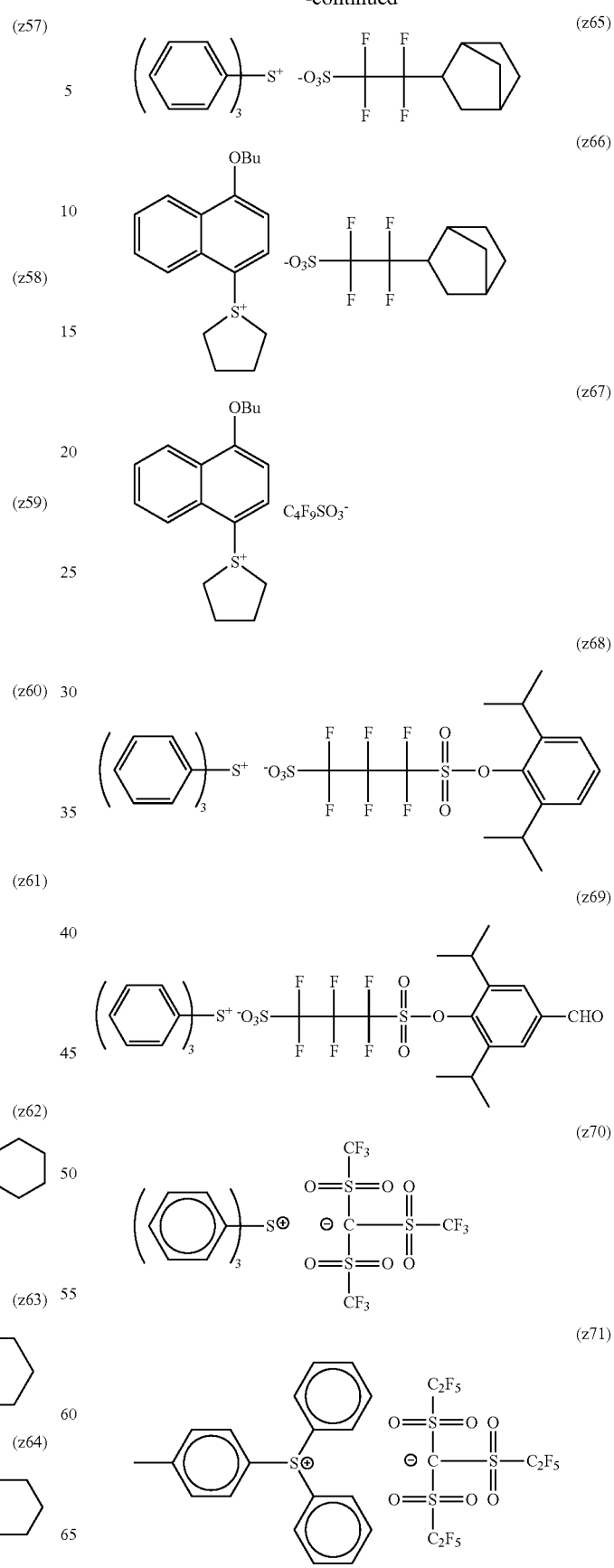

-continued (z72) 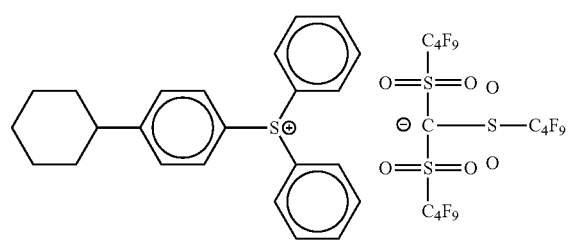

(z73) 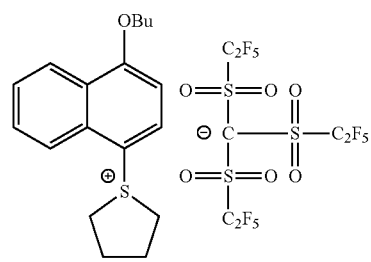

(z74) 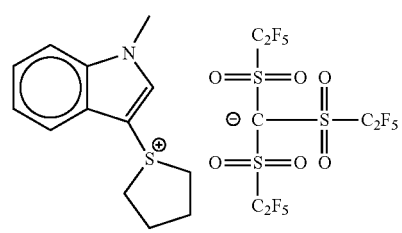

(z75) 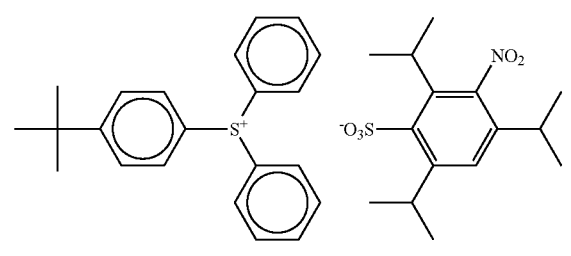

(z76) 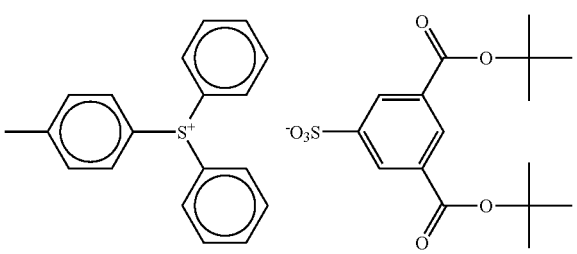

(z77) 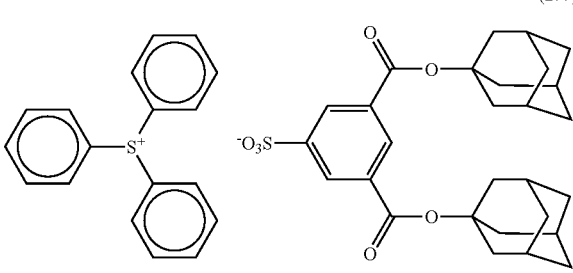

-continued (z78) 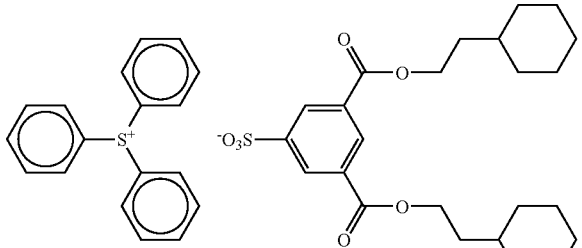

(z79) 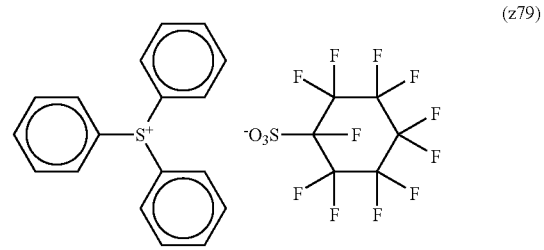

(z80) 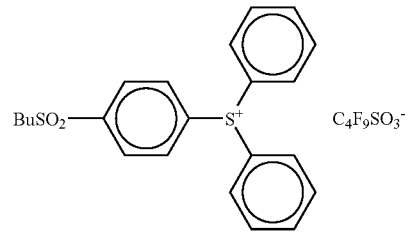

One of these acid generators may be used alone, or two or more kinds thereof may be used in combination. In the case of using two or more kinds in combination, compounds capable of generating two or more organic acids differing in the total number of atoms except for hydrogen atom by 2 or more are preferably combined.

The content of the acid generator in the composition is preferably from 0.1 to 20 mass %, more preferably from 0.5 to 10 mass %, still more preferably from 1 to 7 mass %, based on the entire solid content of the resist composition.

Organic Basic Compound:

In the present invention, an organic basic compound is preferably used, for example, from the standpoint of enhancing the performance such as resolving power or enhancing the storage stability. The organic basic compound is more preferably a compound containing a nitrogen atom (nitrogen-containing basic compound).

The organic basic compound preferred in the present invention is a compound having basicity stronger than that of phenol.

The preferred chemical environment thereof includes structures of the following formulae (A) to (E). The structures of formulae (B) to (E) each may be a part of a ring structure.

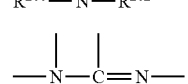 (A)

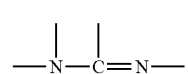 (B)

-continued

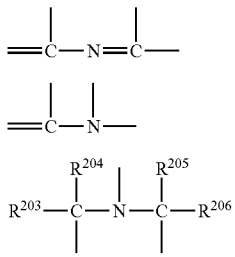

In formula (A), $R^{200}$, $R^{201}$ and $R^{202}$, which may be the same or different, each represents a hydrogen atom, an alkyl group or cycloalkyl group having a carbon number of 1 to 20, or an aryl group having a carbon number of 6 to 20, and $R^{201}$ and $R^{202}$ may combine with each other to form a ring.

The alkyl group, cycloalkyl group and aryl group as $R^{200}$, $R^{201}$ and $R^{202}$ each may have a substituent. The alkyl group or cycloalkyl group having a substituent is preferably an aminoalkyl group or aminocycloalkyl group having a carbon number of 1 to 20, or a hydroxyalkyl group having a carbon number of 1 to 20.

In formula (E), $R^{203}$, $R^{204}$, $R^{205}$ and $R^{206}$, which may be the same or different, each represents an alkyl group or cycloalkyl group having a carbon number of 1 to 6.

The compound is more preferably a nitrogen-containing basic compound having two or more nitrogen atoms differing in the chemical environment within one molecule, still more preferably a compound containing both a substituted or unsubstituted amino group and a nitrogen-containing ring structure, or a compound having an alkylamino group.

Specific preferred examples thereof include guanidine, aminopyridine, aminoalkylpyridine, aminopyrrolidine, indazole, imidazole, pyrazole, pyrazine, pyrimidine, purine, imidazoline, pyrazoline, piperazine, aminomorpholine and aminoalkylmorpholine. Preferred examples of the substituent which these compounds each may have include an amino group, an alkylamino group, an aminoaryl group, an arylamino group, an alkyl group (as the substituted alkyl group, particularly an aminoalkyl group), an alkoxy group, an acyl group, an acyloxy group, an aryl group, an aryloxy group, a nitro group, a hydroxyl group and a cyano group.

More preferred examples of the compound include, but are not limited to, guanidine, 1,1-dimethylguanidine, 1,1,3,3-tetramethylguanidine, imidazole, 2-methylimidazole, 4-methylimidazole, N-methylimidazole, 2-phenylimidazole, 4,5-diphenylimidazole, 2,4,5-triphenylimidazole, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl)-pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine and N-(2-aminoethyl)morpholine.

One of these nitrogen-containing basic compounds may be used alone, or two or more kinds thereof may be used in combination.

A tetraalkylammonium salt-type nitrogen-containing basic compound may also be used. Among such compounds, a tetraalkylammonium hydroxide having a carbon number of 1 to 8 (e.g., tetramethylammonium hydroxide, tetraethylammonium hydroxide, tetra-(n-butyl)ammonium hydroxide) is preferred.

One of these nitrogen-containing basic compounds may be used alone, or two or more kinds thereof may be used in combination.

As for the ratio between the acid generator and the organic basic compound used in the composition, the (total amount of acid generators)/(organic basic compound) (molar ratio) is preferably from 2.5 to 300. When this molar ratio is 2.5 or more, high sensitivity is obtained, and when the molar ratio is 300 or less, the resist pattern can be prevented from thickening in aging after exposure until heat treatment and the resolving power can be enhanced. The (total amount of acid generators)/(organic basic compound) (molar ratio) is more preferably from 5.0 to 200, still more preferably from 7.0 to 150.

Surfactant:

In the present invention, surfactants may be used and this is preferred in view of film-forming property, adhesion of pattern, reduction of development defects, and the like.

Specific examples of the surfactant include a nonionic surfactant such as polyoxyethylene alkyl ethers (e.g., polyoxyethylene lauryl ether, polyoxyethylene stearyl ether, polyoxyethylene cetyl ether, polyoxyethylene oleyl ether), polyoxyethylene alkylallyl ethers (e.g., polyoxyethylene octylphenol ether, polyoxyethylene nonylphenol ether), polyoxyethylene•polyoxypropylene block copolymers, sorbitan fatty acid esters (e.g., sorbitan monolaurate, sorbitan monopalmitate, sorbitan monostearate, sorbitan monooleate, sorbitan trioleate, sorbitan tristearate), and polyoxyethylene sorbitan fatty acid esters (e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate); a fluorine-containing surfactant and a silicon-containing surfactant, such as EFtop EF301, EF303 and EF352 (produced by Shin-Akita Chemical Co., Ltd.), Megafac F171 and F173 (produced by Dainippon Ink & Chemicals, Inc.), Florad FC430 and FC431 (produced by Sumitomo 3M Inc.), AsahiguardAG710, Surflon S-382, SC101, SC102, SC103, SC104, SC105 and SC106 (produced by Asahi Glass Co., Ltd.), and Troysol S-366 (produced by Troy Chemical Industries, Inc.); an organosiloxane polymer, KP-341 (produced by Shin-Etsu Chemical Co., Ltd.); and acrylic acid-based or methacrylic acid-based (co)polymers Polyflow No. 75 and No. 95 (produced by Kyoeisha Yushi Kagaku Kogyo Co., Ltd.).

As for the surfactant, the composition preferably contains any one of fluorine- and/or silicon-containing surfactants (a fluorine-containing surfactant, a silicon-containing surfactant, or a surfactant containing both a fluorine atom and a silicon atom), or two or more kinds thereof.

Examples of these surfactants include the surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862 and U.S. Pat. Nos. 5,405,720, 5,360,692, 5,529,881, 5,296,330, 5,436,098, 5,576,143, 5,294,511 and 5,824,451. The following commercially available surfactants each may also be used as it is.

Examples of the commercially available surfactant which can be used include a fluorine-containing or silicon-containing surfactant such as EFtop EF301 and EF303 (produced by Shin-Akita Chemical Co., Ltd.), Florad FC430 and 431 (produced by Sumitomo 3M Inc.), Megafac F171, F173, F176, F189 and R$^{08}$ (produced by Dainippon Ink & Chemicals, Inc.), Surflon S-382, SC101, 102, 103, 104, 105 and 106 (produced by Asahi Glass Co., Ltd.), and Troysol S-366 (produced by Troy Chemical Industries, Inc.). In addition, a polysiloxane polymer KP-341 (produced by Shin-Etsu Chemical Co., Ltd.) may also be used as the silicon-containing surfactant.

Other than these known surfactants, a surfactant using a polymer having a fluoroaliphatic group derived from a fluoroaliphatic compound produced by a telomerization process (also called a telomer process) or an oligomerization process (also called an oligomer process) may be used. The fluoroaliphatic compound can be synthesized by the method described in JP-A-2002-90991.

The polymer having a fluoroaliphatic group is preferably a copolymer of a fluoroaliphatic group-containing monomer with a (poly(oxyalkylene)) acrylate and/or a (poly(oxyalkylene)) methacrylate, and the polymer may have an irregular distribution or may be a block copolymer. Examples of the poly(oxyalkylene) group include a poly(oxyethylene) group, a poly(oxypropylene) group and a poly(oxybutylene) group. This group may also be a unit having alkylenes differing in the chain length within the same chain, such as block-linked poly(oxyethylene, oxypropylene and oxyethylene) and block-linked poly(oxyethylene and oxypropylene). Furthermore, the copolymer of a fluoroaliphatic group-containing monomer with a (poly(oxyalkylene)) acrylate (or methacrylate) may be not only a binary copolymer but also a ternary or higher copolymer obtained by simultaneously copolymerizing two or more different fluoroaliphatic group-containing monomers or two or more different (poly(oxyalkylene)) acrylates (or methacrylates).

Examples thereof include commercially available surfactants such as Megafac F178, F-470, F-473, F-475, F-476 and F-472 (produced by Dainippon Ink & Chemicals, Inc.), and further include a copolymer of a $C_6F_{13}$ group-containing acrylate (or methacrylate) with a (poly(oxyalkylene)) acrylate (or methacrylate), a copolymer of a $C_6F_{13}$ group-containing acrylate (or methacrylate) with (poly(oxyethylene)) acrylate (or methacrylate) and (poly(oxypropylene)) acrylate (or methacrylate), a copolymer of a $C_8F_{17}$ group-containing acrylate (or methacrylate) with a (poly(oxyalkylene)) acrylate (or methacrylate), and a copolymer of a $C_8F_{17}$ group-containing acrylate (or methacrylate) with (poly(oxyethylene)) acrylate (or methacrylate) and (poly(oxypropylene)) acrylate (or methacrylate).

The amount of the surfactant used is preferably from 0.0001 to 2 mass %, more preferably from 0.001 to 1 mass %, based on the entire amount of the positive resist composition (excluding the solvent).

Other Components:

The positive resist composition of the present invention may further contain, if desired, a dye, a photobase generator and the like.

1. Dye

In the present invention, a dye may be used.

The suitable dye includes an oily dye and a basic dye. Specific examples thereof include Oil Yellow #101, Oil Yellow #103, Oil Pink #312, Oil Green BG, Oil Blue BOS, Oil Blue #603, Oil Black BY, Oil Black BS, Oil Black T-505 (all produced by Orient Chemical Industries Co., Ltd.), Crystal Violet (CI42555), Methyl Violet (CI42535), Rhodamine B (CI45170B), Malachite Green (CI42000) and Methylene Blue (CI52015).

2. Photobase Generator

Examples of the photobase generator which can be added to the composition of the present invention include compounds described in JP-A-4-151156, JP-A-4-162040, JP-A-5-197148, JP-A-5-5995, JP-A-6-194834, JP-A-8-146608, JP-A-10-83079 and European Patent 622,682. Specific examples of the photobase generator which can be suitably used include 2-nitrobenzyl carbamate, 2,5-dinitrobenzylcyclohexyl carbamate, N-cyclohexyl-4-methylphenylsulfonamide and 1,1-dimethyl-2-phenylethyl-N-isopropyl carbamate. Such a photobase generator is added for the purpose of improving the resist profile or the like.

3. Solvent

The resist composition of the present invention after dissolving the components described above in a solvent is coated on a support. Usually, the concentration is, in terms of the solid material concentration of all resist components, preferably from 2 to 30 mass %, more preferably from 3 to 25 mass %.

Preferred examples of the solvent used here include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethylsulfoxide, N-methylpyrrolidone and tetrahydrofuran. One of these solvents is used alone, or several kinds thereof are mixed and used.

The positive resist composition of the present invention is coated on a substrate to form a thin film. The thickness of this coated film is preferably from 0.05 to 4.0 μm.

The composition of the present invention has an excellent effect that a good pattern is obtained even when an antireflection film is not coated and the composition is coated directly on a substrate having a high-reflection surface, but a good pattern can be formed also when an antireflection film is used.

The antireflection film used as the underlayer of the resist may be either an inorganic film type such as titanium, titanium dioxide, titanium nitride, chromium oxide, carbon and amorphous silicon, or an organic film type comprising a light absorbent and a polymer material. The former requires equipment for the film formation, such as vacuum deposition apparatus, CVD apparatus and sputtering apparatus. Examples of the organic antireflection film include a film comprising a diphenylamine derivative/formaldehyde-modified melamine resin condensate, an alkali-soluble resin and a light absorbent described in JP-B-7-69611 (the term "JP-B" as used herein means an "examined Japanese patent publication"), a reaction product of a maleic anhydride copolymer and a diamine-type light absorbent described in U.S. Pat. No. 5,294,680, a film containing a resin binder and a methylolmelamine-based heat crosslinking agent described in JP-A-6-118631, an acrylic resin-type antireflection film containing a carboxylic acid group, an epoxy group and a light absorbing group within the same molecule described in JP-A-6-118656, a film comprising a methylolmelamine and a benzophenone-based light absorbent described in JP-A-8-87115, and a film obtained by adding a low molecular light absorbent to a polyvinyl alcohol resin described in JP-A-8-179509.

Also, the organic antireflection film may be a commercially available organic antireflection film such as DUV-30 Series and DUV-40 Series produced by Brewer Science, Inc.; and AR-2, AR-3 and AR-5 produced by Shipley Co., Ltd.

In the production or the like of a precision integrated circuit device, the step of forming a pattern on a resist film is performed by coating the positive resist composition of the present invention on a substrate (for example, a silicon/silicon dioxide-coated substrate, a glass substrate, an ITO substrate or a quartz/chromium oxide-coated substrate) to form a resist film, irradiating thereon actinic rays or radiation such as KrF excimer laser light, electron beam or EUV light, and then subjecting the resist film to heating, development, rinsing and drying, whereby a good resist pattern can be formed.

The alkali developer which can be used in the development is an aqueous solution of alkalis (usually, 0.1 to 20 mass %) such as inorganic alkalis (e.g., sodium hydroxide, potassium hydroxide, sodium carbonate, sodium silicate, sodium metasilicate, aqueous ammonia), primary amines (e.g., ethylamine, n-propylamine), secondary amines (e.g., diethylamine, di-n-butylamine), tertiary amines (e.g., triethylamine, methyldiethylamine), alcohol amines (e.g., dimethylethanolamine, triethanolamine), quaternary ammonium salts (e.g., tetramethylammonium hydroxide, tetraethylammonium hydroxide, choline), and cyclic amines (e.g., pyrrole, piperidine). This aqueous solution of alkalis may be used after adding thereto alcohols such as isopropyl alcohol or a surfactant such as nonionic surfactant, in an appropriate amount.

Among these developers, a quaternary ammonium salt is preferred, and tetramethylammonium hydroxide and choline are more preferred.

The pH of the alkali developer is usually from 10 to 15.

EXAMPLES

The present invention is described in greater detail below by referring to Examples, but the present invention should not be construed as being limited thereto.

Synthesis Example 1

Synthesis of Resin (A-1)

Poly(p-hydroxystyrene) (molecular weight dispersity: 1.05) (50 g) was dried at 50° C. under reduced pressure. This poly(p-hydroxystyrene) was dissolved in propylene glycol monomethyl ether acetate (PGMEA) (400 g), and then, water and PGMEA were azeotropically removed by distillation under reduced pressure. After confirming sufficient reduction of water content, ethyl vinyl ether (25.0 g) and p-toluenesulfonic acid (0.02 g) were added, and the mixture was stirred at room temperature for 1 hour. Thereafter, the reaction was stopped by adding triethylamine (5.0 g) to the reaction solution. Furthermore, water (400 ml) and ethyl acetate (800 ml) were added to effect liquid separation and after water washing, ethyl acetate, water and the azeotropic portion of PGMEA were removed by distillation under reduced pressure to obtain Resin (A-1) (compositional molar ratio: 65/35, weight average molecular weight: 15,000, dispersity: 1.1, 30 mass % PGMEA solution).

Synthesis Example 2

Synthesis of Resin (B-17)

A copolymer of p-hydroxystyrene and tert-butyl methacrylate (compositional molar ratio: 80/20) (35.0 g) and propylene glycol monomethyl ether acetate (PGMEA) (400 g) were dissolved in a flask, and water and PGMEA were azeotropically removed by distillation under reduced pressure. After confirming sufficient reduction of water content, ethyl vinyl ether (5.0 g) was added. Subsequently, a solution prepared by dissolving 5.0 g of 2-naphtoyl chloride in 50 g of acetone was added over 20 minutes, and the reaction was allowed to proceed with stirring for 60 minutes. Furthermore, water (400 ml) and ethyl acetate (800 ml) were added to effect liquid separation and after water washing, ethyl acetate, water and the azeotropic portion of PGMEA were removed by distillation under reduced pressure to obtain Resin (B-17) having a substituent according to the present invention (compositional molar ratio: 10/70/20, molecular weight: 9,000, dispersity: 1.3, 30 mass % PGMEA solution).

The resins (B1) and resins (B2) shown in Table 1 below were synthesized in the same manner.

TABLE 1

| | Compositional Molar Ratio | Weight Average Molecular Weight | Dispersity |
|---|---|---|---|
| Resin (B1) | | | |
| Resin (A-1) | 65/35 | 15000 | 1.1 |
| Resin (A-4) | 70/30 | 14000 | 1.3 |
| Resin (A-6) | 70/30 | 12000 | 1.1 |
| Resin (A-10) | 72/28 | 15000 | 1.1 |
| Resin (A-17) | 65/35 | 13000 | 1.3 |
| Resin (A-20) | 70/30 | 15000 | 1.1 |
| Resin (A-27) | 70/30 | 10500 | 1.2 |
| Resin (A-30) | 68/32 | 12000 | 1.3 |
| Resin (A-37) | 70/30 | 12000 | 1.2 |
| Resin (A-38) | 60/25/15 | 15000 | 1.3 |
| Resin (B2) | | | |
| Resin (B-2) | 8/75/17 | 8000 | 1.1 |
| Resin (B-4) | 10/70/20 | 10000 | 1.3 |
| Resin (B-6) | 8/70/17/5 | 8000 | 1.1 |
| Resin (B-10) | 8/75/17 | 8000 | 1.2 |
| Resin (B-17) | 10/70/20 | 9000 | 1.3 |
| Resin (B-20) | 10/70/20 | 8000 | 1.2 |
| Resin (B-27) | 10/70/20 | 9200 | 1.1 |
| Resin (B-30) | 10/70/20 | 8000 | 1.2 |
| Resin (B-38) | 8/70/17/5 | 9600 | 1.2 |
| Resin (B-47) | 10/70/20 | 10000 | 1.1 |
| Resin (B-50) | 10/70/20 | 9200 | 1.2 |
| Resin (B-57) | 10/70/20 | 9800 | 1.2 |
| Resin (B-62) | 8/75/17 | 10000 | 1.2 |
| Resin (B-79) | 10/70/20 | 8300 | 1.2 |
| Resin (B-84) | 8/75/17 | 9000 | 1.2 |

Examples 1 to 16 and Comparative Example 1

The components shown in Table 2 below at the blending ratio (amounts added) shown in Table 2 were dissolved in a mixed solvent of PGMEA (propylene glycol monomethyl ether acetate)/PGME (propylene glycol monomethyl ether) (=8/2 by mass) to give a concentration of 10 mass %, and the obtained solution was filtered through a microfilter having a pore size of 0.1 μm to prepare positive resist solutions of Examples 1 to 16 and Comparative Example 1.

The obtained positive resist solution was coated on a bare silicon substrate by using a spin coater (Mark 8, manufactured by Tokyo Electron Ltd.) and dried at 90° C. for 90 seconds to form each resist film of 410 μm. Subsequently, the resist film was exposed using a KrF excimer laser (FPA-3000EX5, manufactured by Canon Inc., wavelength: 248 nm, NA=0.60, σ=0.75). After the exposure, the resist film was heated on a hot plate at 100° C. for 60 seconds, immediately dipped in an aqueous 0.26N tetramethylammonium hydroxide (TMAH) solution for 60 seconds, rinsed with water for 30 seconds, and dried. The thus-obtained pattern on the silicon wafer was observed through a scanning electron microscope, and the resist performances were evaluated as follows. The results obtained are shown in Table 2.

[Resolving Power]

The limiting resolving power at the exposure dose for reproducing a 0.30-μm line-and-space mask pattern is shown.

[Number of Development Defects]

Each resist film was coated on a 6-inch bare Si substrate to a thickness of 0.5 μm, dried at 130° C. for 60 seconds on a vacuum suction-type hot plate, exposed through a test mask having a 0.18-μm isolated trench pattern by using a Nikon stepper NSR-1505EX, post-exposure-baked at 130° C. for 90 seconds, subjected to puddle development with a 2.38% TMAH (aqueous tetramethylammonium hydroxide solution) for 60 seconds, washed with pure water for 30 seconds, and then spin-dried. The thus-obtained sample was measured for the number of scums by means of KLA-2112 manufactured by KLA Tencol K.K., and the obtained primary data value was used as the number of development defects.

[Iso-Dense Bias]

With respect to a line width of 0.15 μm, the bias of 0.15 μm+10% was determined in a line-and-space pattern (dense pattern (1:1)) and an isolated pattern (sparse pattern (1:5)). A smaller value indicates better iso-dense bias.

TABLE 2

| | Resist Composition | | | | | Evaluation Results | | |
|---|---|---|---|---|---|---|---|---|
| | Resin (B1) | Resin (B2) | Acid Generator | Basic Compound (0.005 g) | Surfactant (0.001 g) | Resolving Power (μm) | Number of Development Defects | Iso-Dense Bias (nm) |
| Example 1 | A-1 (0.53 g) | B-2 (0.41 g) | z34 (0.04 g) z40 (0.02 g) | D-1 | W-1 | 0.15 | 3 | 15 |
| Example 2 | A-4 (0.61 g) | B-4 (0.32 g) | z35 (0.05 g) | D-2 | W-1 | 0.15 | 9 | 9 |
| Example 3 | A-6 (0.70 g) | B-6 (0.23 g) | z36 (0.03 g) z40 (0.02 g) | D-3 | W-2 | 0.14 | 5 | 11 |
| Example 4 | A-10 (0.63 g) | B-10 (0.31 g) | z37 (0.05 g) | D-1 | W-1 | 0.15 | 7 | 12 |
| Example 5 | A-17 (0.50 g) | B-17 (0.43 g) | z38 (0.05 g) | D-2 | W-2 | 0.14 | 6 | 9 |
| Example 6 | A-20 (0.63 g) | B-20 (0.33 g) | z39 (0.05 g) | D-2 | W-1 | 0.15 | 7 | 10 |
| Example 7 | A-27 (0.58 g) | B-27 (0.35 g) | z40 (0.05 g) | D-1 | W-2 | 0.16 | 7 | 11 |
| Example 8 | A-30 (0.58 g) | B-30 (0.35 g) | z2 (0.04 g) z40 (0.02 g) | D-2 | W-1 | 0.16 | 5 | 12 |
| Example 9 | A-1 (0.58 g) | B-47 (0.35 g) | z56 (0.05 g) | D-2 | W-1 | 0.16 | 6 | 13 |
| Example 10 | A-4 (0.63 g) | B-50 (0.30 g) | z71 (0.05 g) | D-1 | W-1 | 0.15 | 9 | 11 |
| Example 11 | A-6 (0.73 g) | B-57 (0.20 g) | z55 (0.05 g) | D-2 | W-2 | 0.16 | 7 | 12 |
| Example 12 | A-10 (0.65 g) | B-62 (0.29 g) | z70 (0.05 g) | D-2 | W-1 | 0.16 | 5 | 12 |
| Example 13 | A-1 (0.73 g) | B-79 (0.21 g) | z2 (0.05 g) | D-1 | W-1 | 0.15 | 8 | 13 |
| Example 14 | A-20 (0.73 g) | B-84 (0.22 g) | z36 (0.05 g) | D-2 | W-1 | 0.15 | 8 | 12 |
| Example 15 | A-38 (0.73 g) | B-2 (0.21 g) | z2 (0.05 g) | D-1 | W-1 | 0.15 | 7 | 15 |
| Example 16 | A-1 (0.73 g) | B-38 (0.21 g) | z34 (0.05 g) | D-1 | W-1 | 0.16 | 8 | 12 |
| Comparative Example 1 | none | B-79 (0.94 g) | z2 (0.05 g) | D-1 | W-1 | 0.16 | 25 | 20 |

Abbreviations in the Table are as follows.

[Basic Compound]
D-1: tetrabutylammonium hydroxide
D-2: dicyclohexylmethylamine
D-3: tris(methoxyethoxyethylamine)

[Surfactant]
W-1: fluorine-containing surfactant, Megafac F-176 (produced by Dainippon Ink & Chemicals, Inc.)
W-2: fluorine/silicon-containing surfactant, Megafac R08 (produced by Dainippon Ink & Chemicals, Inc.)

As apparent from Table 2, the positive resist composition of the present invention favors high resolution, good performance in terms of defocus latitude depended on line pitch, and reduction in the number of development defects.

According to the present invention, in connection with the pattern formation by the irradiation of electron beam, KrF excimer laser light or EUV light, a positive resist composition satisfying the performances in terms of high resolution, number of development defects, and iso-dense bias in an ultrafine region, particularly, in an ion injection step not using an antireflection film (BARC), and a pattern forming method using the composition can be provided.

The entire disclosure of each and every foreign patent application from which the benefit of foreign priority has been claimed in the present application is incorporated herein by reference, as if fully set forth.

What is claimed is:

1. A positive resist composition, comprising:
   (B1) a resin capable of decomposing under an action of an acid to increase a solubility of the resin (B1) in an aqueous alkali solution, the resin (B1) containing at least one of a repeating unit represented by formula (Ia) and a repeating unit represented by formula (IIa);
   (B2) a resin capable of decomposing under an action of an acid to increase a solubility of the resin (B2) in an aqueous alkali solution, the resin (B2) containing a repeating unit represented by formula (IIb); and a repeating unit represented by formula (III) containing at least two aromatic ring structures; and
   (A) a compound capable of generating an acid upon irradiation with actinic rays or radiation;

(Ia)

wherein X represents a hydrogen atom, a methyl group or a halogen atom;

$A_l$ represents a hydrogen atom or a group capable of leaving under an action of an acid, and when a plurality of $A_l$'s are present, the plurality of $A_l$'s may be the same or different;

L represents a monovalent organic group, a halogen atom, a cyano group or a nitro group, and when a plurality of L's are present, the plurality of L's may be the same or different;

n represents an integer of 1 to 3; and m represents an integer of 0 to 2;

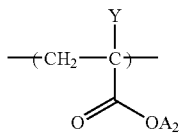

(IIa)

wherein Y represents a hydrogen atom, a methyl group, a halogen atom, a cyano group, a hydroxymethyl group, an alkoxymethyl group or an acyloxymethyl group; and $A_2$ represents a group capable of leaving under an action of an acid;

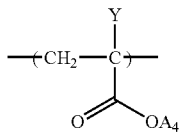

(IIb)

wherein Y represents a hydrogen atom, a methyl group, a halogen atom, a cyano group, a hydroxymethyl group, an alkoxymethyl group or an acyloxymethyl group; and $A_4$ represents a hydrogen atom or a group capable of leaving under an action of an acid;

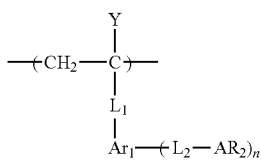

(III)

wherein Y represents a hydrogen atom, a methyl group, a halogen atom, a cyano group, a hydroxymethyl group, an alkoxymethyl group or an acyloxymethyl group;

$L_1$ represents a single bond, an arylene group, an aralkylene group, a carbonyl group, an ester group, an imino group or an ether group, or a divalent linking group including a combination of at least two kinds of groups thereof;

$AR_1$ represents a phenylene group or a naphthylene group;

$L_2$ represents —OCO—;

$AR_2$ represents a phenyl group or a naphthyl group, and when a plurality of $AR_2$'s are present, the plurality of $AR_2$'s may be the same or different; and n represents an integer of 1 or 2.

2. The positive resist composition according to claim 1, wherein the resin (B1) has a molecular weight dispersity of from 1.0 to 1.3.

3. The positive resist composition according to claim 1, wherein the resin (B2) has a molecular weight dispersity of from 1.0 to 1.3.

4. The positive resist composition according to claim 1, wherein the weight average molecular weight of the resin (B1) is larger than the weight average molecular weight of the resin (B2).

5. The positive resist composition according to claim 1, wherein the resin (B2) has a weight average molecular weight of from 5,000 to 15,000.

6. The positive resist composition according to claim 1, wherein the compound (A) contains at least two kinds of compounds selected from the group consisting of a triarylsulfonium salt, an oxime sulfonate compound and a diazodisulfone compound.

7. The positive resist composition according to claim 1, herein the compound (A) contains a sulfonium salt having a bis(alkylsulfonyl)amide anion or a tris(alkylsulfonyl)methide anion.

8. A pattern forming method, comprising:
forming a resist film from the positive resist composition according to claim 1; and
exposing and developing the resist film.

9. The positive resist composition according to claim 1, wherein the resin (B1) contains the repeating unit represented by formula (IIa).

10. The positive resist composition according to claim 1, wherein in formula (IIb), $A_4$ represents a group capable of leaving under an action of an acid.

11. The positive resist composition according to claim 1, wherein the ratio of the amount of resin (B1)/the amount of resin (B2) by mass is from 95/5 to 60/40.

* * * * *